(12) United States Patent
Dunn, Jr.

(10) Patent No.: US 10,201,109 B2
(45) Date of Patent: Feb. 5, 2019

(54) SYSTEMS AND METHODS FOR SCALABLE PARALLEL DATA PROCESSING AND PROCESS CONTROL

(71) Applicant: Richard Anthony Dunn, Jr., Randolph, MA (US)

(72) Inventor: Richard Anthony Dunn, Jr., Randolph, MA (US)

( * ) Notice: Subject to any disclaimer, the term of this patent is extended or adjusted under 35 U.S.C. 154(b) by 0 days.

(21) Appl. No.: 14/956,889

(22) Filed: Dec. 2, 2015

(65) Prior Publication Data
US 2016/0366783 A1  Dec. 15, 2016

Related U.S. Application Data

(63) Continuation of application No. 12/806,206, filed on Dec. 9, 2010, now Pat. No. 9,220,180.
(Continued)

(51) Int. Cl.
| | |
|---|---|
| *G06F 17/50* | (2006.01) |
| *H05K 7/02* | (2006.01) |
| *H01L 27/02* | (2006.01) |
| *H05K 7/14* | (2006.01) |
| *H05K 7/20* | (2006.01) |

(Continued)

(52) U.S. Cl.
CPC ........... *H05K 7/1487* (2013.01); *G06F 1/183* (2013.01); *G06F 1/20* (2013.01); *G06F 17/5072* (2013.01); *G06F 17/5077* (2013.01); *H01L 27/0207* (2013.01); *H05K 7/023* (2013.01); *H05K 7/026* (2013.01); *H05K 7/1442* (2013.01);
(Continued)

(58) Field of Classification Search
CPC ............. G06F 17/5068; G06F 17/5072; G06F 17/5077; G06F 17/5081; H01L 23/528; H01L 23/5283; H01L 27/0207; H05K 7/023; H05K 7/026
USPC ........................................ 716/126, 129, 130
See application file for complete search history.

(56) References Cited

U.S. PATENT DOCUMENTS 3,495,134 A    2/1970 Collins et al.
3,704,455 A  * 11/1972 Scarbrough ............. G11C 11/40
                                                                174/262
(Continued)

FOREIGN PATENT DOCUMENTS

EP         0862127 B1    9/2002

*Primary Examiner* — Adrian S Wilson

(57) ABSTRACT

The present invention provides an apparatus and/or method for modular, scalable and nestable parallel data processing and process control systems from molecular to module/enclosure level, comprised of calculable inter- and intra-modular processing time standards and shorter look-ahead propagation paths; based on regular and irregular hexagonal and dodecagonal prisms, derivative dumbbells and variants as actual and/or approximated tilings/tessellations which may be arranged in columns, rows, stacks and arrays with or without rounding and/or a sliding fit. Non-sliding fit systems are fundamentally solid. Sliding fit systems modules have a central cavity with systems as follows: cage assembly, optional patch panels, anchoring, thermal management, interconnect enclosures, power, hot swap, fail over, positioning, and interconnects with optional quick disconnects and retractors. Optionally, module arrays store on dollied pallets in ramped warehouse rack shelving with optional catwalks, mezzanines, walls and roofs for build out and new construction.

19 Claims, 65 Drawing Sheets

Related U.S. Application Data

(60) Provisional application No. 61/283,957, filed on Dec. 10, 2009.

(51) Int. Cl.
  *G06F 1/18* (2006.01)
  *G06F 1/20* (2006.01)

(52) U.S. Cl.
  CPC ......... *H05K 7/1497* (2013.01); *H05K 7/1498* (2013.01); *H05K 7/20745* (2013.01)

(56) References Cited

U.S. PATENT DOCUMENTS

| | | |
|---|---|---|
| 3,964,577 A | 6/1976 | Bengtsson |
| 4,067,459 A | 1/1978 | Rozengauz et al. |
| 4,394,712 A * | 7/1983 | Anthony ............ H01L 23/5385 174/256 |
| 4,423,465 A | 12/1983 | Teng-Ching et al. |
| 4,499,607 A * | 2/1985 | Higgins ................. H01L 25/04 257/E25.003 |
| 4,501,460 A | 2/1985 | Sisler |
| 4,547,898 A * | 10/1985 | Tsikos .................. G06K 9/4638 382/124 |
| 4,739,476 A * | 4/1988 | Fiduccia ............ G06F 15/8023 712/22 |
| 4,864,511 A | 9/1989 | Moy et al. |
| 4,932,826 A | 6/1990 | Moy et al. |
| 4,937,659 A | 6/1990 | Chall, Jr. |
| 5,143,193 A | 9/1992 | Geraci |
| 5,150,279 A | 9/1992 | Collins et al. |
| 5,162,743 A | 11/1992 | Kruchowski et al. |
| 5,467,609 A | 11/1995 | Feeney |
| 5,472,347 A | 12/1995 | Nordenstrom et al. |
| 5,479,581 A | 12/1995 | Kteinschnitz |
| 5,499,164 A | 3/1996 | Hill-Lindsay et al. |
| 5,568,356 A * | 10/1996 | Schwartz ............ G06F 13/4095 200/1 R |
| 5,568,361 A | 10/1996 | Ward et al. |
| 5,578,840 A * | 11/1996 | Scepanovic ......... G06F 17/5072 257/206 |
| 5,506,004 A | 12/1996 | Green et al. |
| 5,583,749 A * | 12/1996 | Tredennick ............ H05K 7/023 361/733 |
| 5,586,004 A * | 12/1996 | Green ................. H05K 7/20536 165/80.3 |
| 5,602,721 A | 2/1997 | Slade et al. |
| 5,676,553 A | 10/1997 | Leung |
| 5,691,885 A * | 11/1997 | Ward ................... G06F 15/803 361/729 |
| 5,737,189 A | 4/1998 | Kammersgard et al. |
| 5,740,061 A | 4/1998 | Dewey |
| 5,799,312 A | 8/1998 | Rigoutsos |
| 5,870,732 A | 2/1999 | Fisher |
| 5,909,357 A * | 6/1999 | Orr .......................... G06F 1/16 361/679.46 |
| 5,941,714 A * | 8/1999 | Gorbet ................ G06F 15/8023 439/38 |
| 5,966,292 A | 10/1999 | Amberg et al. |
| 6,008,530 A * | 12/1999 | Kano .................. H01L 23/3107 257/685 |
| 6,130,800 A | 10/2000 | Ostwald |
| 6,147,877 A | 11/2000 | Strandberg et al. |
| 6,229,667 B1 | 5/2001 | Ostwald |
| 6,286,078 B1 | 9/2001 | Fuld |
| 6,469,901 B1 * | 10/2002 | Costner .................... G06F 1/18 361/730 |
| 6,496,366 B1 | 12/2002 | Coglitore et al. |
| 6,683,793 B1 | 1/2004 | Campbell |
| 6,951,006 B1 * | 9/2005 | Teig ..................... G06F 17/5077 716/129 |
| 7,020,863 B1 * | 3/2006 | Teig ..................... G06F 17/5077 716/129 |
| 7,096,449 B1 * | 8/2006 | Teig ..................... G06F 17/5077 716/129 |
| 7,117,468 B1 | 10/2006 | Teig et al. |
| 7,222,322 B1 * | 5/2007 | Chyan ................. G06F 17/5077 716/122 |
| 7,246,338 B1 * | 7/2007 | Teig ..................... G06F 17/5077 716/130 |
| 7,369,406 B2 | 5/2008 | Matsushima |
| 7,646,590 B1 | 1/2010 | Corhodzic |
| 7,694,261 B1 * | 4/2010 | Chyan ................. G06F 17/5077 716/126 |
| 7,699,693 B2 * | 4/2010 | Schwartz .................. A63F 1/02 273/157 R |
| 7,734,137 B2 * | 6/2010 | Bennett ............... C03B 37/0122 385/125 |
| 8,140,182 B2 | 3/2012 | Noble et al. |
| 8,149,588 B2 | 4/2012 | Sip |
| 8,214,786 B2 | 7/2012 | Kuekes et al. |
| 8,542,492 B2 * | 9/2013 | Dunn, Jr. ............. H05K 5/0013 118/500 |
| 9,220,180 B2 * | 12/2015 | Dunn, Jr. ............. H05K 7/1497 |
| 2002/0097563 A1 * | 7/2002 | Costner .................... G06F 1/18 361/735 |
| 2002/0109972 A1 | 8/2002 | Mallette |
| 2002/0182844 A1 * | 12/2002 | Igarashi ............... H01L 23/5222 438/617 |
| 2003/0025205 A1 * | 2/2003 | Shively ............... G06F 17/5077 257/758 |
| 2004/0044979 A1 * | 3/2004 | Aji ...................... G06F 17/5077 716/113 |
| 2004/0231875 A1 | 11/2004 | Rasmussen et al. |
| 2005/0101112 A1 * | 5/2005 | Ruckes ................ B82Y 10/00 438/584 |
| 2005/0194168 A1 * | 9/2005 | Tonomura ......... H01L 23/49838 174/390 |
| 2006/0121715 A1 * | 6/2006 | Chang ...................... H01L 27/11 438/599 |
| 2007/0210391 A1 * | 9/2007 | Becker ................ H01L 27/0207 257/390 |
| 2008/0212290 A1 | 9/2008 | Basham et al. |
| 2009/0086441 A1 | 4/2009 | Randall et al. |
| 2009/0153992 A1 * | 6/2009 | Garcia ................. G11B 33/128 360/31 |
| 2009/0224639 A1 | 9/2009 | Sosin |
| 2009/0237877 A1 * | 9/2009 | Honda ................... G11B 27/00 361/679.39 |
| 2009/0265043 A1 | 10/2009 | Merrow |
| 2010/0268370 A1 | 10/2010 | Nishiuchi et al. |
| 2011/0269629 A1 * | 11/2011 | Giustino ................ B82Y 30/00 505/100 |
| 2012/0023370 A1 | 1/2012 | Truebenbach |

* cited by examiner

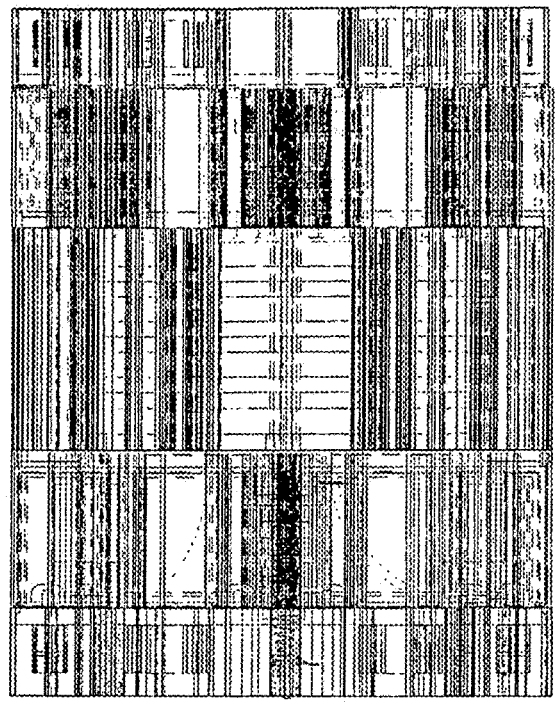
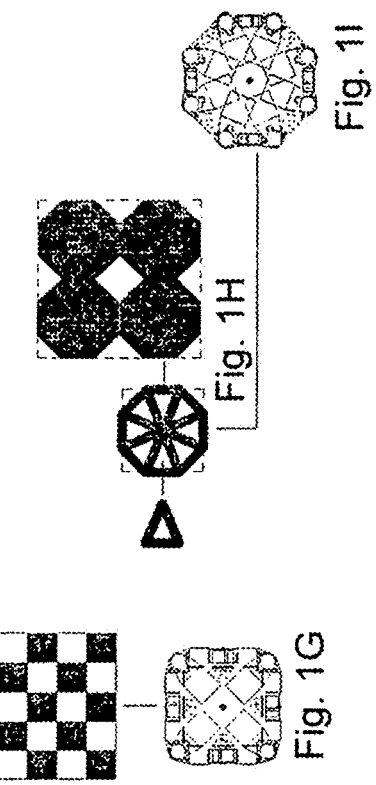
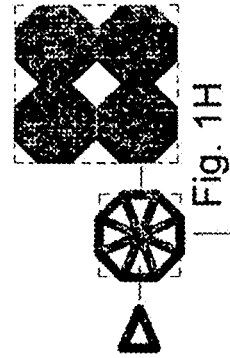
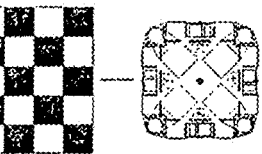
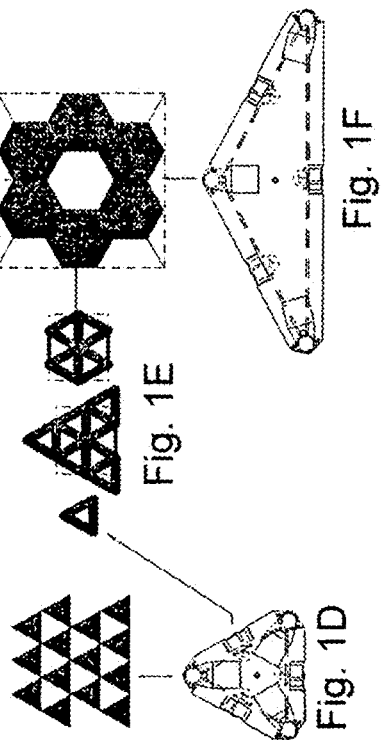
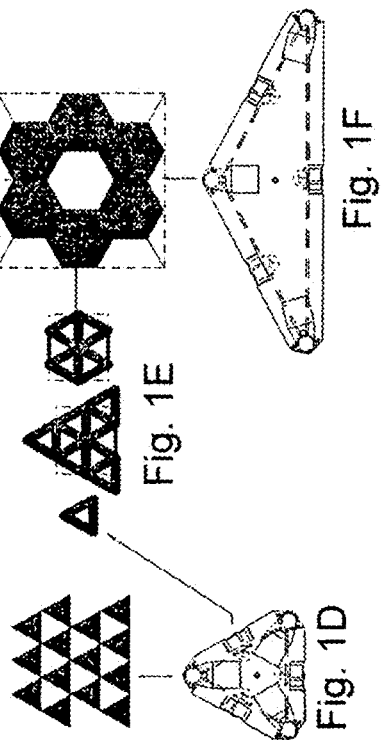
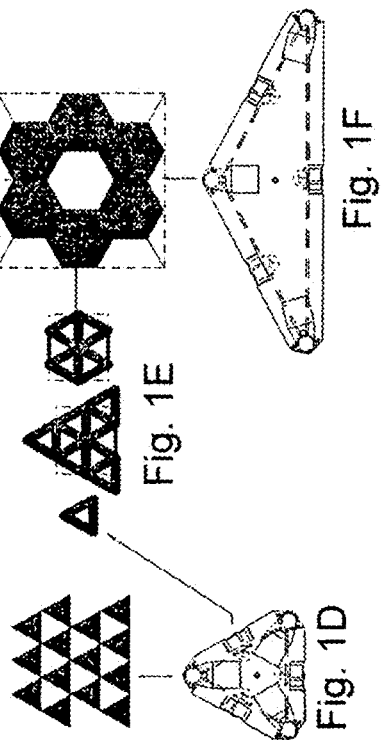

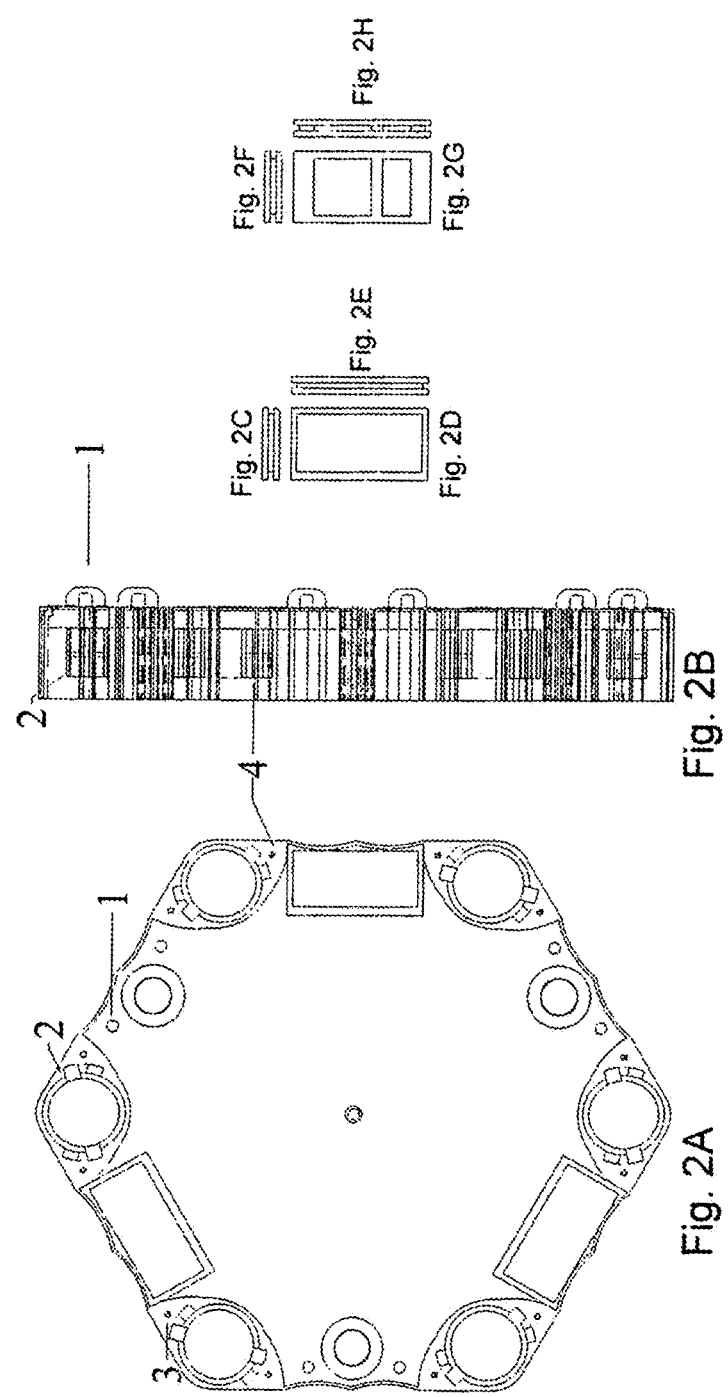

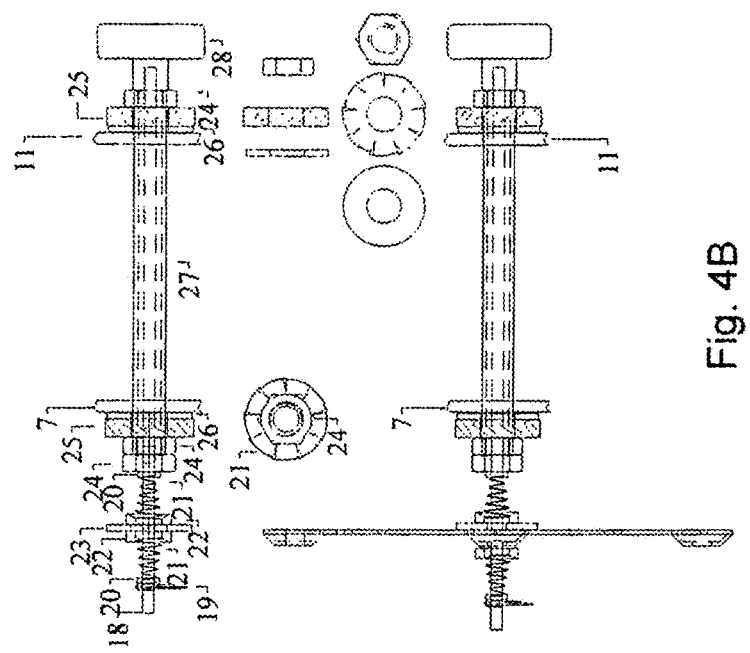
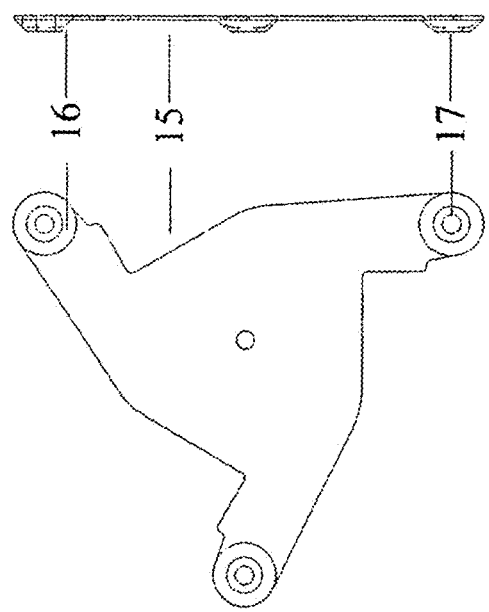
Fig. 4B
Fig. 4A

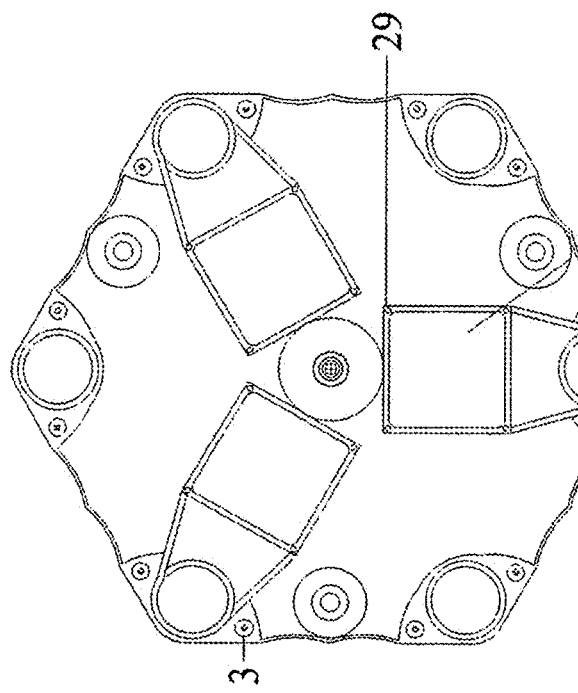
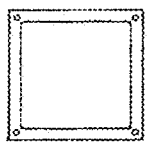
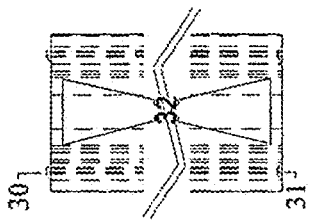
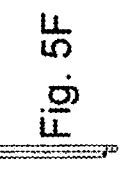

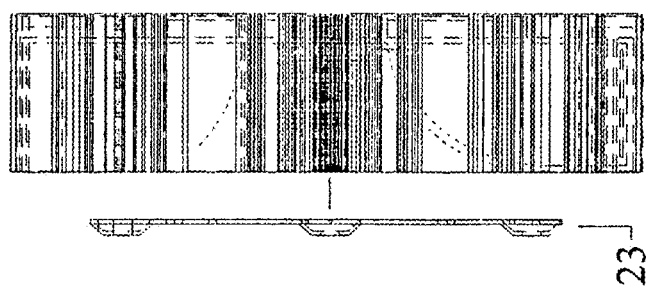
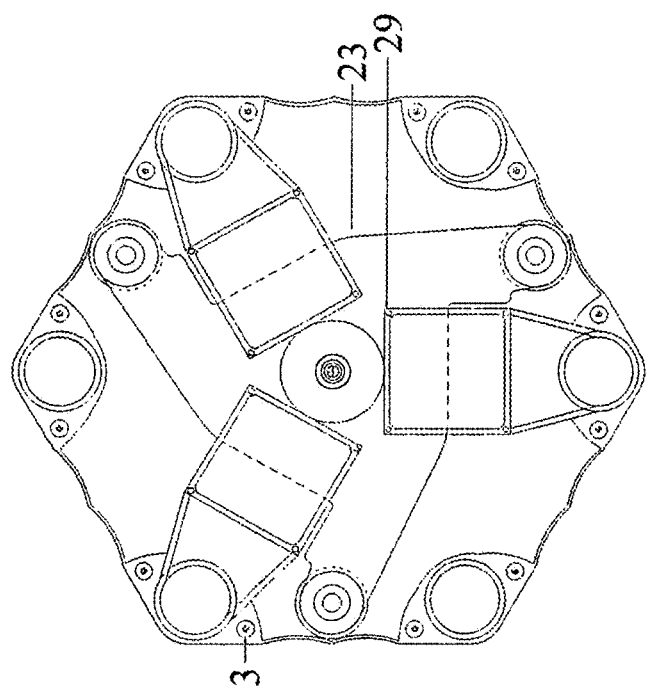
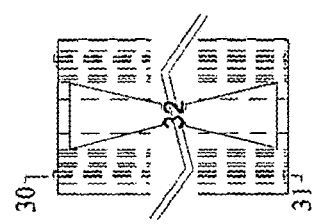
Fig. 6A
Fig. 6B
Fig. 6C

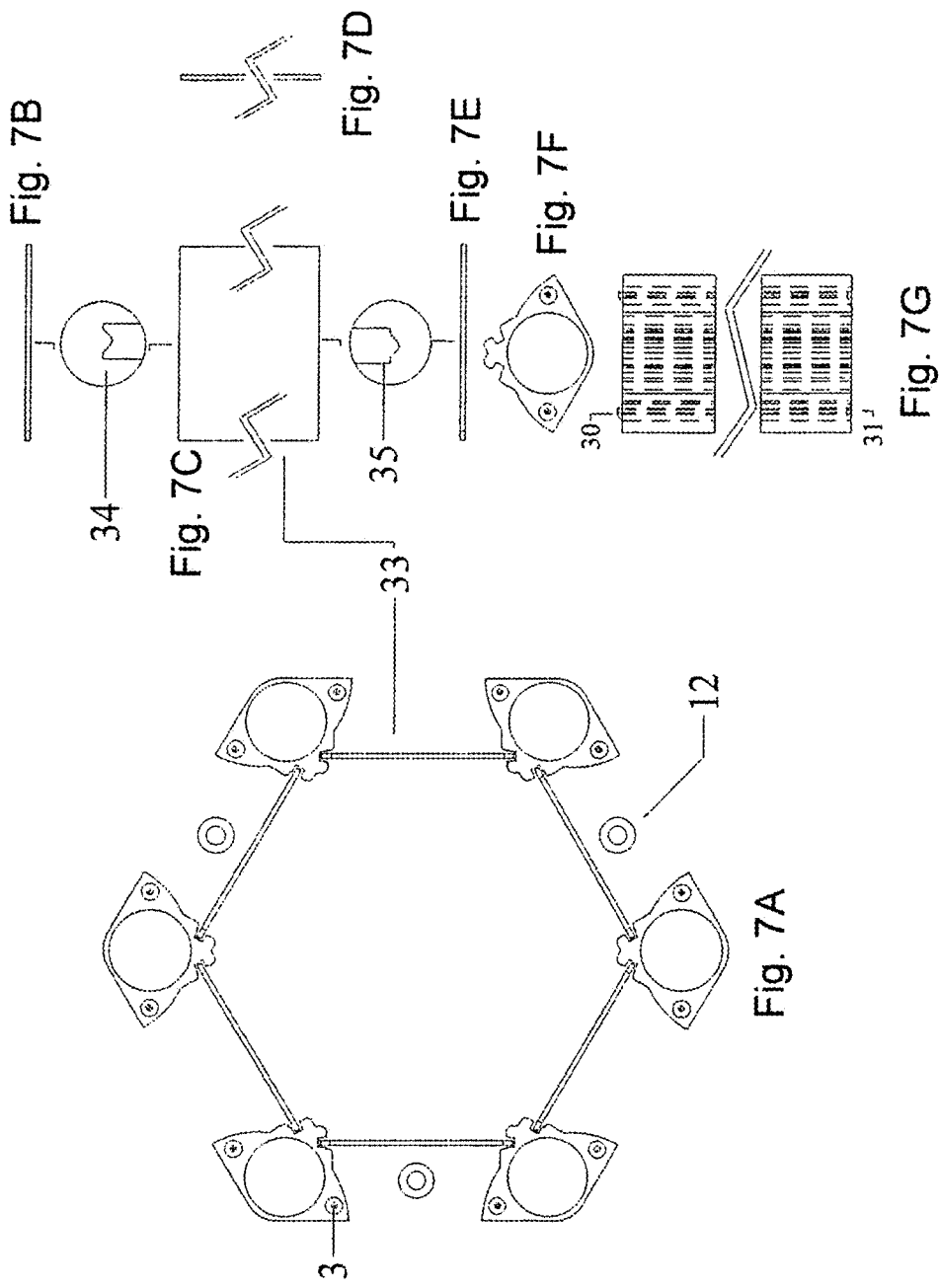

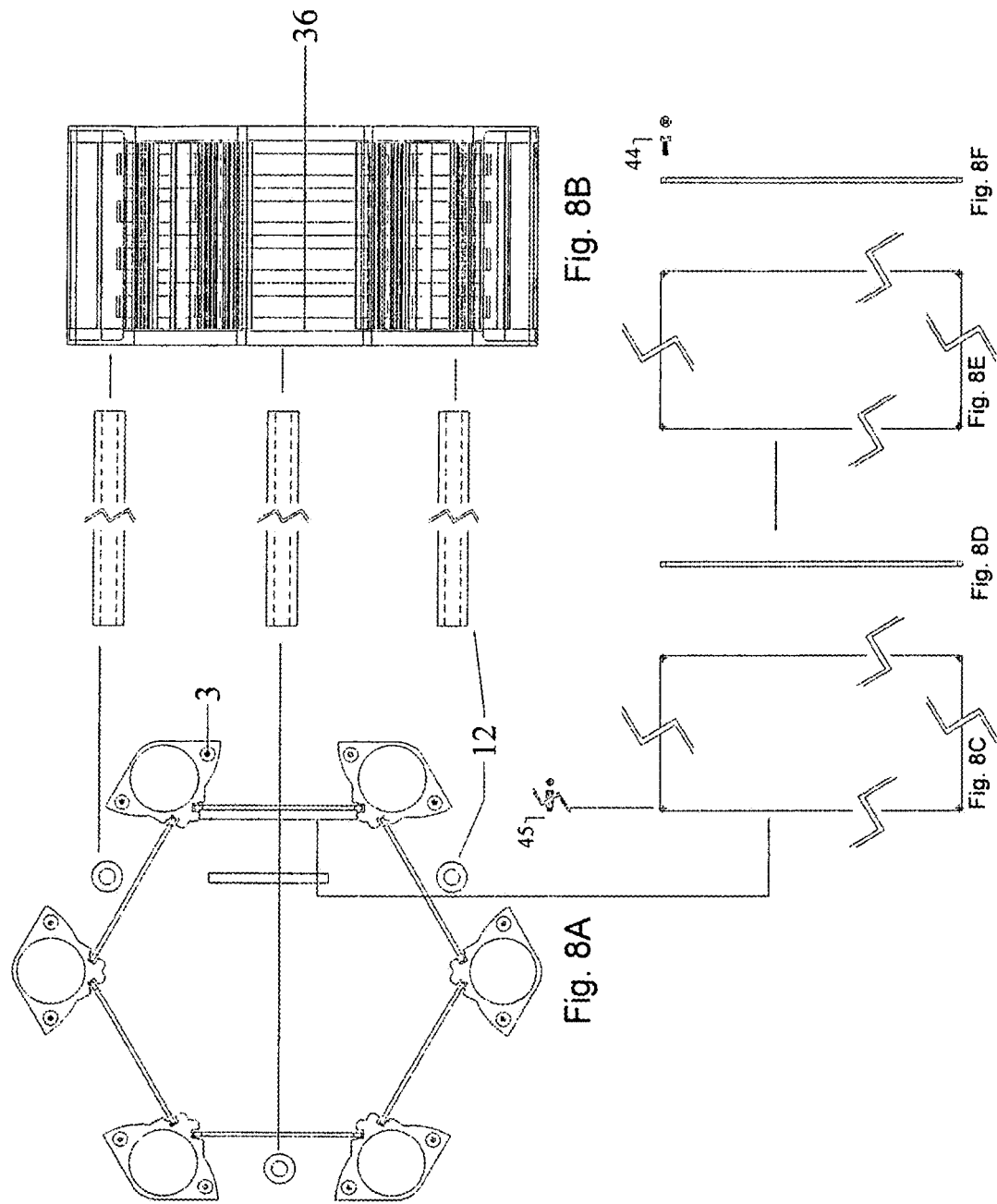

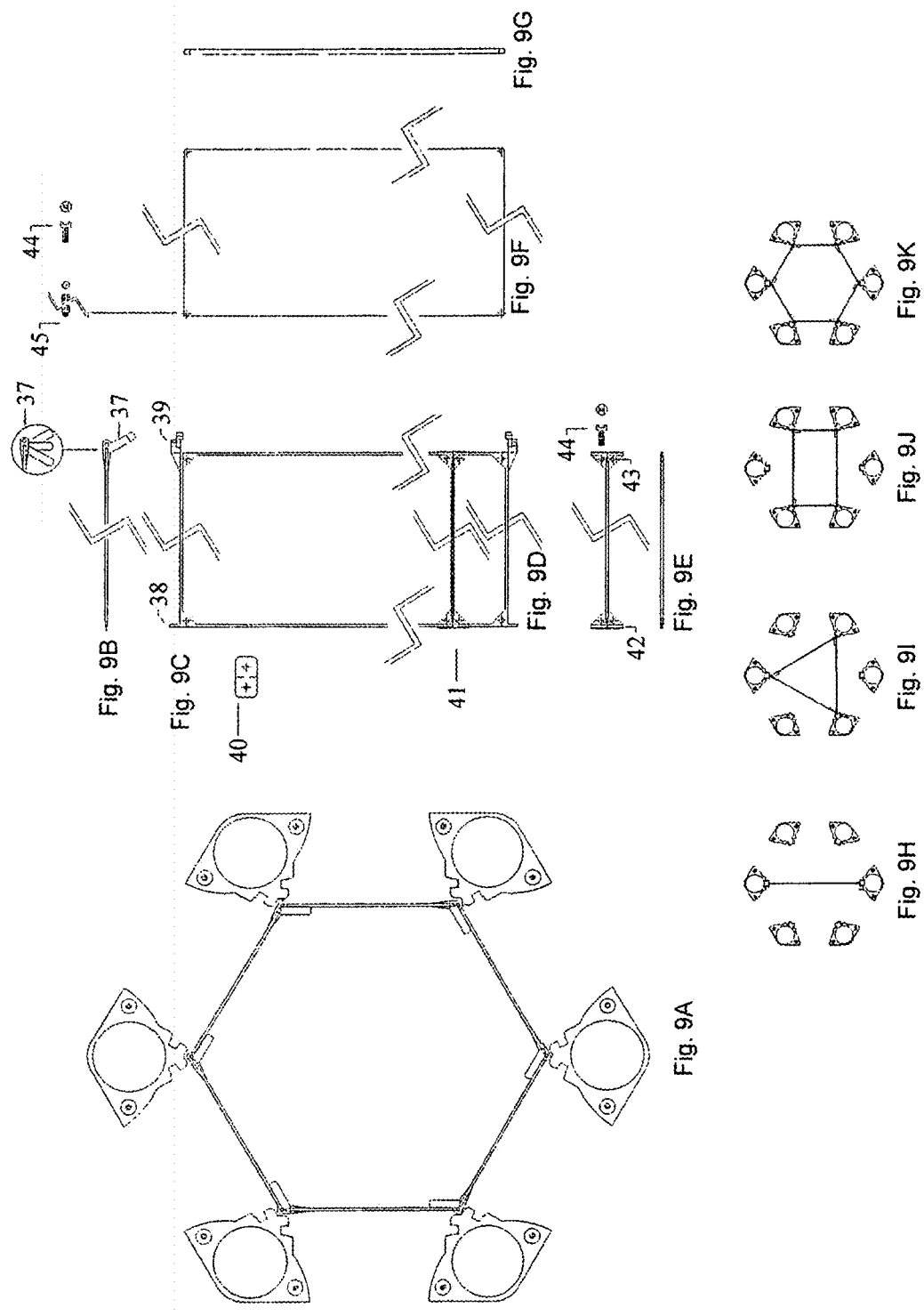

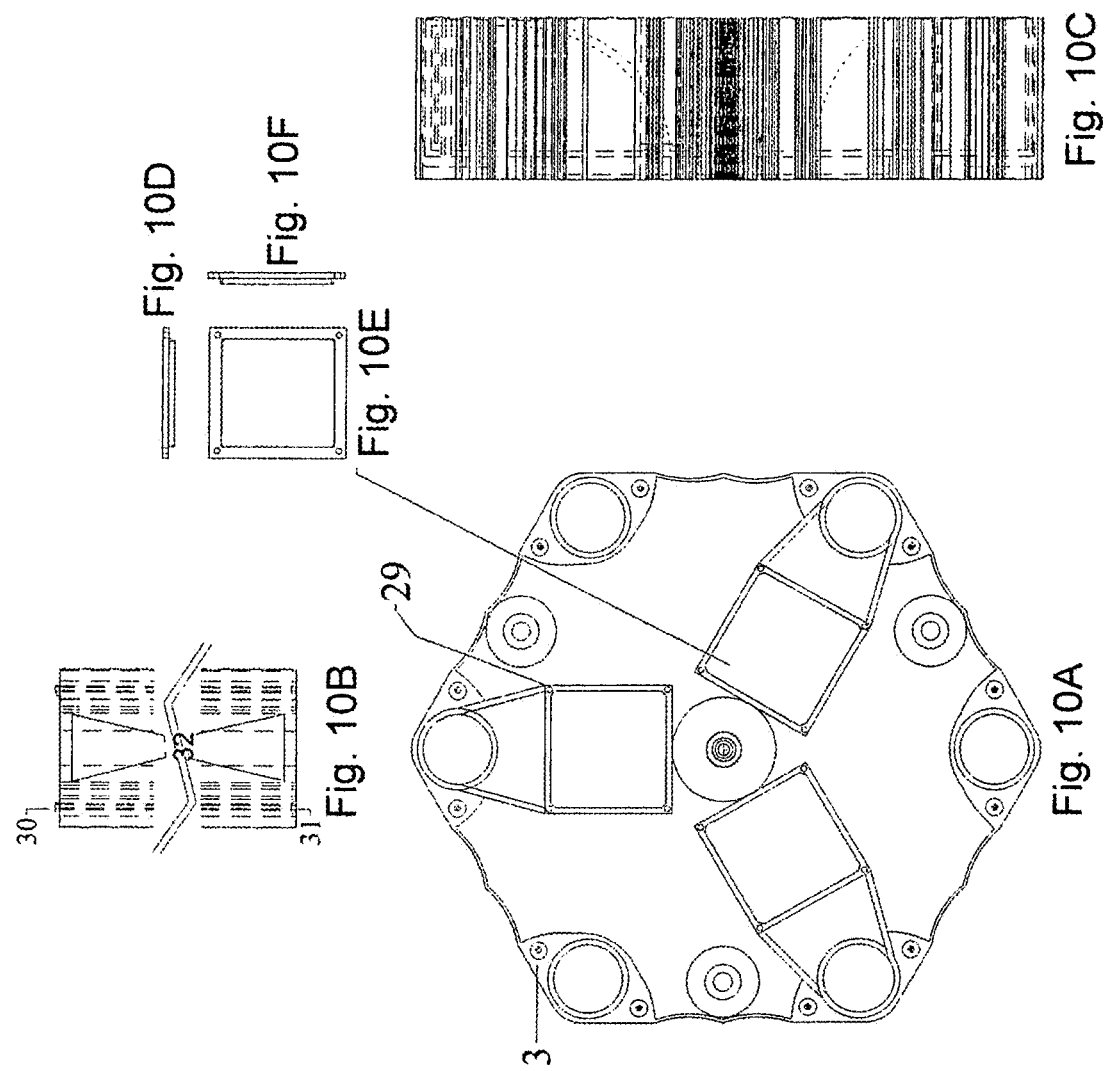

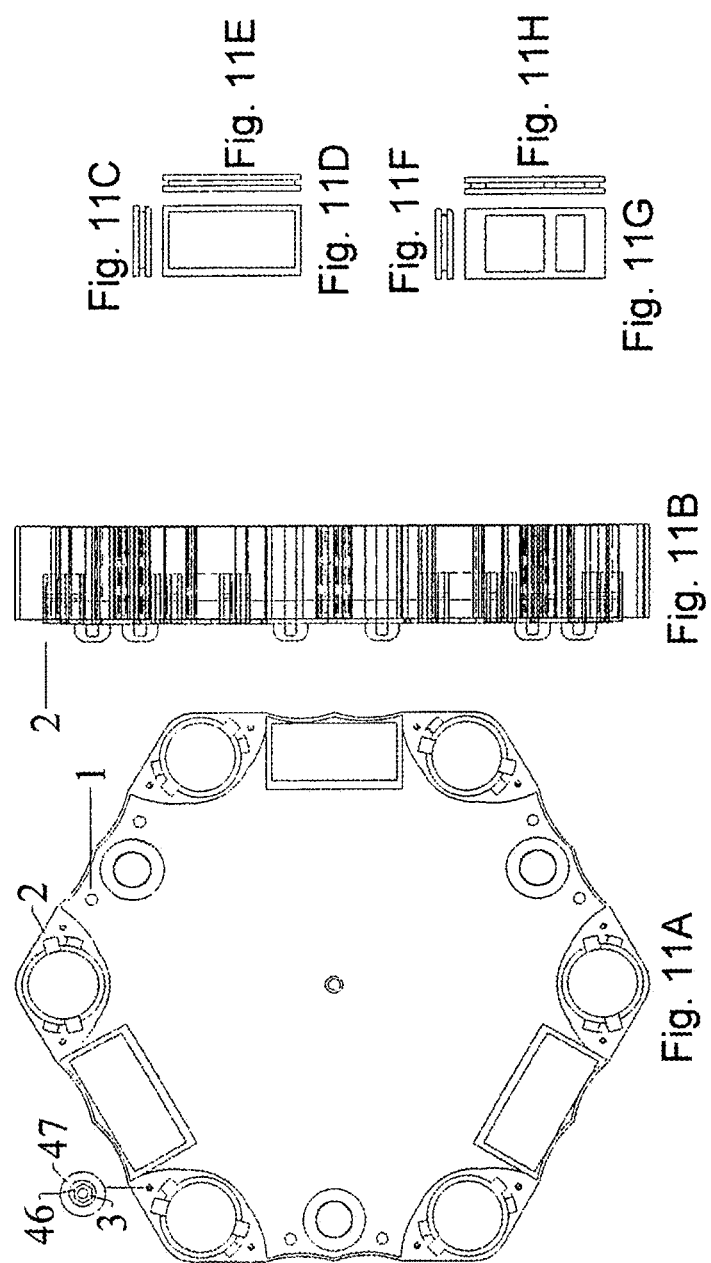

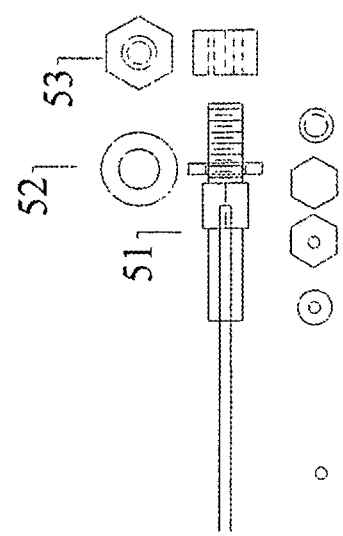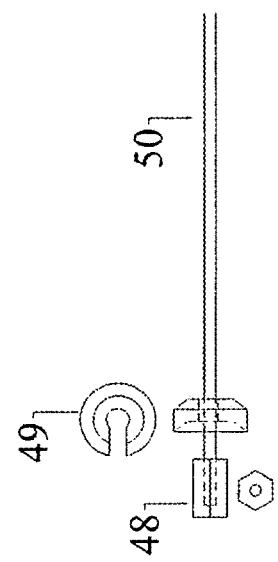
Fig. 12A

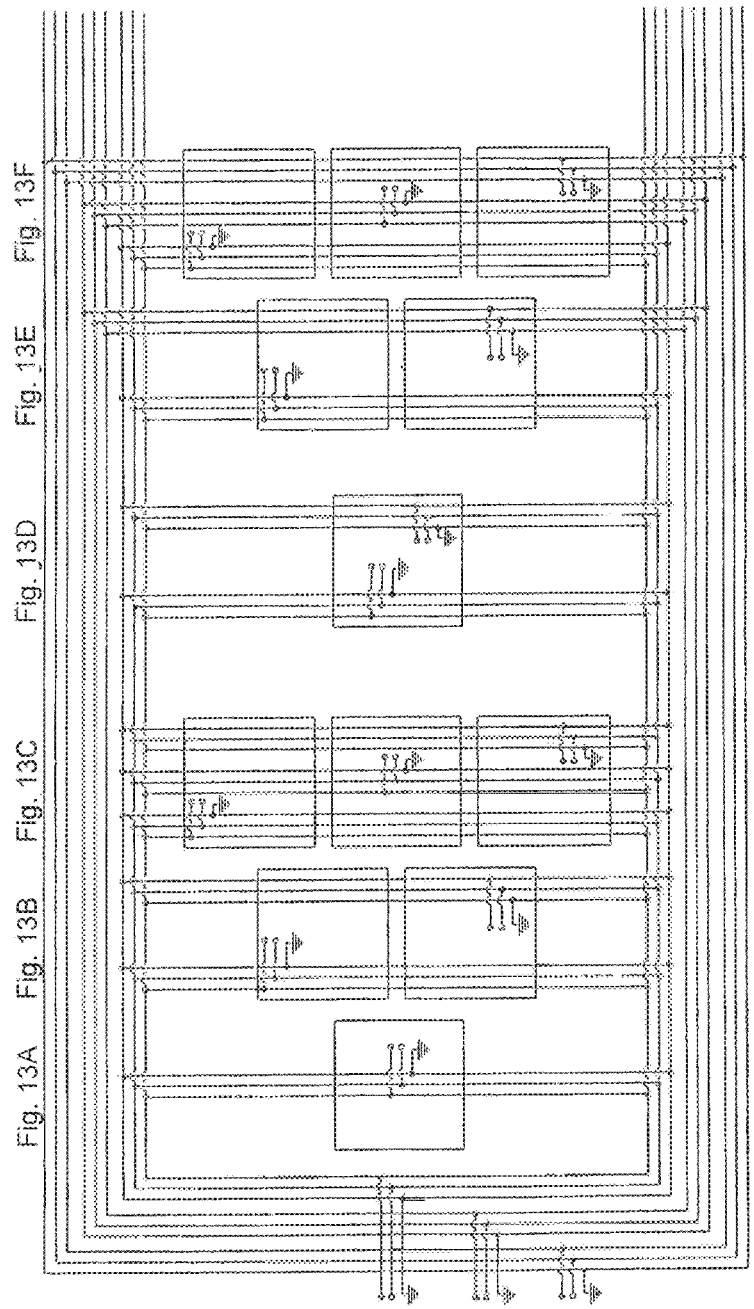

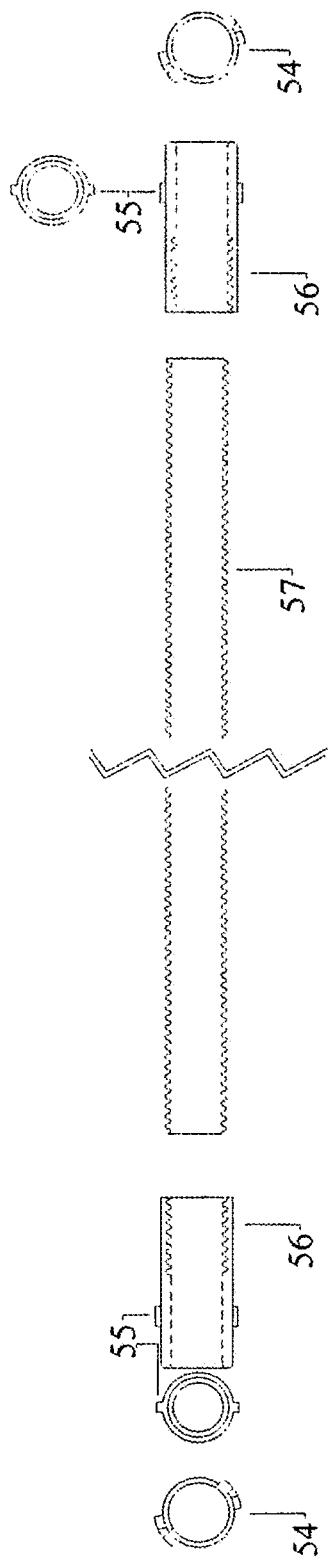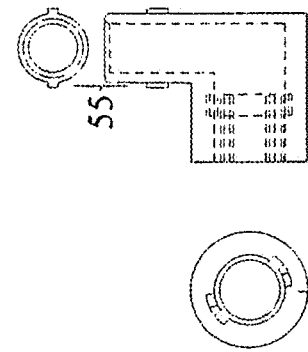

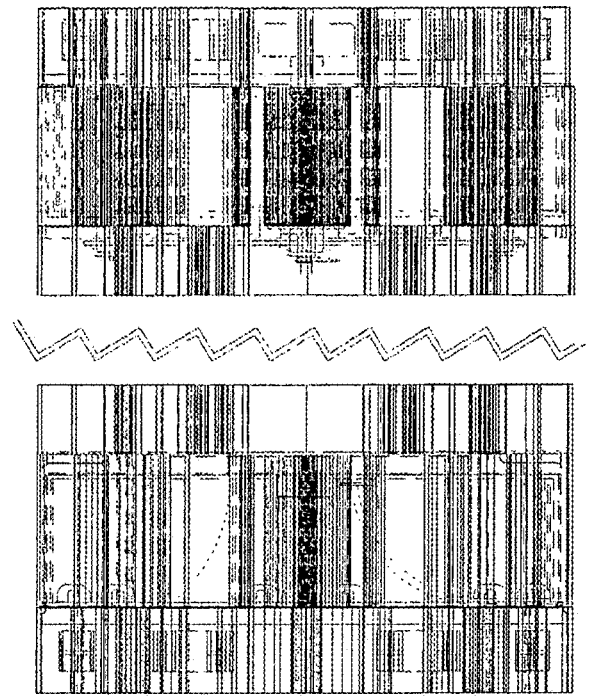
Fig. 15C
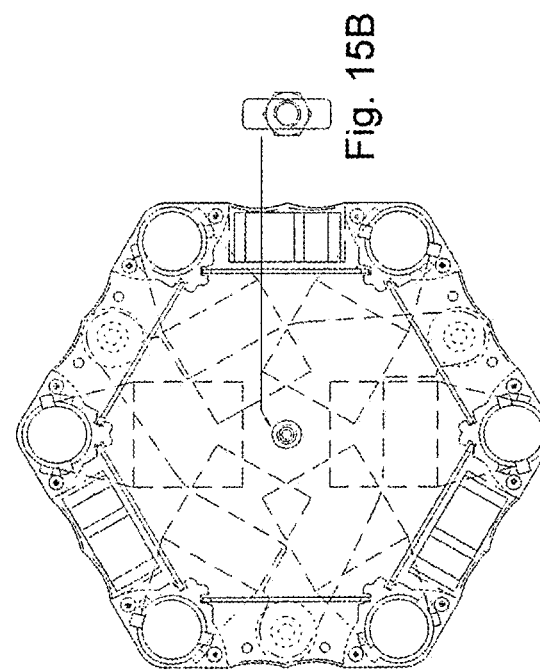
Fig. 15B
Fig. 15A

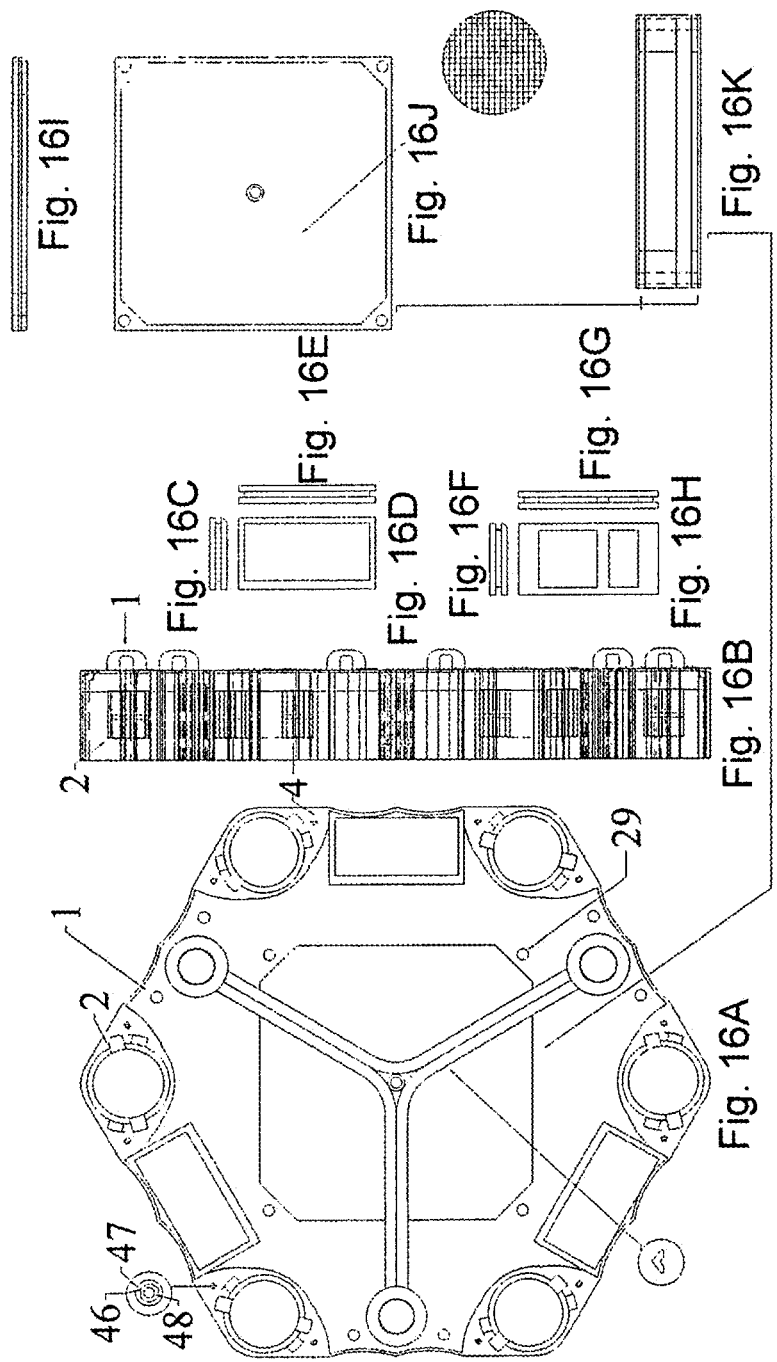

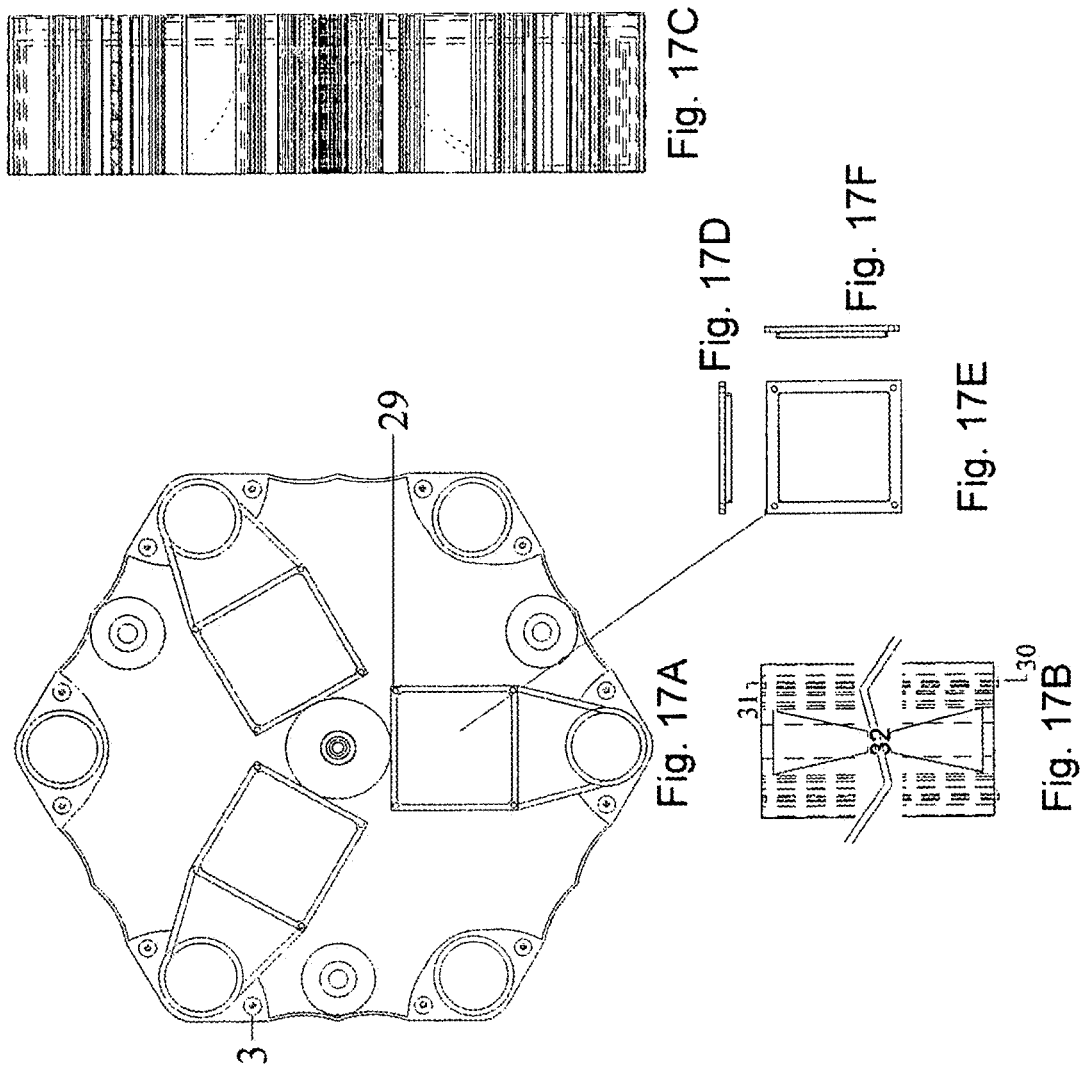

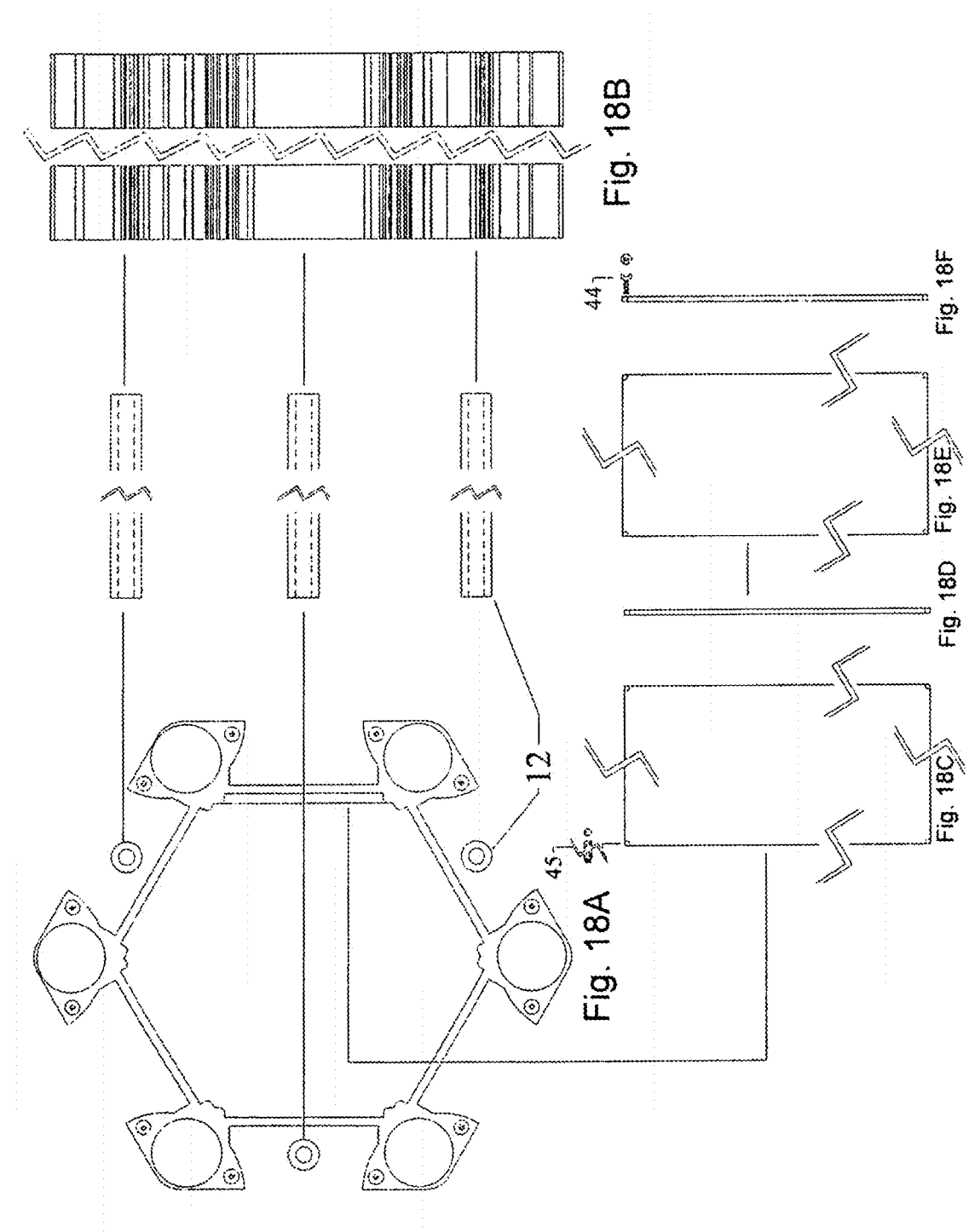

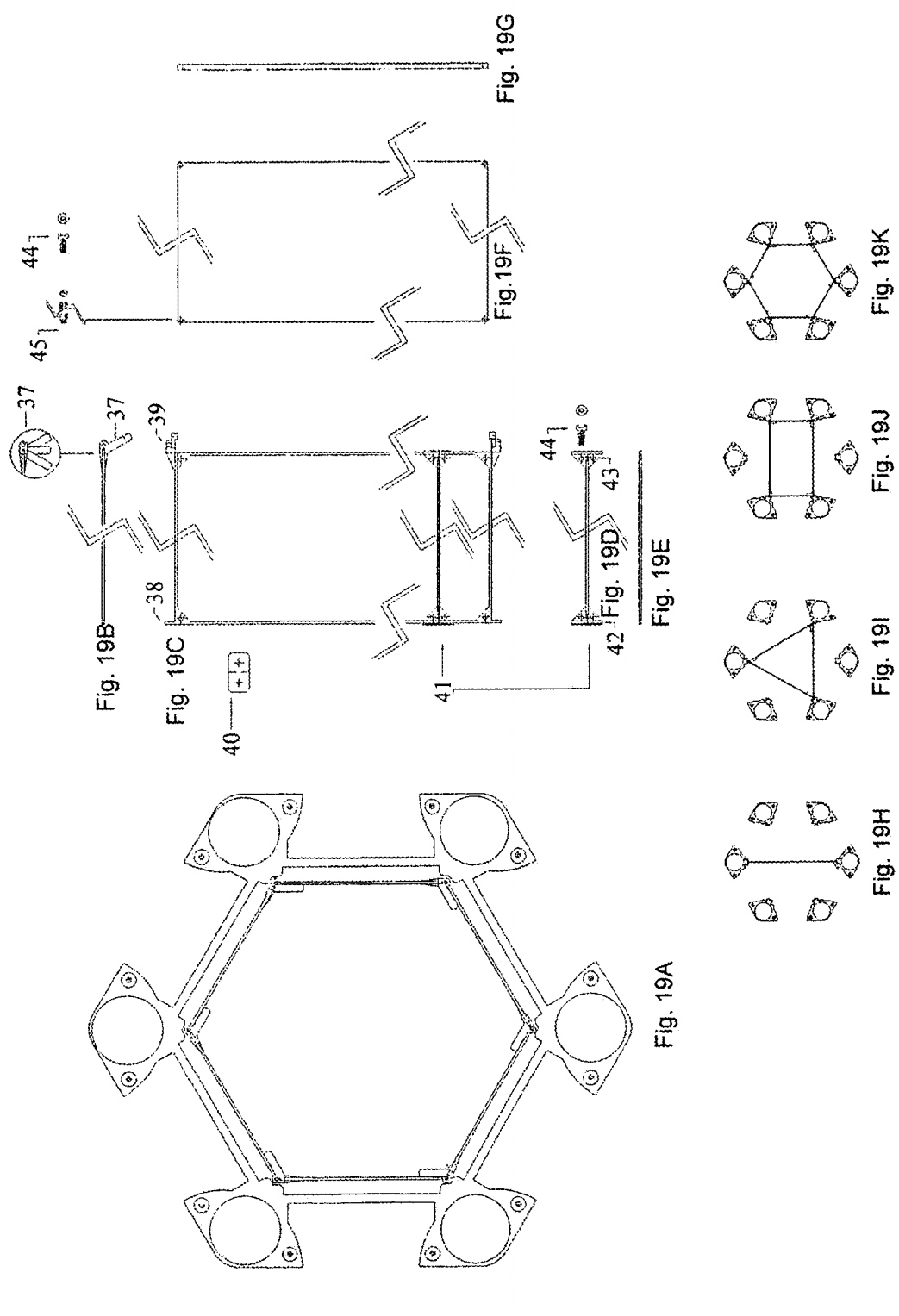

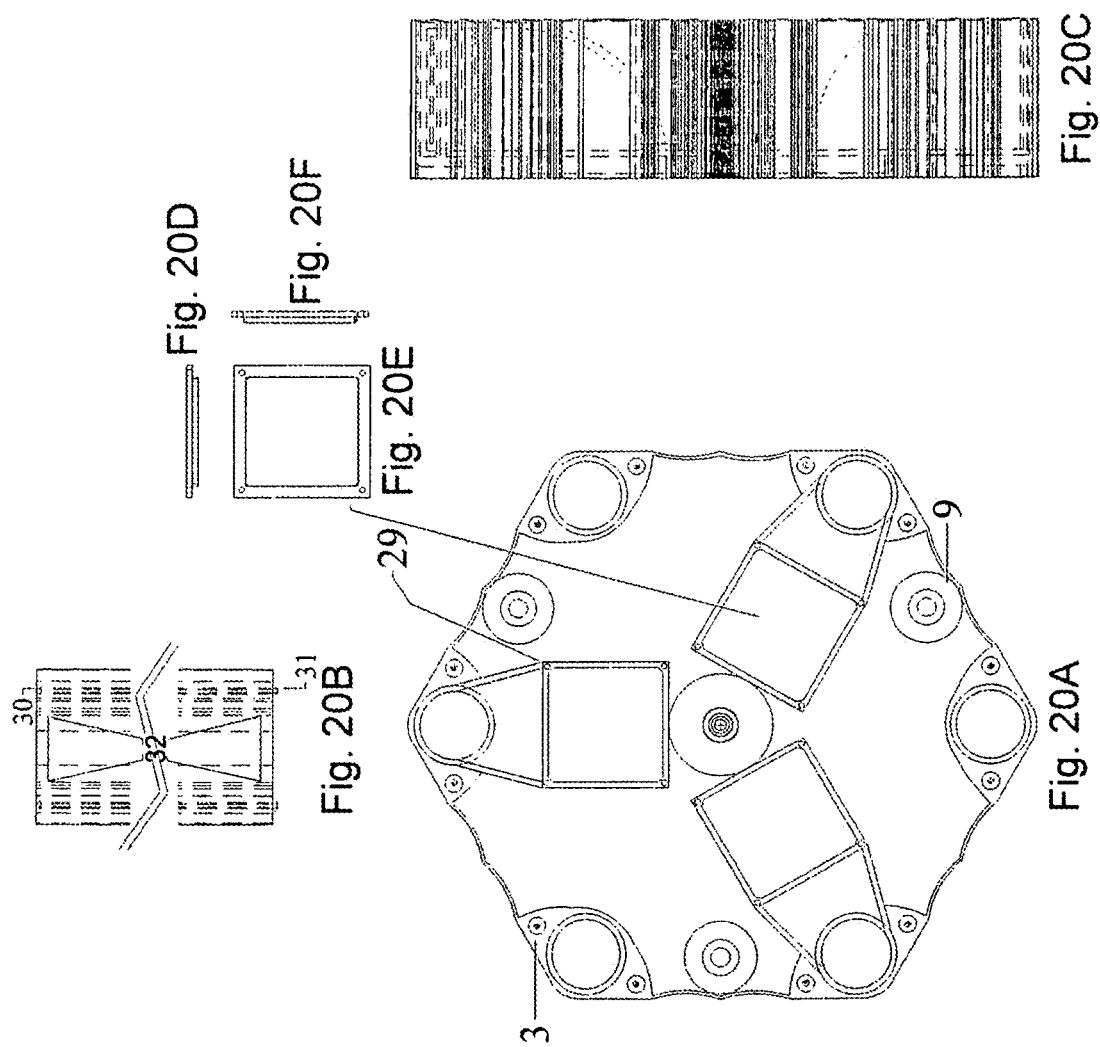

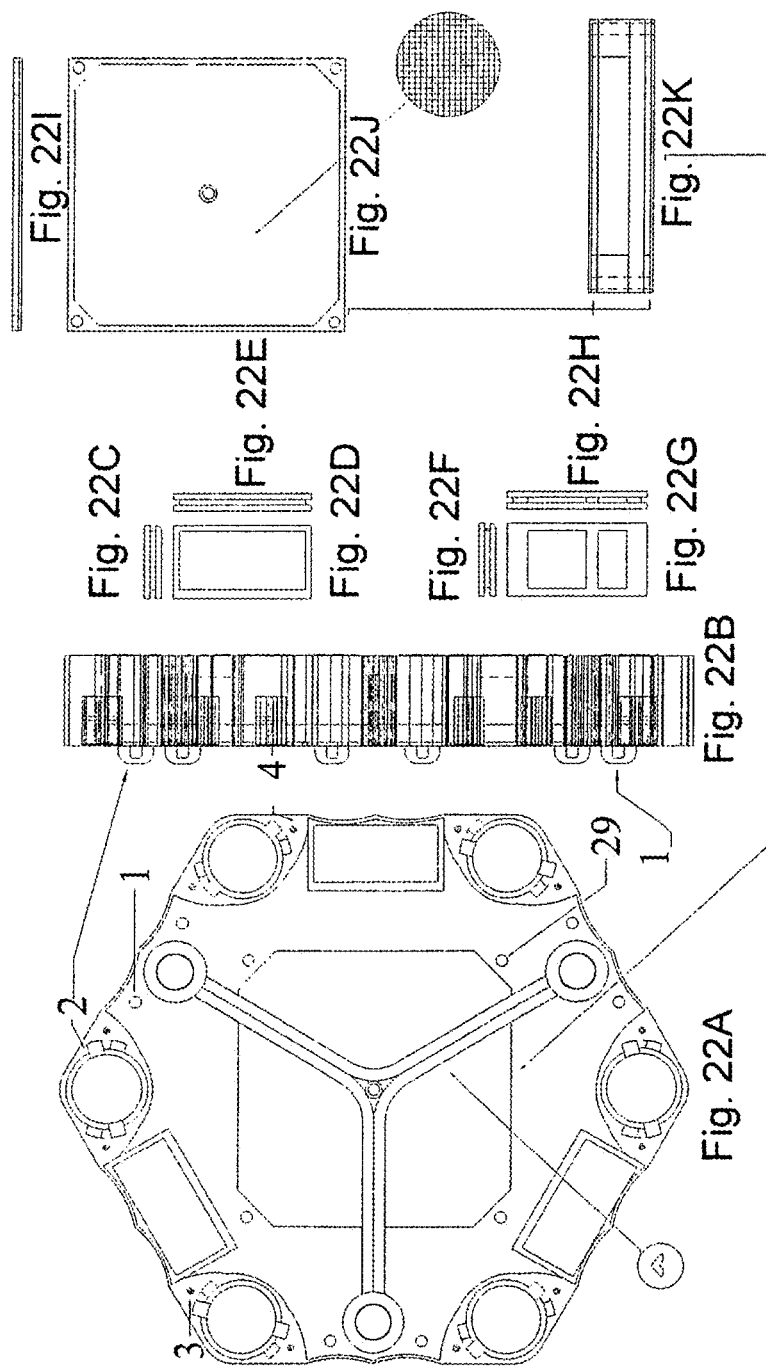

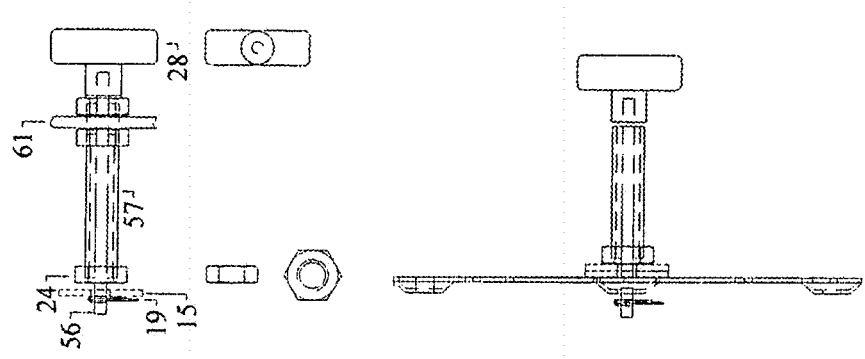
Fig. 23C
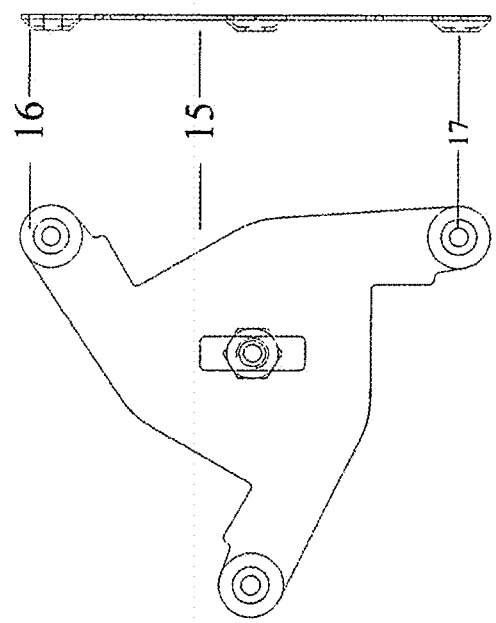
Fig. 23B
Fig. 23A

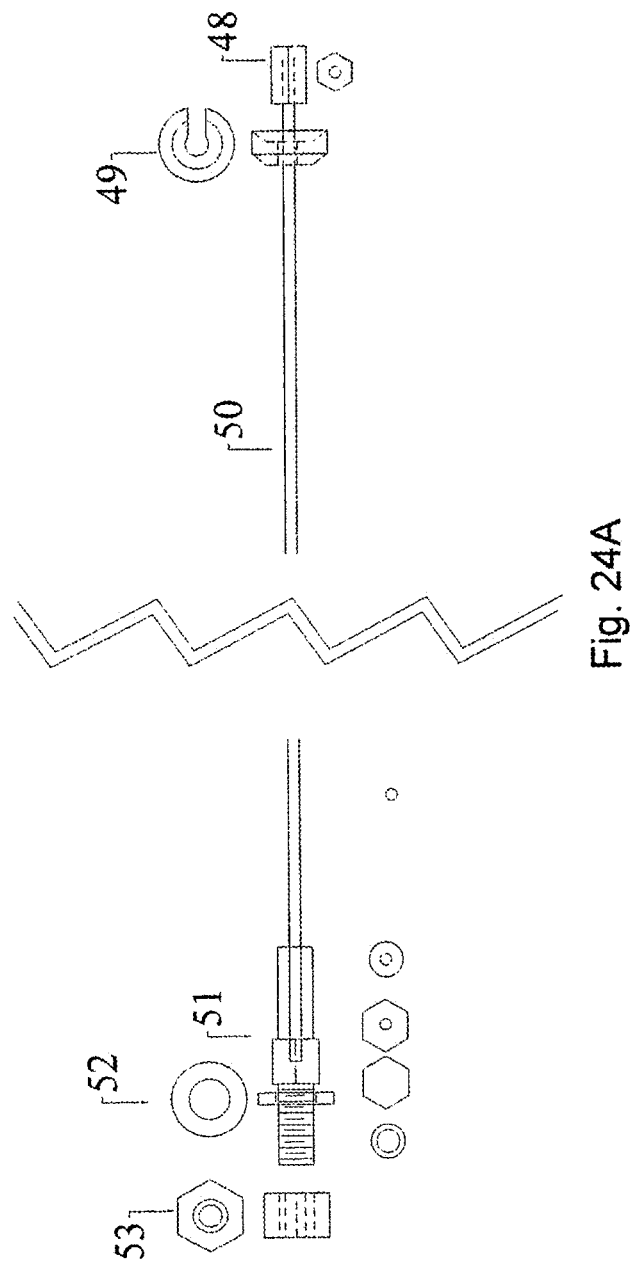

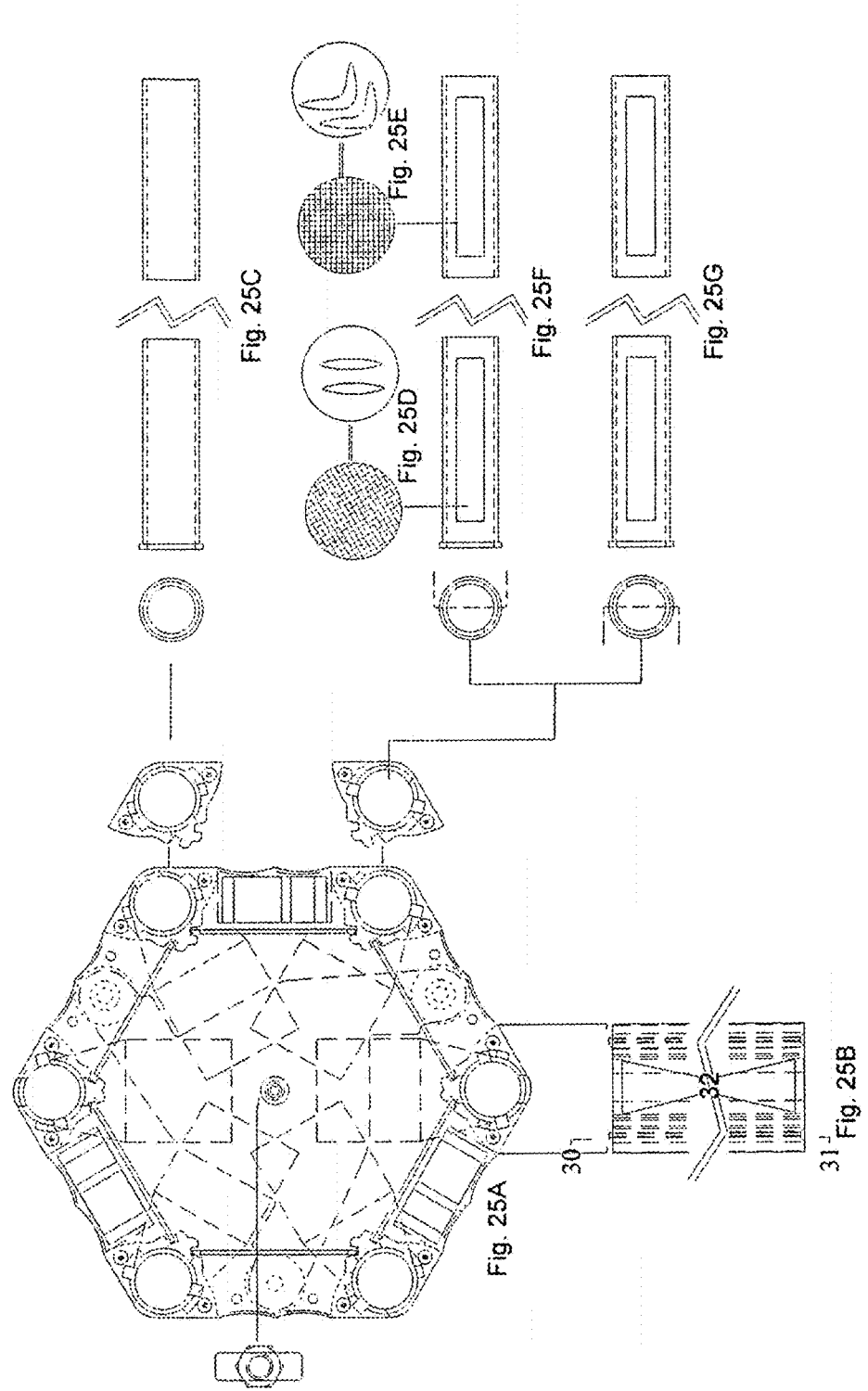

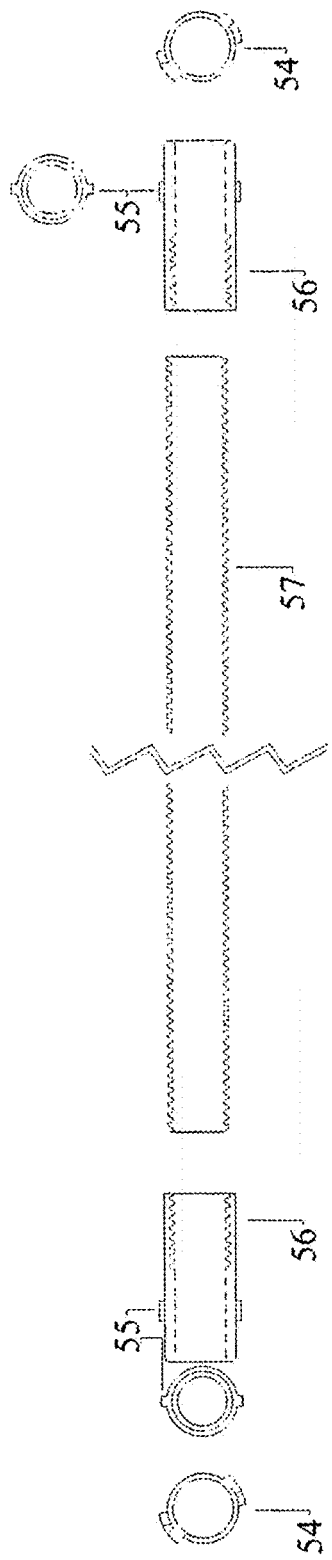

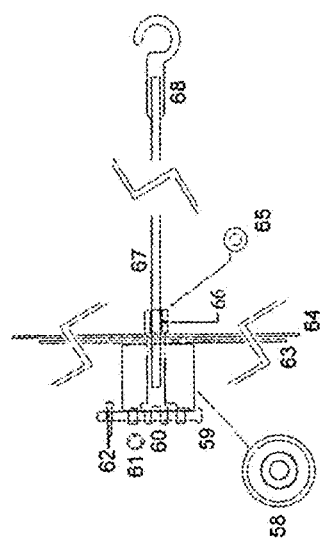

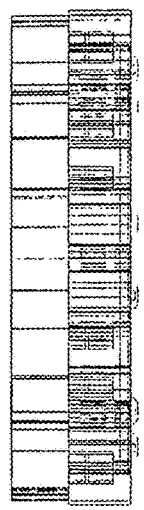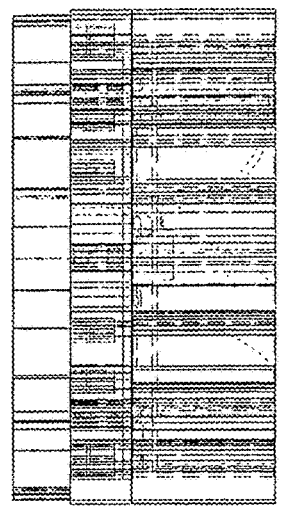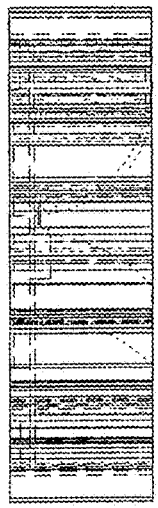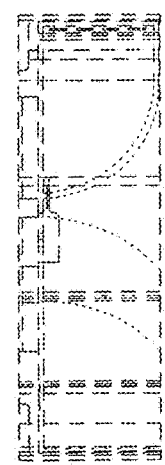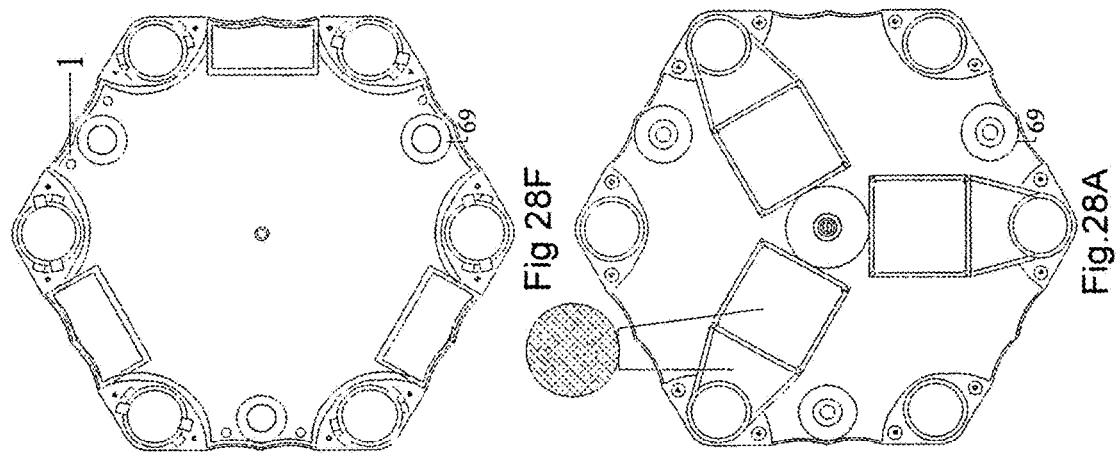

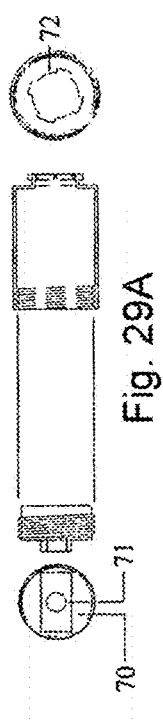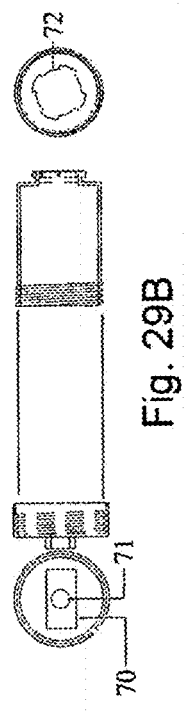

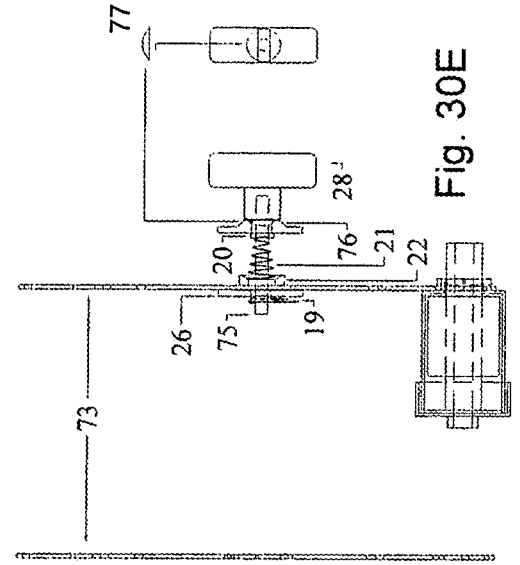
Fig. 30E
Fig. 30B
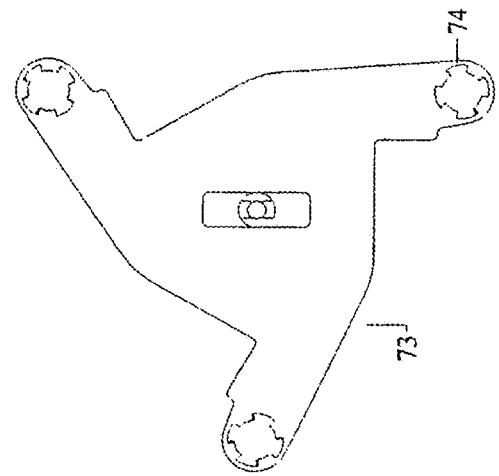
Fig. 30A
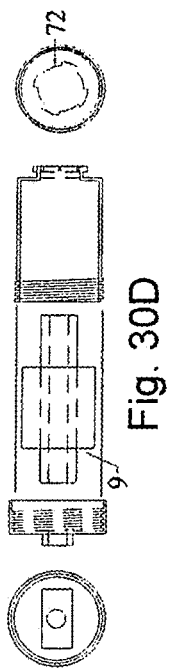
Fig. 30D
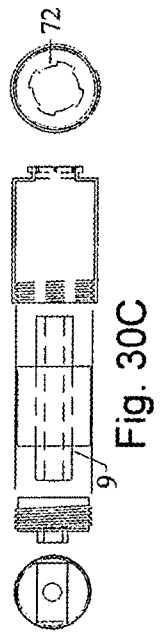
Fig. 30C

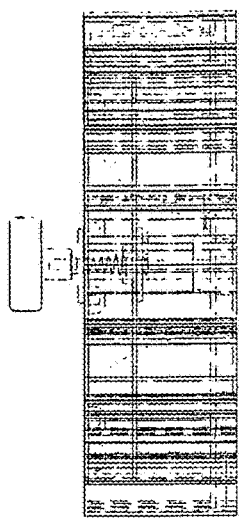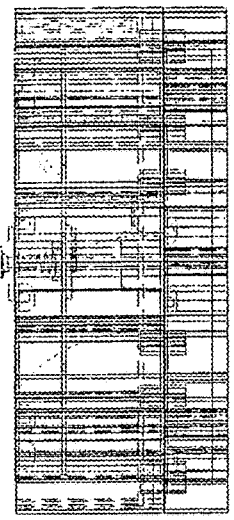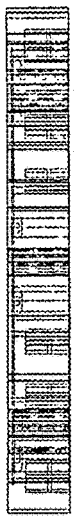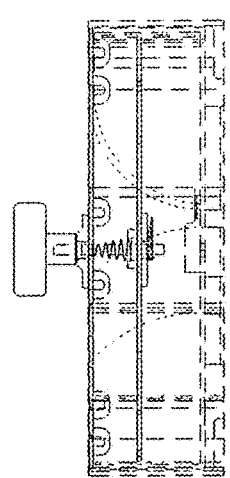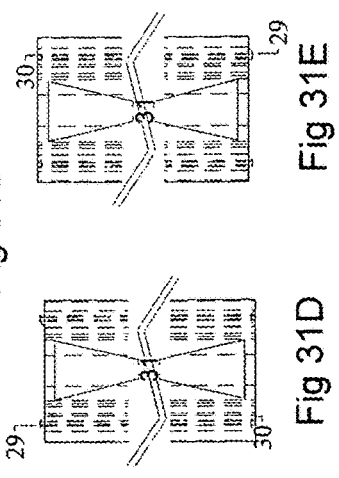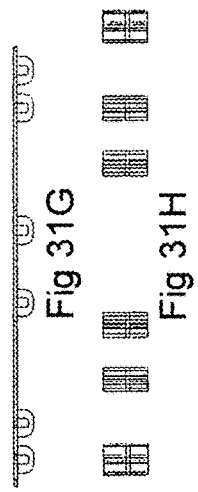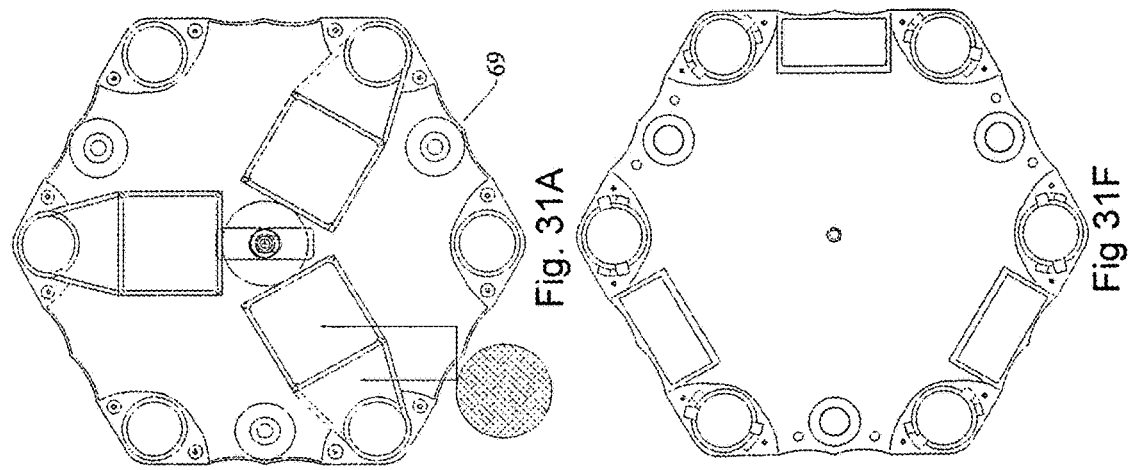

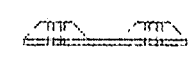
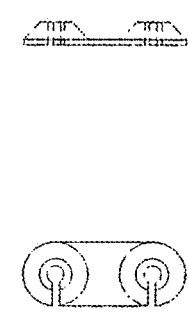
Fig. 33G  Fig. 33H
79
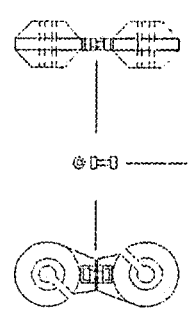 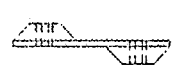 
Fig. 33A  Fig. 33B  Fig. 33C  Fig. 33D  Fig. 33E  Fig. 33F

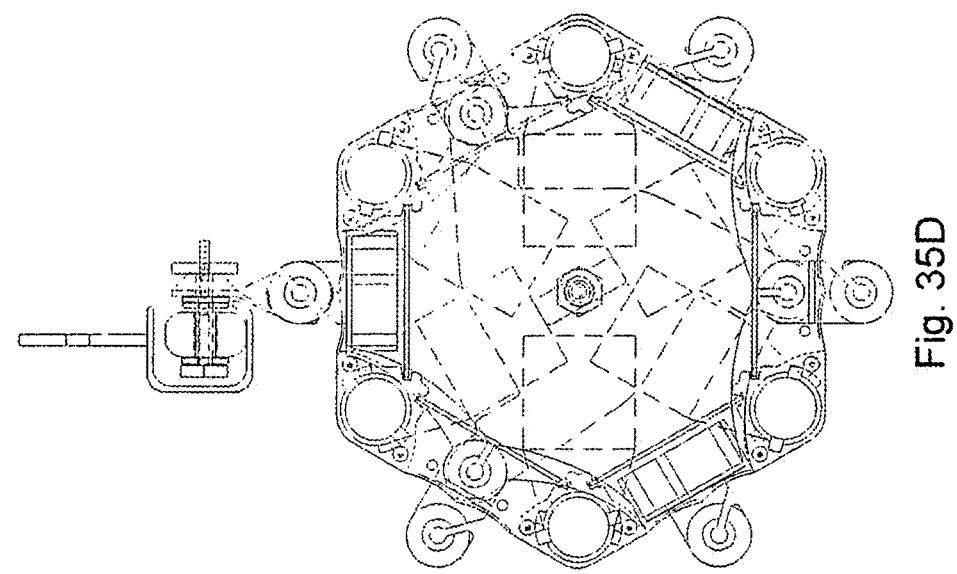
Fig. 35D
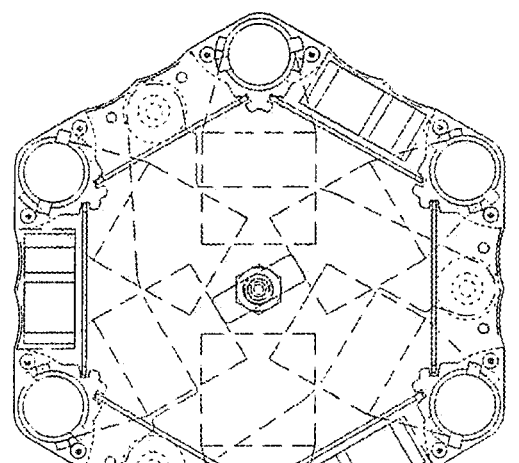
Fig. 35C
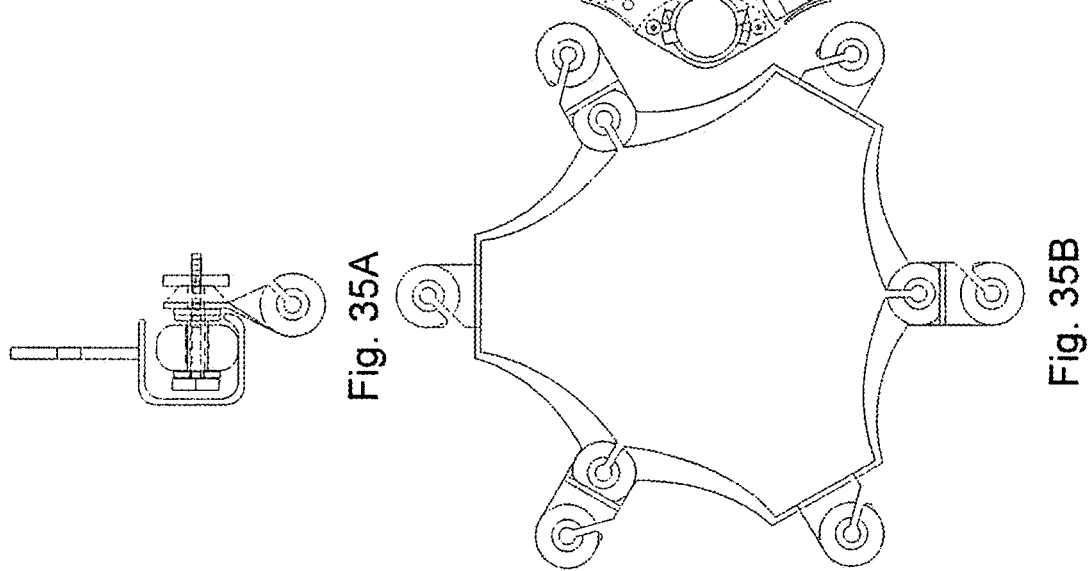
Fig. 35A
Fig. 35B

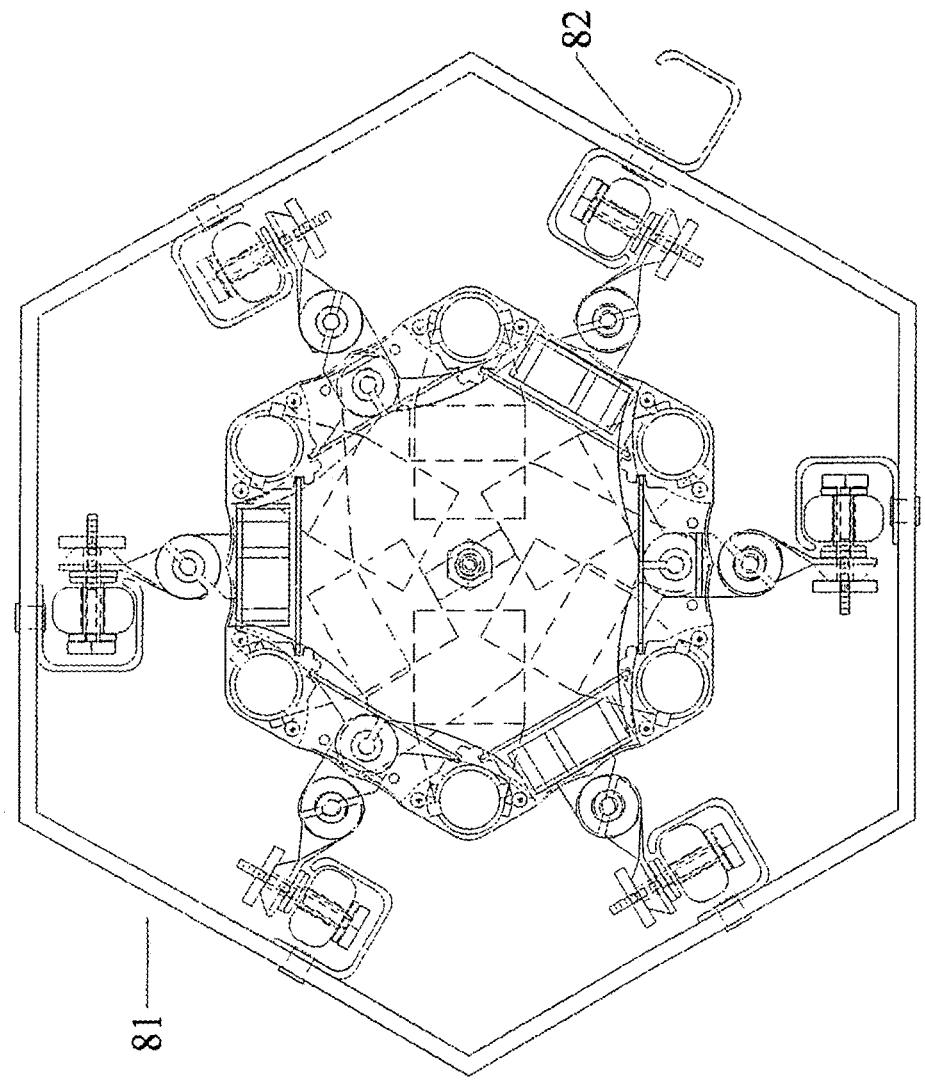
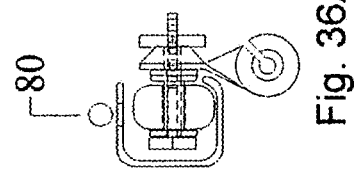
Fig. 36B
Fig. 36A

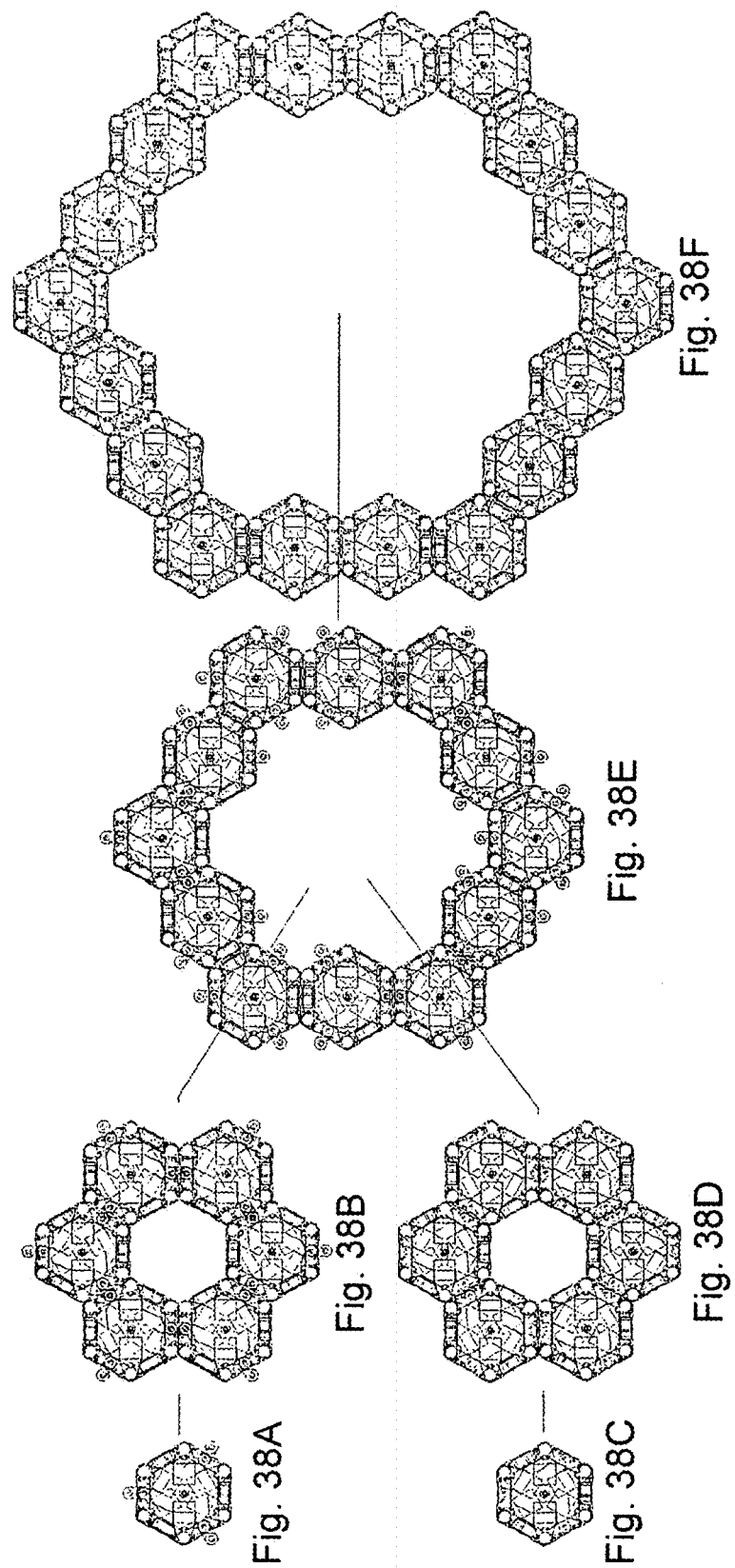

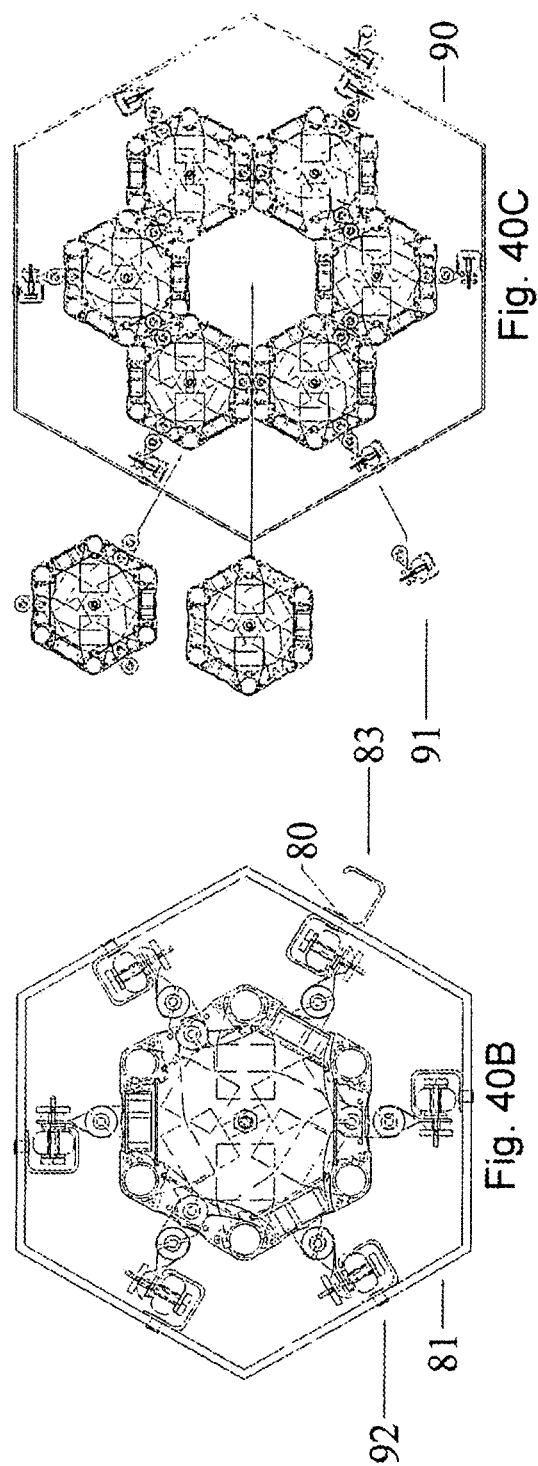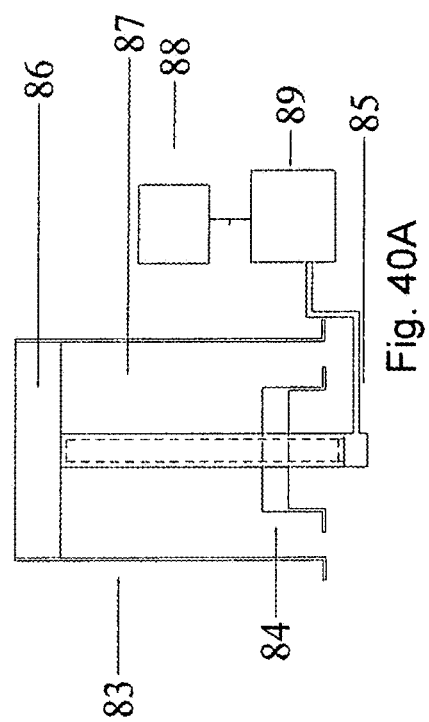

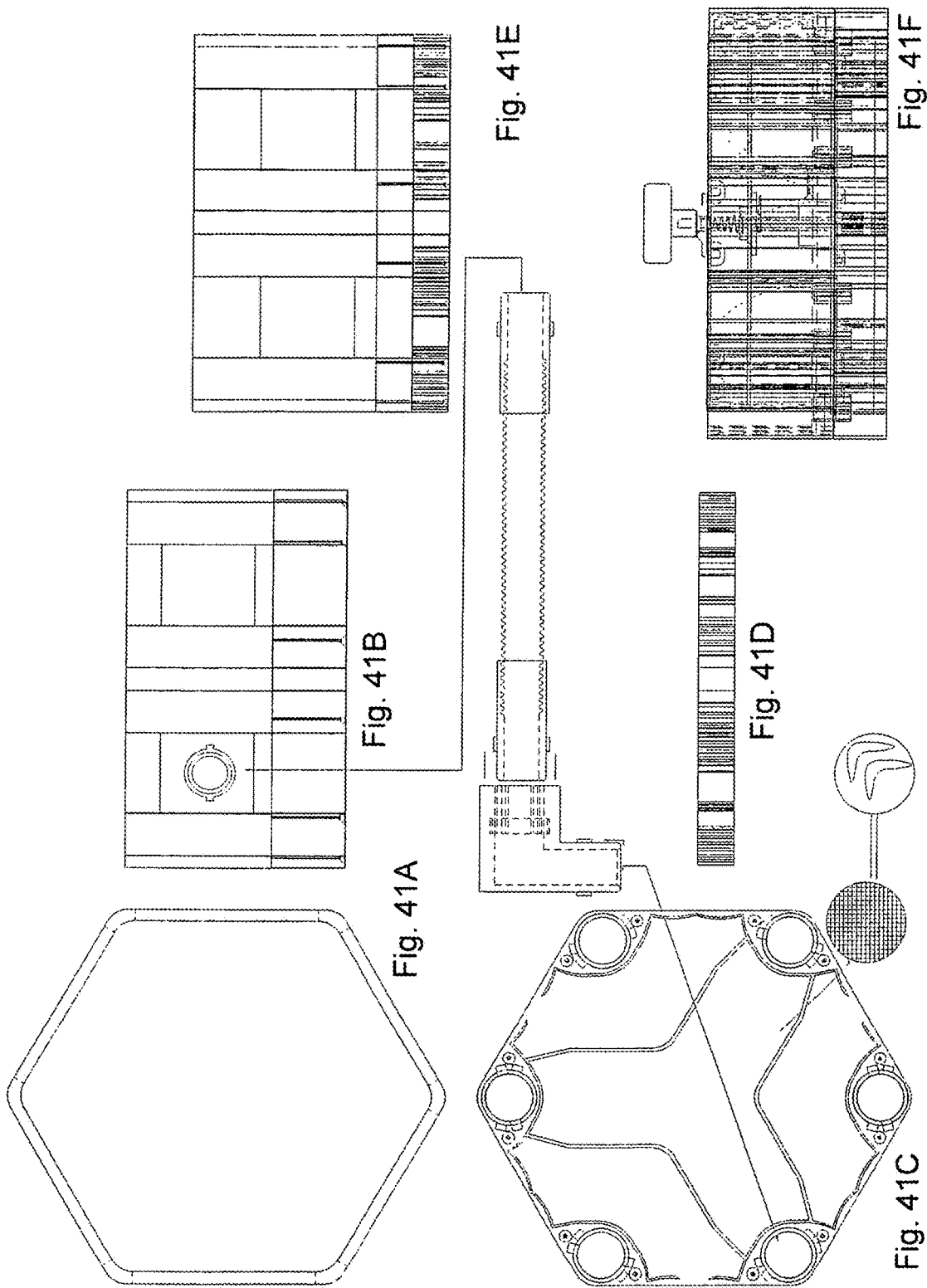

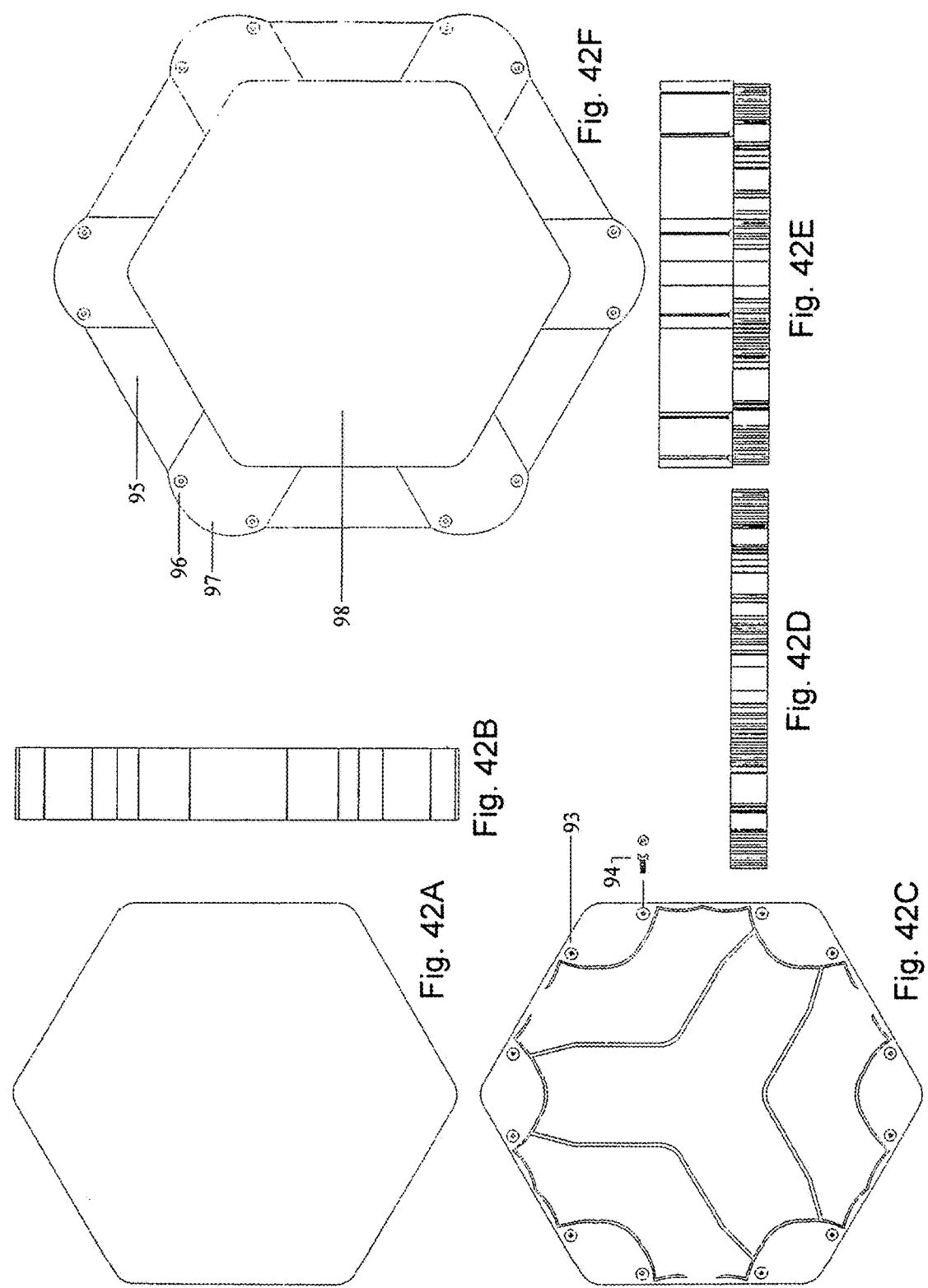

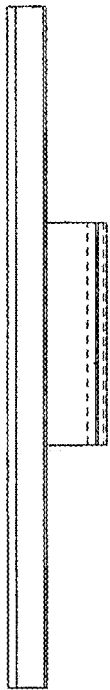
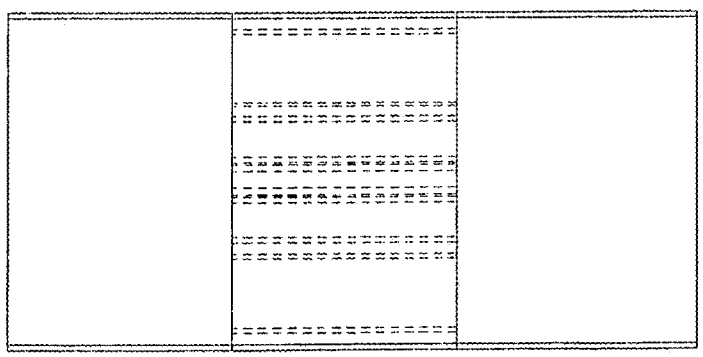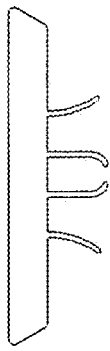

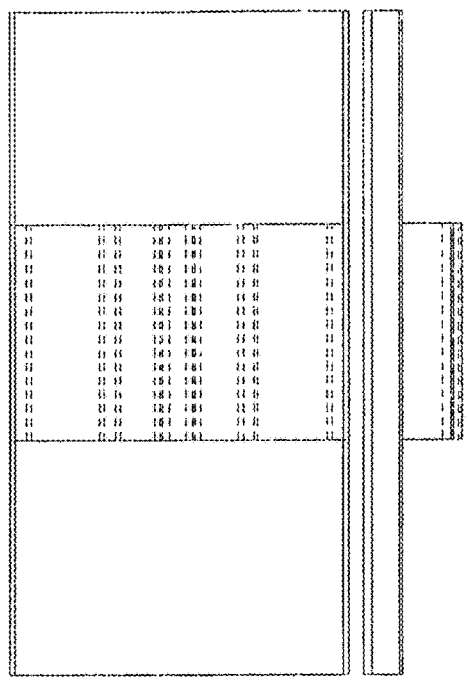
Fig. 44B
Fig. 44C
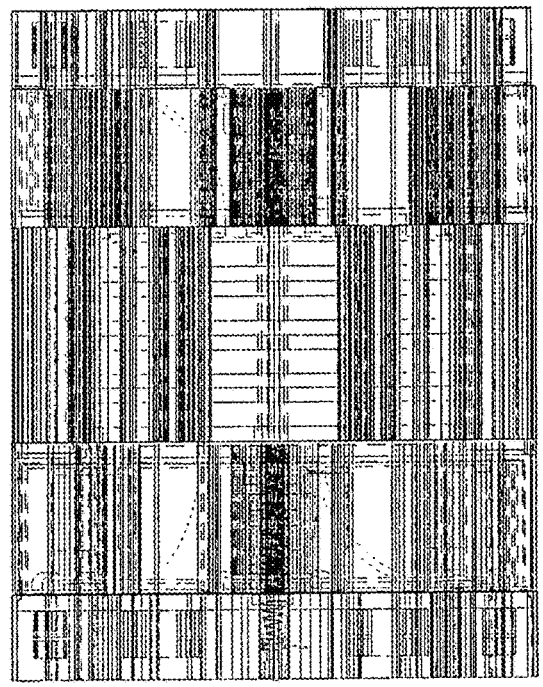
Fig. 44E
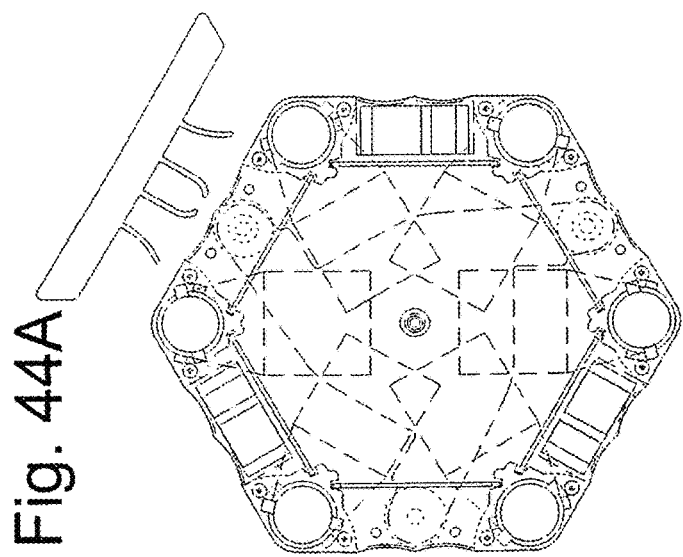
Fig. 44A
Fig. 44D

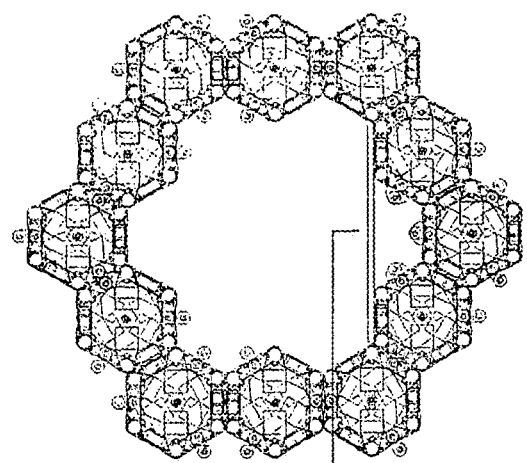
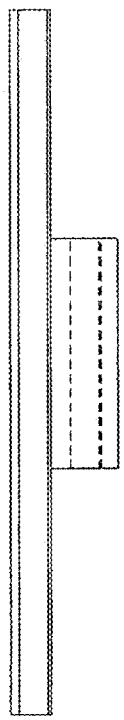
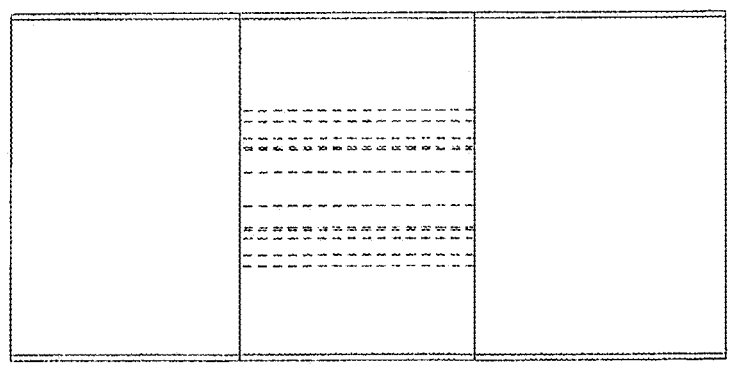
Fig. 45D
Fig. 45B
Fig. 45C
Fig. 45A

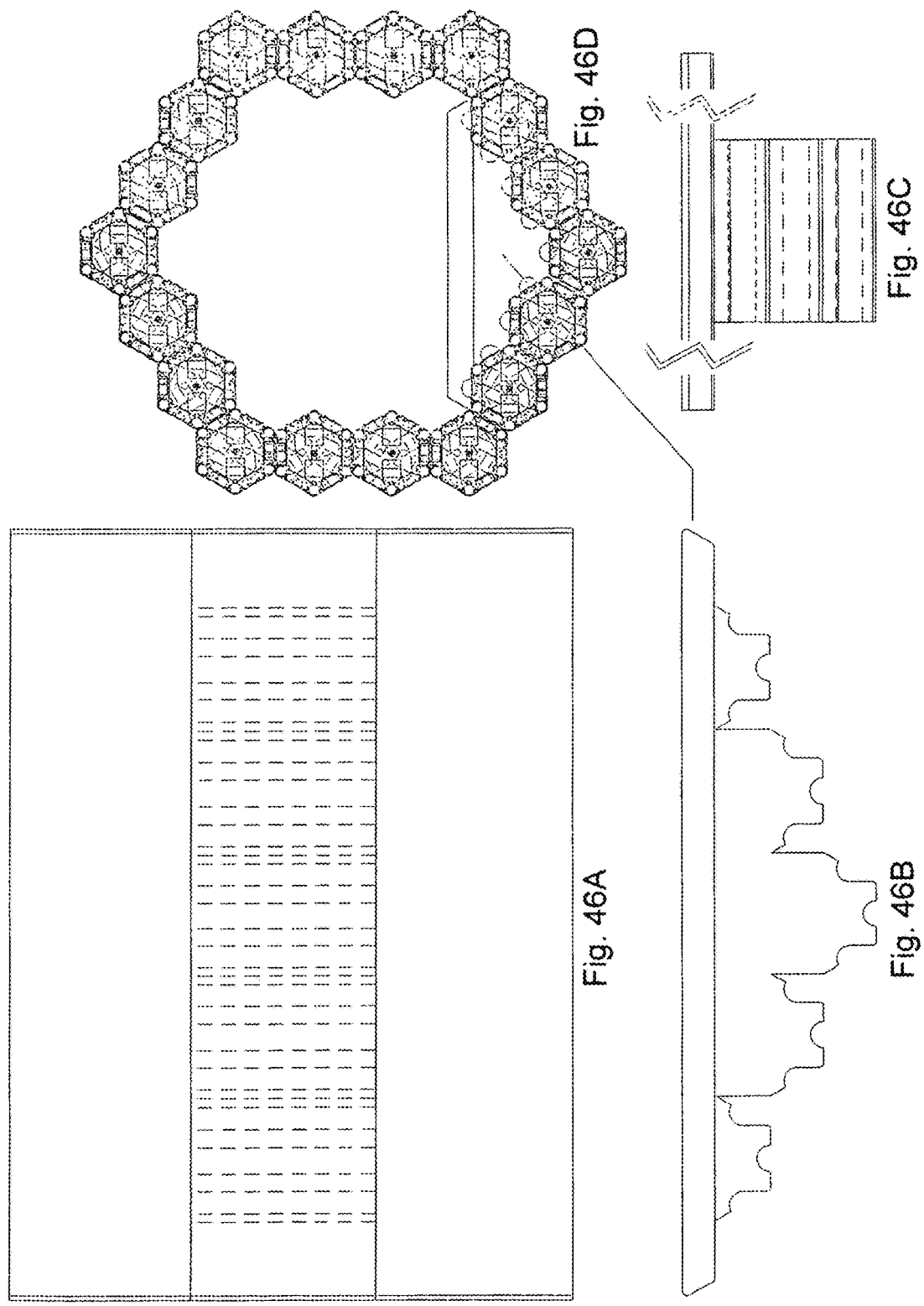

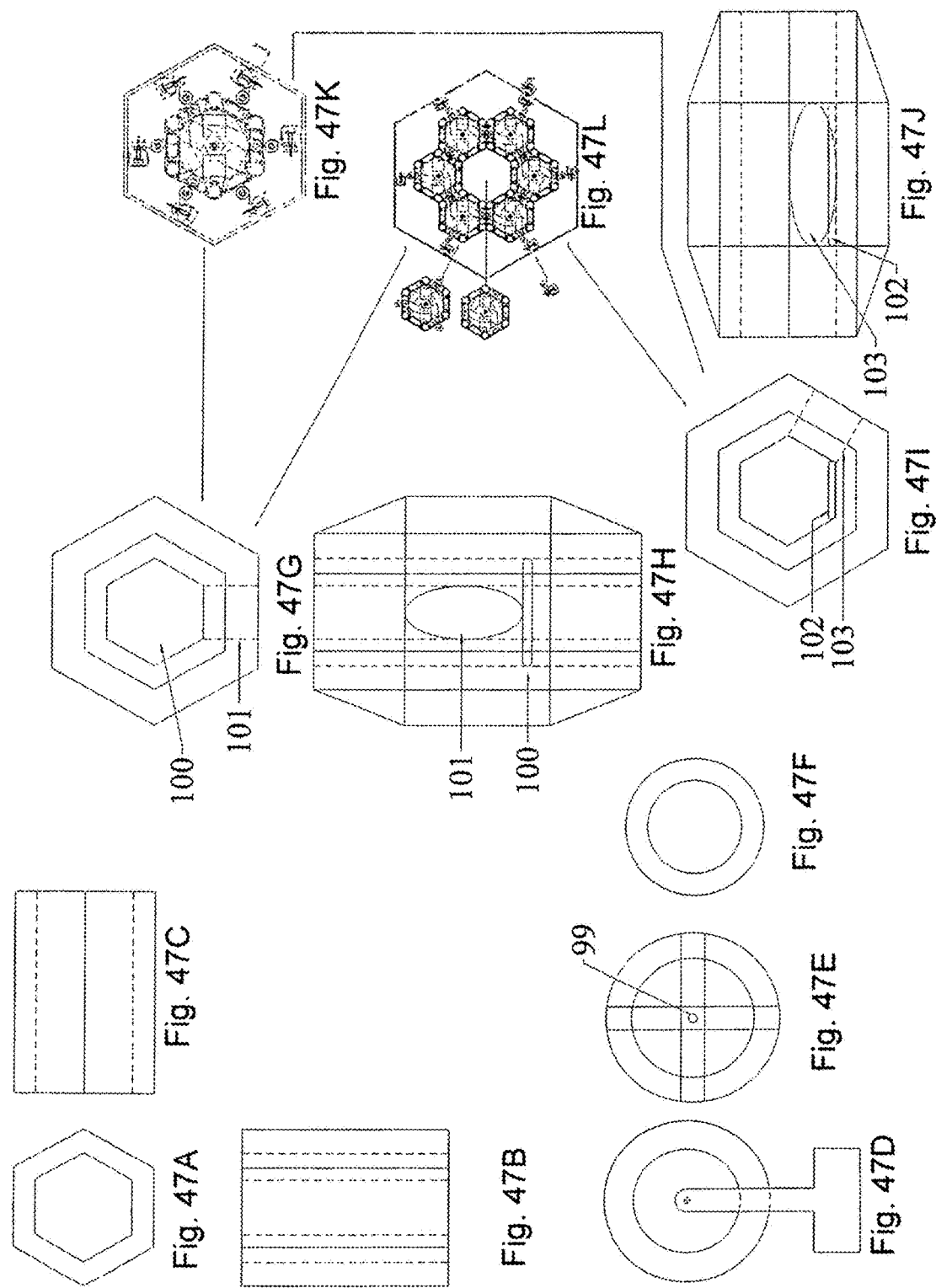

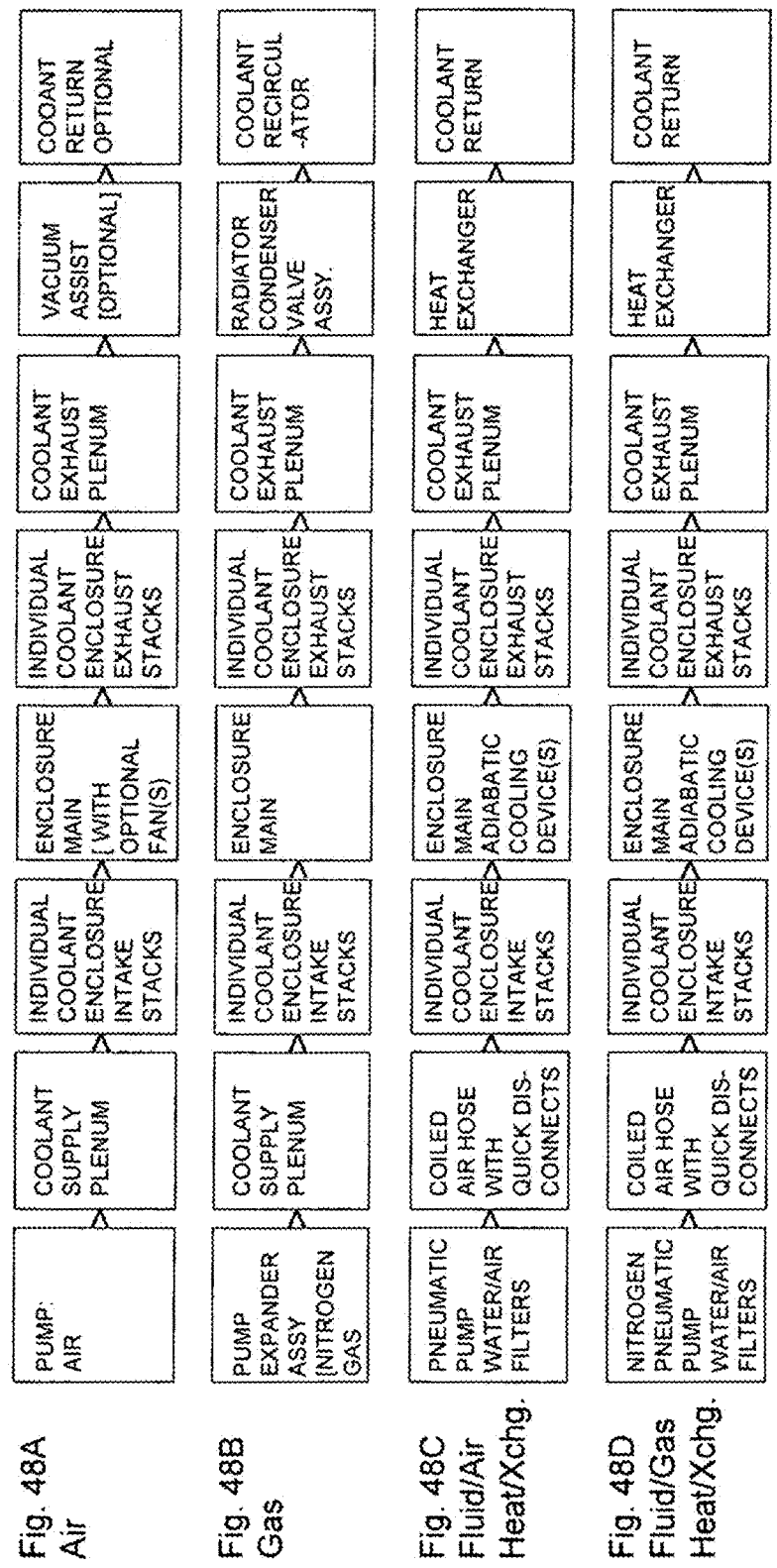

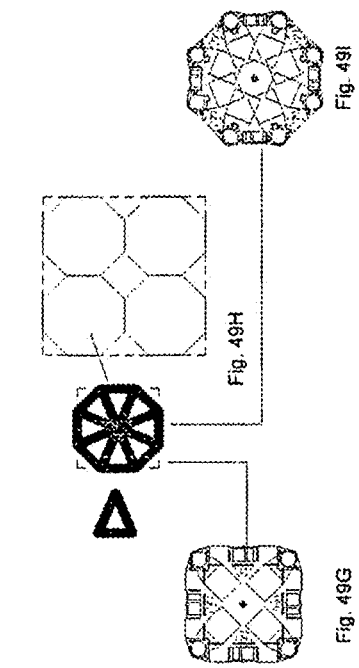
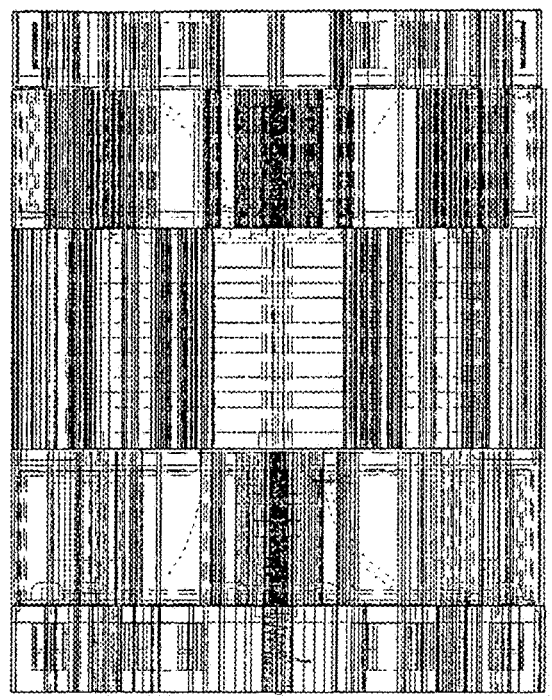
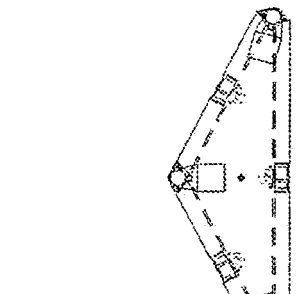
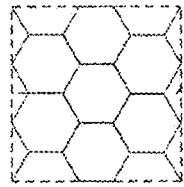
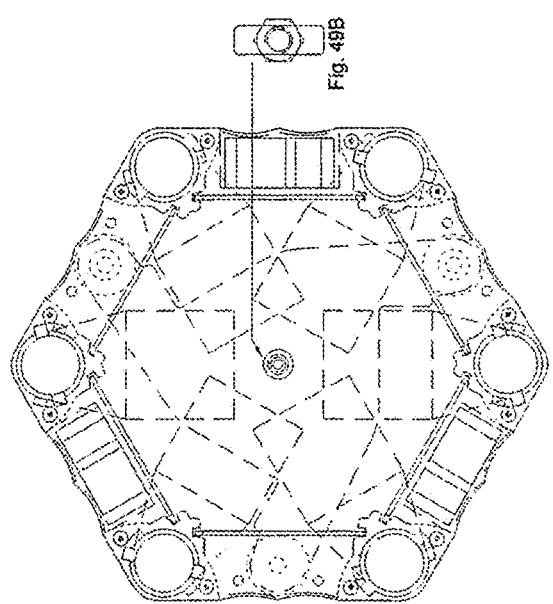

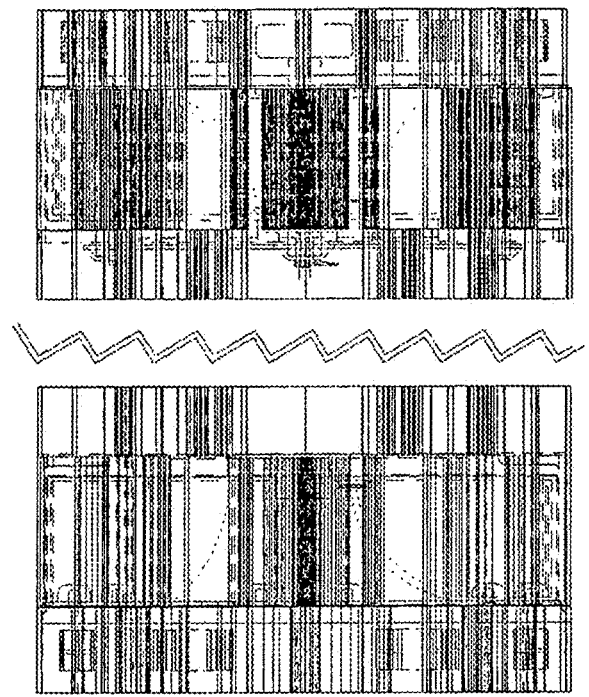
Fig. 50C
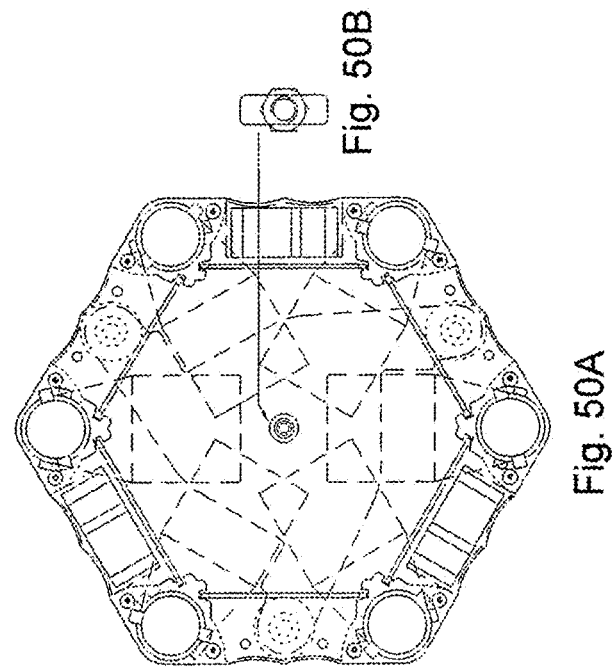
Fig. 50B
Fig. 50A

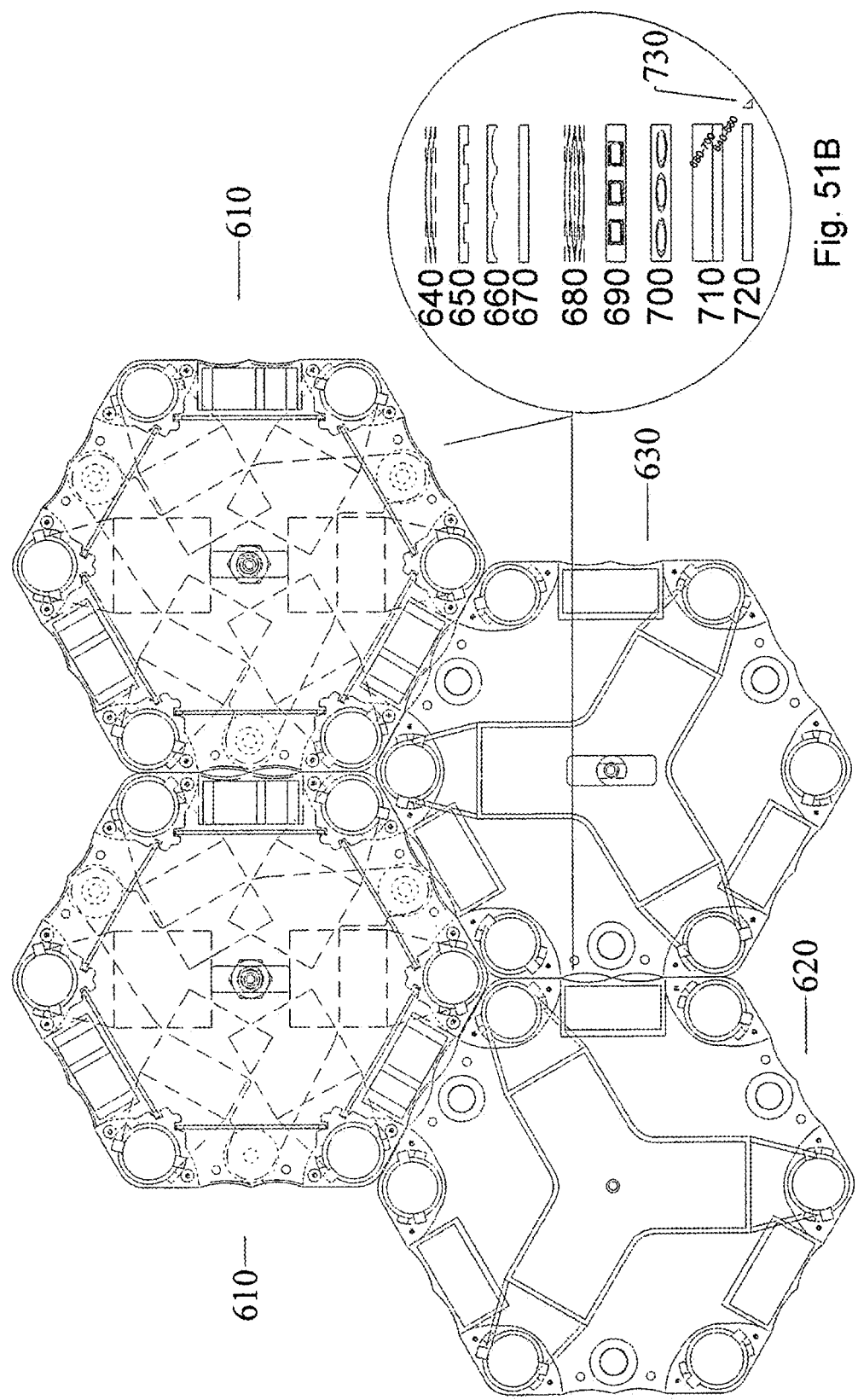

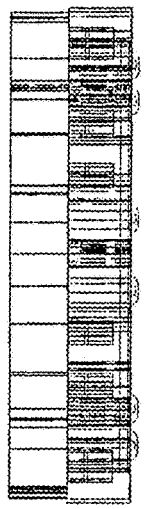
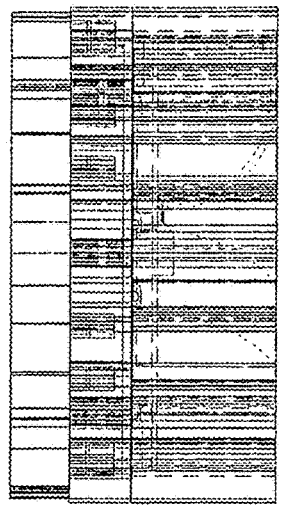
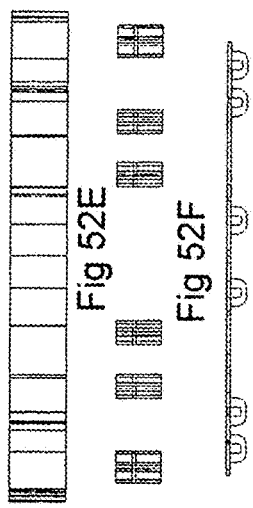
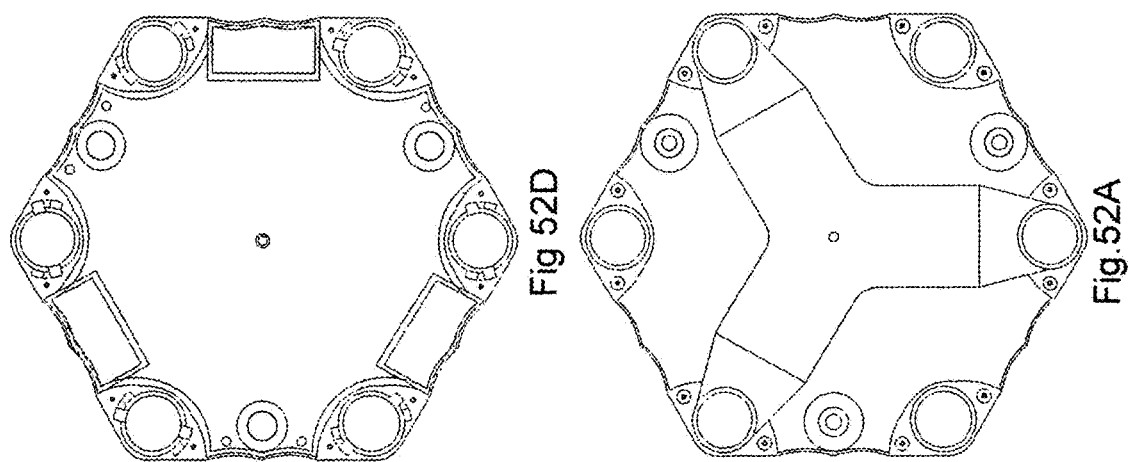
Fig 52H
Fig 52I
Fig 52C
Fig 52E
Fig 52F
Fig 52G
Fig 52B
Fig 52D
Fig. 52A

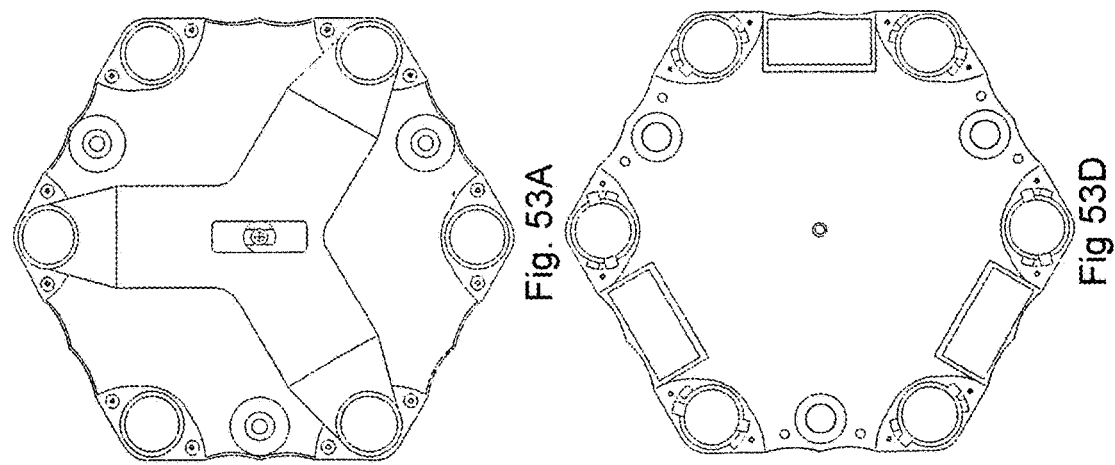

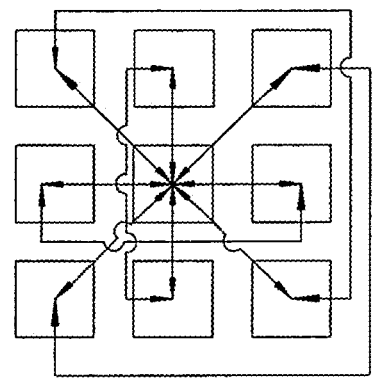
FIG. 56C
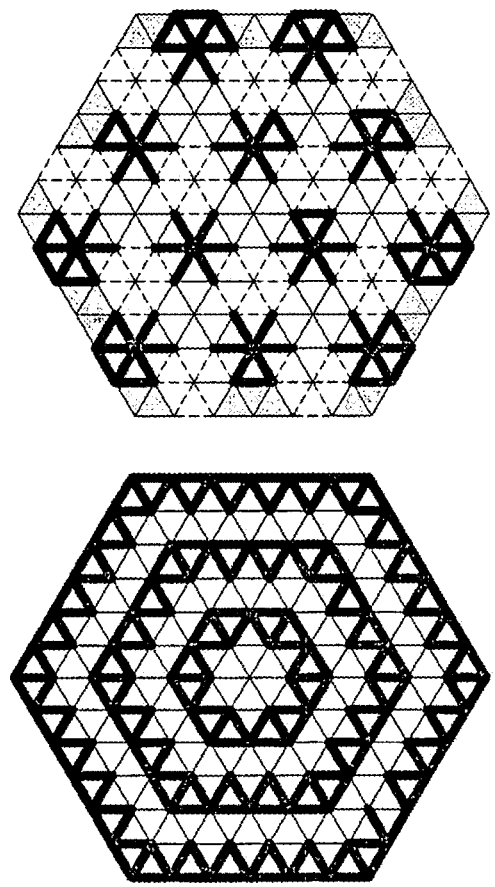
FIG. 56B
FIG. 56A
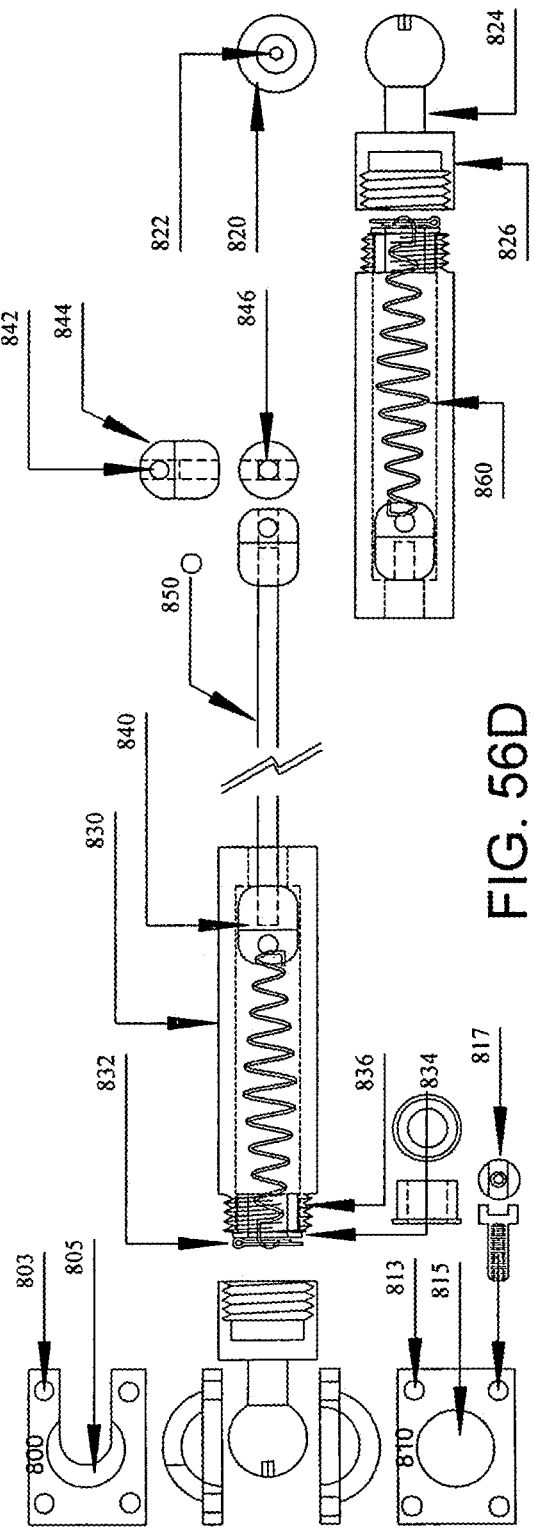
FIG. 56D

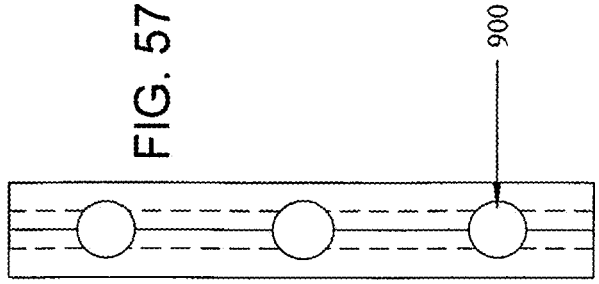
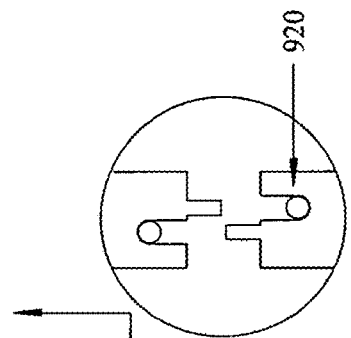
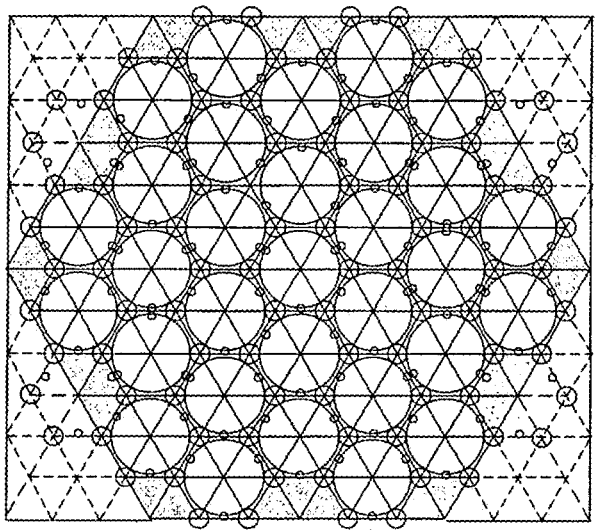
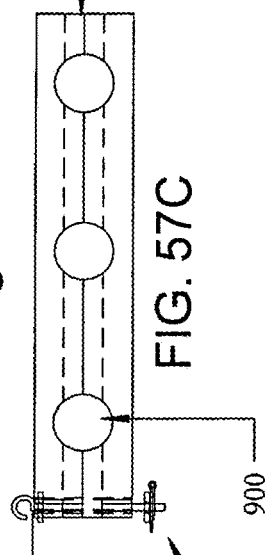
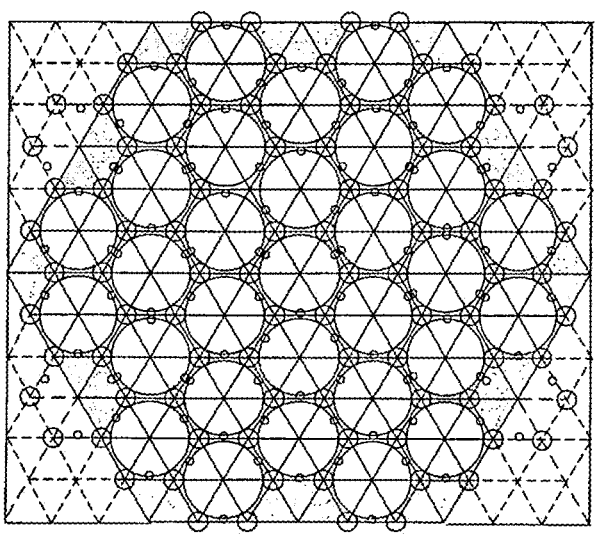

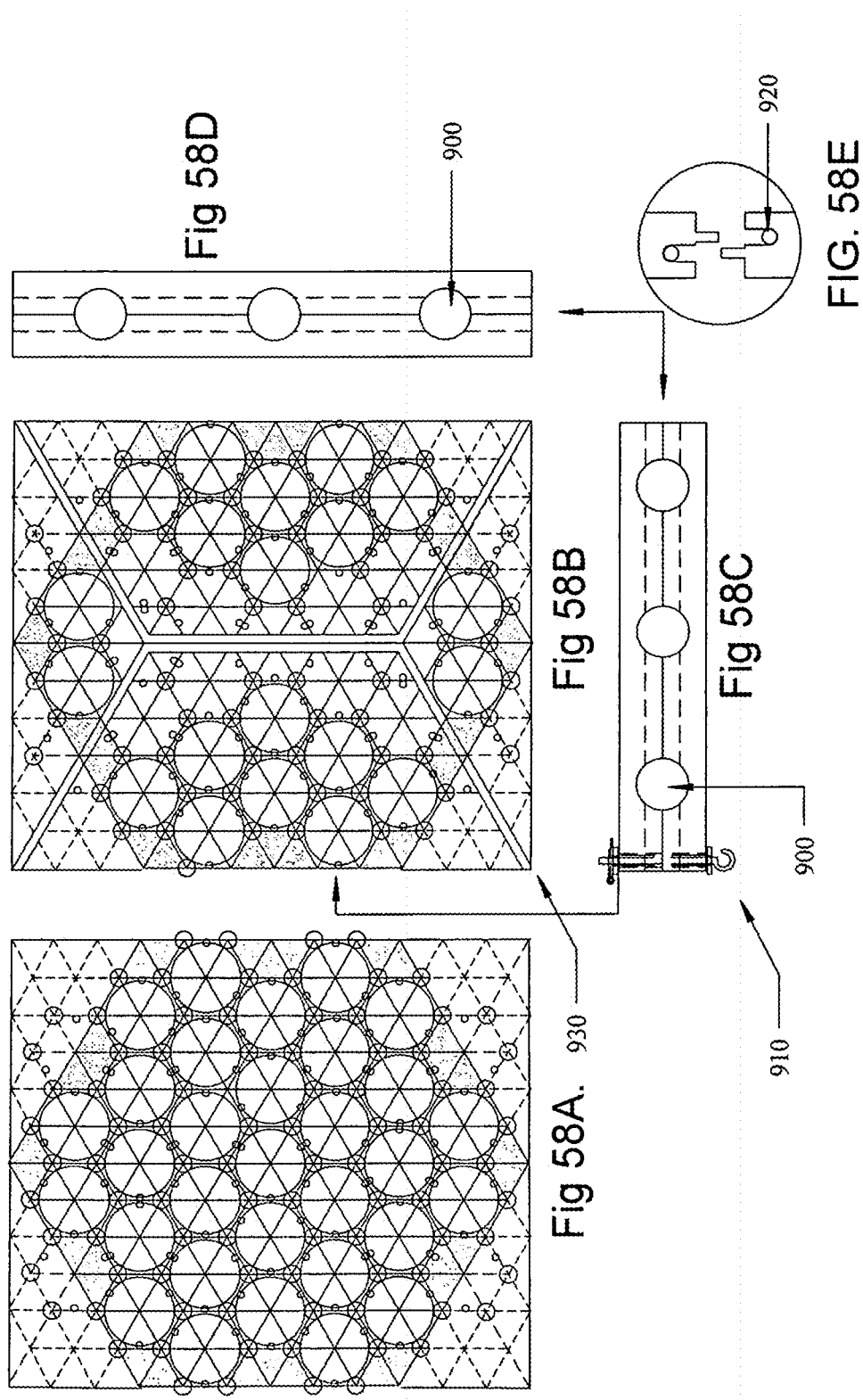

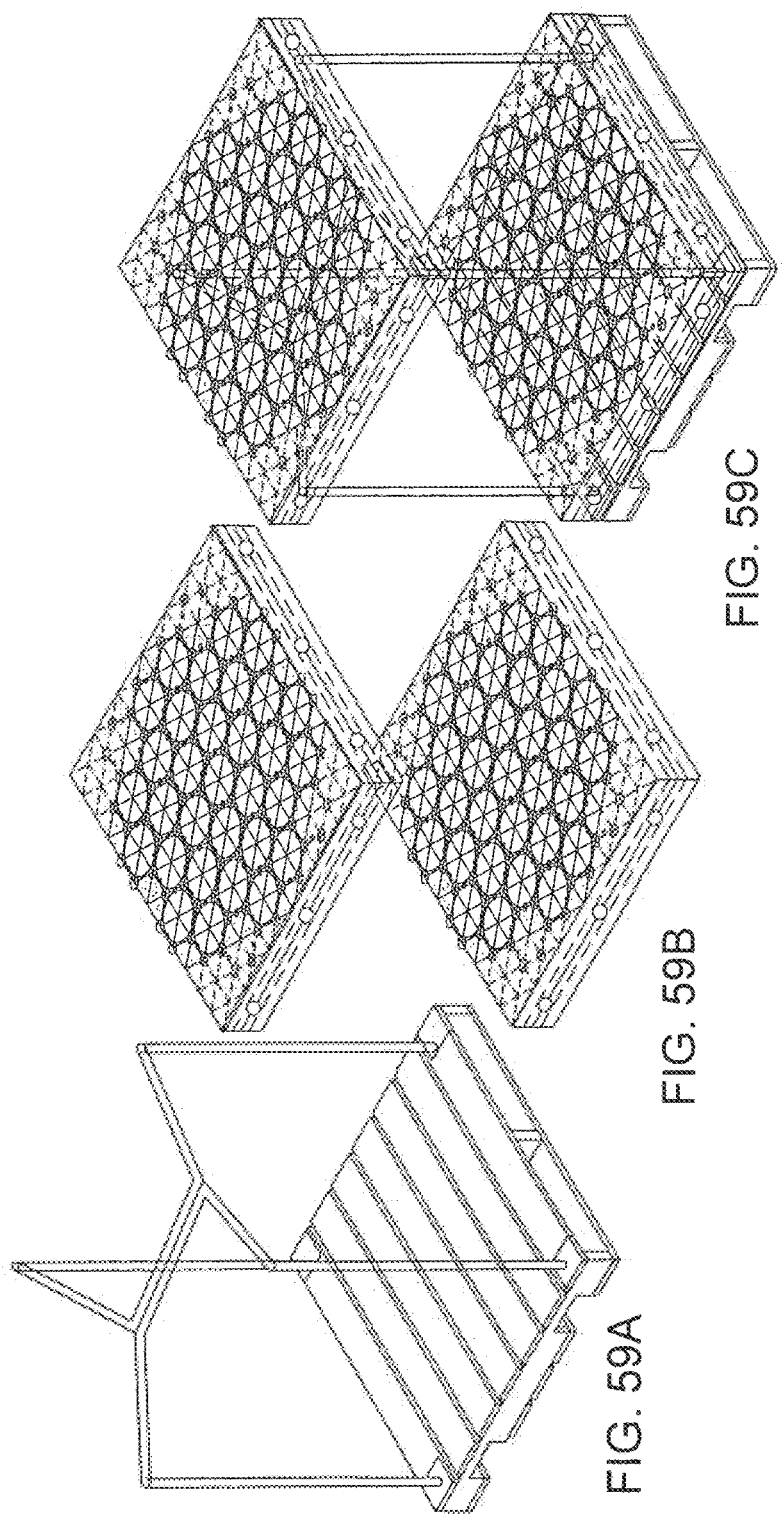

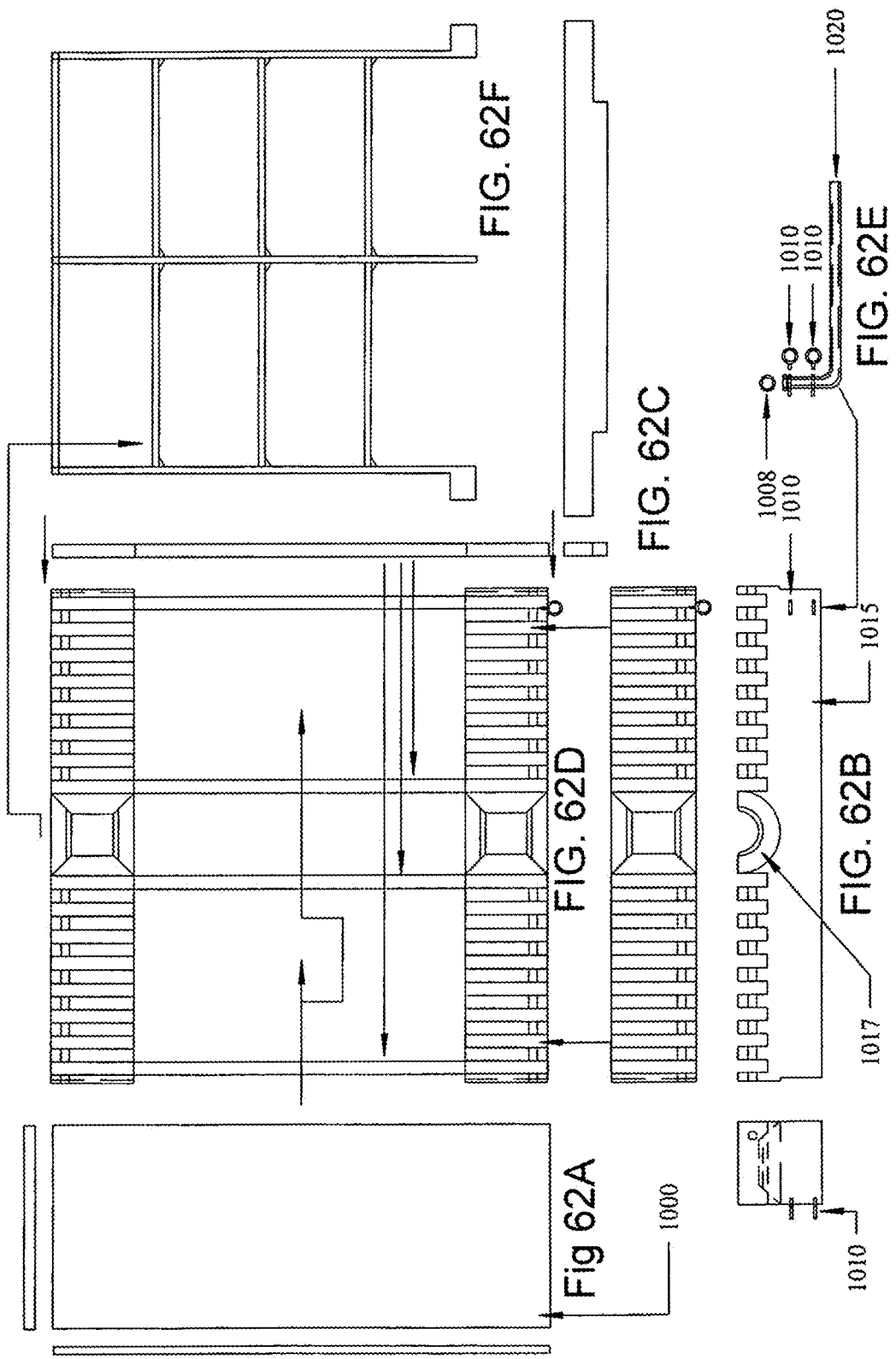

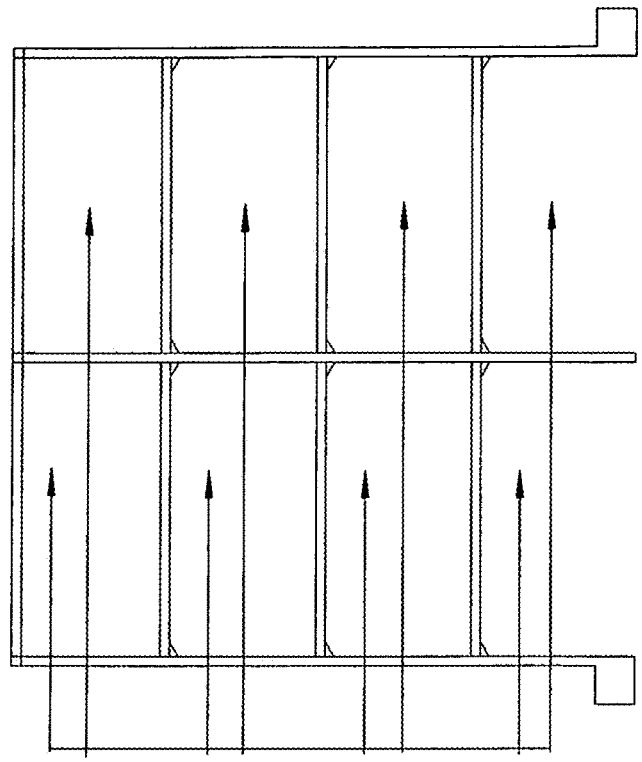
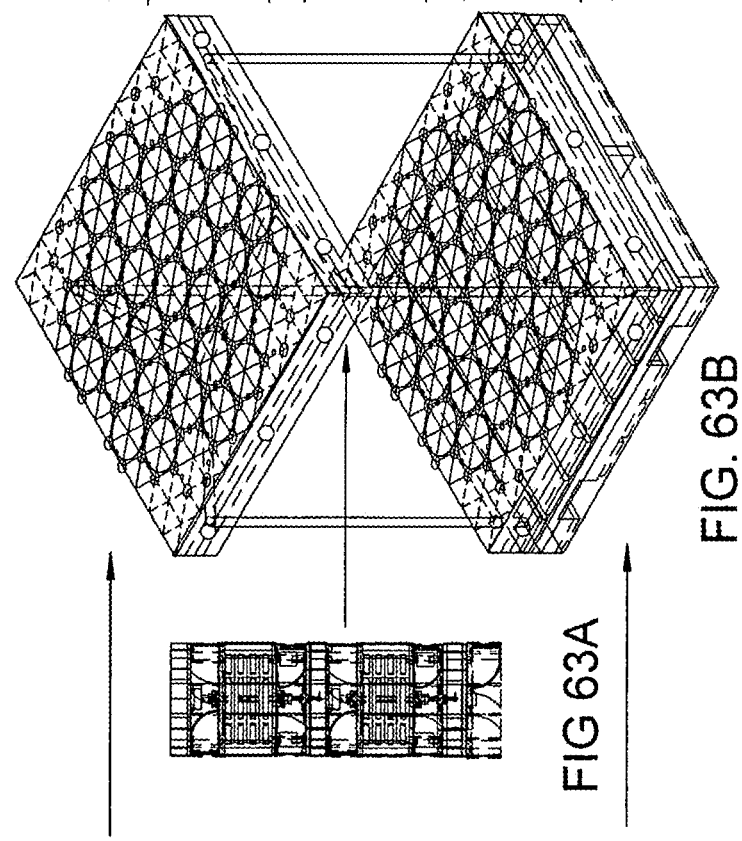
FIG. 63C
FIG. 63B
FIG 63A

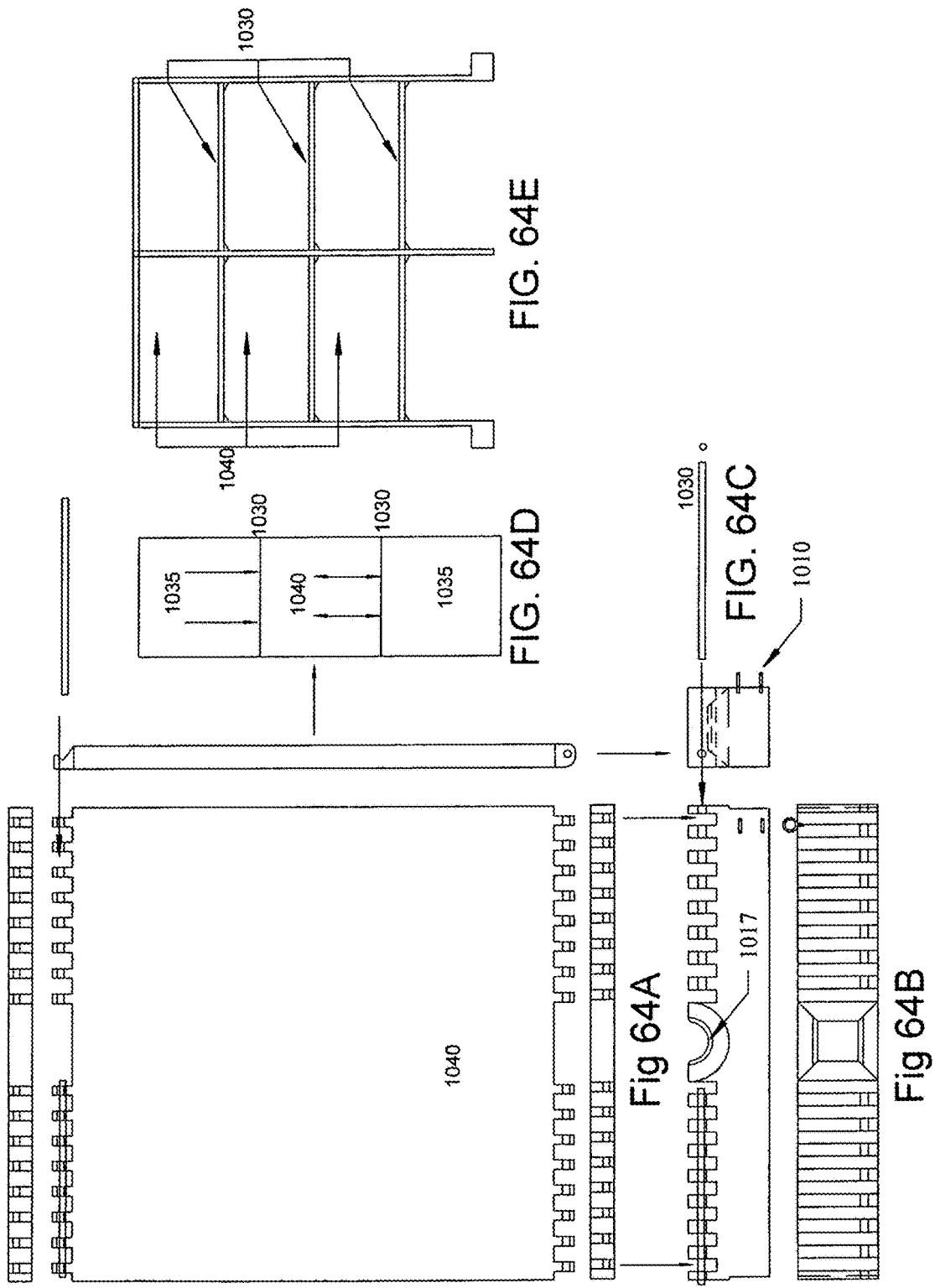

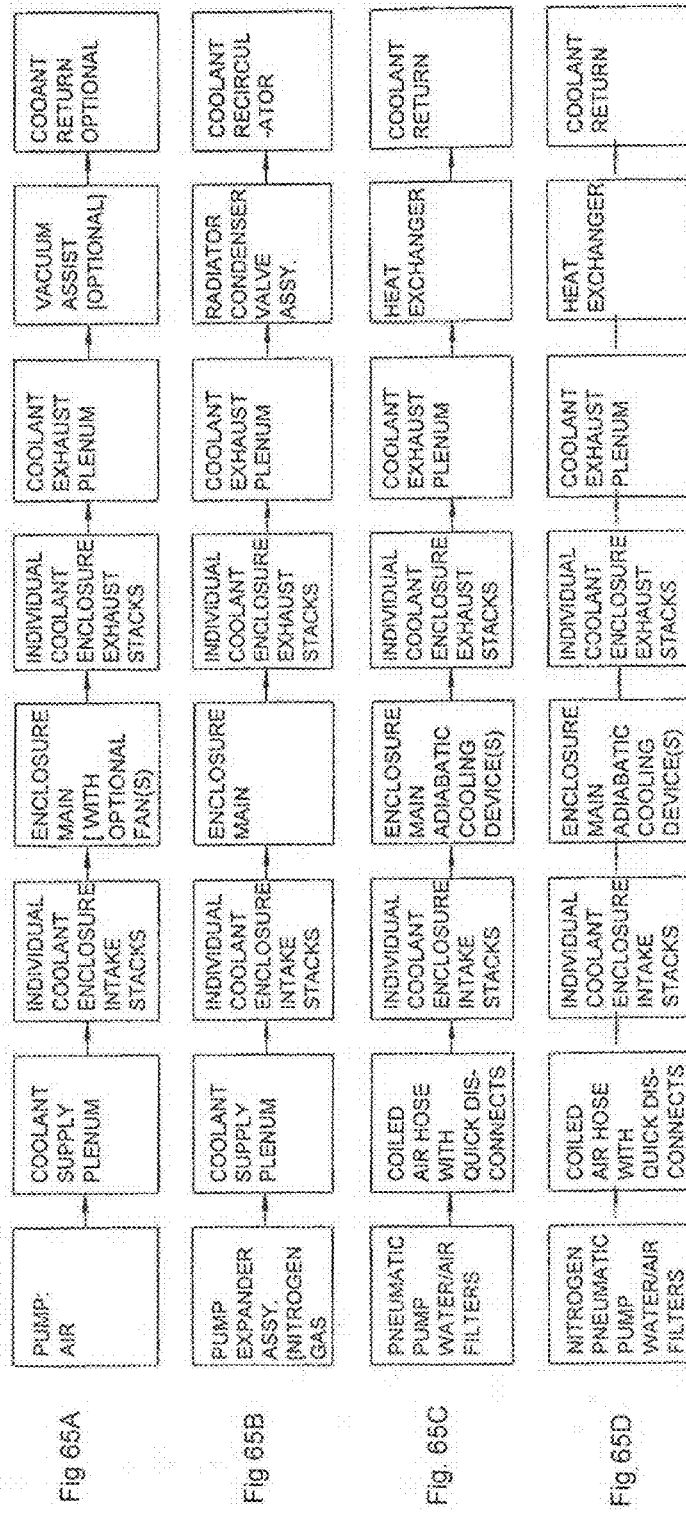

SYSTEMS AND METHODS FOR SCALABLE PARALLEL DATA PROCESSING AND PROCESS CONTROL

CROSS REFERENCE TO RELATED APPLICATIONS

This application is a continuation of U.S. application Ser. No. 12/806,206, filed 9 Dec. 2010, and claims the priority of U.S. Provisional Application No. 61/283,957, filed 10 Dec. 2009; the disclosures of both applications are hereby incorporated by reference in their entireties.

BACKGROUND

Prior art appears to be comprised of X-Y Cartesian coordinate or XYZ coordinate systems used to layout connection based systems in 2D as single plane devices using additive or subtractive processes and 3D as layered substrates utilizing additive and subtractive processes or enclosures respectively based on either cubic or rectangular prisms. Enclosure based systems often stack in columns and rows to make 2D arrays which give rise to what we refer to as aisles where sometimes two 2D arrays are placed so that their backs are to each other with the front faces accessible in parallel aisles similar to shelf layouts in a supermarket. On occasion such arrangements are laid out in a circle round a central space for access.

SUMMARY OF THE INVENTION

The invention involves the combination of a data processing or calculating computer apparatus (or corresponding methods for performing data processing or calculating operations) and a device or apparatus controlled thereby, the entirety hereinafter referred to as a control system.

The invention differs from already patented or made inventions as follows:

We use words to communicate and define that of which we speak for the purpose of mutual understanding. For this reason, it is necessary to define tessellation forth with. Tessellation is defined as a collection of planar figures that fill a plane with no overlaps and/or gaps. Generalizations to higher planes are also possible. (Reference: en.wikipedia.org/wiki/Tessellation). Tilings are defined in kind without gaps or overlaps with irregular shapes. This is a pretty standard stuff. Other patents have made claims based on tessellation, which without gaps, would indicate a solid surface without separation and therefore any extrusion from such a planar surface to the third dimension would have to be a singular solid. Therefore this invention is not a tessellation and is hence outside the scope of those patents claiming a tessellation as a basis. (Ref. U.S. Pat. No. 6,469,901B1, Ser. No. 09/672,681).

Separately, in kind again, the state of the art, as proposed in preceding patents does not meet or approximate the criterion of a tessellation or tiling with vast unclaimed gaps often exceeding the surface area of the modules, between not even remotely contiguous co- and multi-planar veritable islands connected by "rats-nests" of half-hazard wiring or RF omni-connectional bridges. More chaos than pattern. Thus although the patent proposed here may approximate a tessellation more closely than it's forebears, by definition it is not a tessellation, period, as it uses external planar and other gaps for interconnects, including wiring, cabling, tubing etc. as delineated in other areas of this document and the associated patents incorporated by reference. However, the invention is a vast improvement over prior technology as it takes control of the inter-module "rats nest" of wiring and other interconnection and brings the state of the art closer to the ideal of tessellation extruded from 2D to 3D with gaps. Further, patents using a triangular square, rectangular, hexagonal, or octagonal footprint or form factor without inter-module contact and integrated wiring are of limited utility and hence more a matter of incidental design unless specific utility and hence advantage is assigned to a shape by some feature. This is particularly true if the usage proceeds from these shapes to a circle with all geometric shapes inclusive. (Ref. U.S. patent Ser. No. 64/699,0161). Inter-module interconnect wiring is incorporated herein by reference to the first patent application Ser. No. 12/806,206.

The invention when deployed maximizes surface coverage by approximating tessellation with gaps on the outside vertical walls. These gaps allow module separation while allowing inter-module axial sliding fit tolerances for external co- and multi-planar inter-module contact and axial inter-module, stack and array motion. Only one other patent has a possible sliding fit, which is not apparently called out in any applicable patent application, and as it appears to use a pipe, it may be assumed to be stationary, bolted in place, without a sliding fit. Other patents have no such sliding fit, either, module to module, stack to stack or in arrays. (Ref. U.S. Pat. No. 4,499,607).

The invention allows nesting with vertical axial individual sliding fit component removal without edge, or end mount connectors, but rather using retractors, flexible cable, wire, tubing, etc. Other patents do not nest and allow individual nested submodule replacement without total, extraction of abutting units first. (Ref. U.S. Pat. No. 6,469,901).

The invention utilizes external module side walls with recessed bezeled, unbezeled or combinational patch panels with built in or surface mounted retractors, backing plates, mounting panels and pc boards for wire, cable, etc. in conjunct with sufficient interconnect lengths. This allows abutting module axial motion while maintaining abutting inter-module co- and multi-planar interconnections for sidewall patch panel (re-)configuration, replacement and/or quick change for (re-)manufacture, field service and retrofit while accommodating all styles of interconnect, with a preferred embodiment including quick-disconnect capability. This can be done in single or multiple stacks and/or arrays with or without nesting. Modules in such an arrangement may also be taken out of a stack, an array or stack of arrays, with minimum impact on neighboring modules. No other known system has these conjoined capabilities. (Ref. U.S. Pat. No. 6,469,901)

The invention incorporates a top interconnect catch basket and an integral bottom self-centering tapered slip fit cover, wherein all styles of interconnect may be mixed and matched, not just computer, or data-exchange. Interconnection capability is limited only by catalog, special hardware or the OEM, vendor or other users imagination. This diversity is based on placement of infinitely configurable mounting flats, replaceable and modifiable bezels, landings, knockouts, cutouts and plugs. This allows for individual stacked modules to be accessed for service including (re-)configuration of end cap wiring basket and cover interconnects. Other patents allow for only proprietary, including alignment based, top and bottom interconnects for communication to and from resource modules such as computers and drives a stand-alone stacks and not for inter-stack or array communication with no catch basket, tapered matching protective cover or cable and/or hanger based alignment systems. (Ref. U.S. Pat. Nos. 6,469,901, 4,501,460).

The invention utilizes hot swap. Modules enjoy power interconnects between modules, where a three wire, hot, neutral and ground bus bar system is used within each module with quick-disconnect power interconnects at the top and bottom of each unit, preferably hermaphroditic. The top and bottom units of a singular stack are wired back to the same electrical outland master breaker panel leg. This allows hot swap by disconnecting one side of an intermediate stacked module, connecting a replacement module on the powered disconnected adjacent side, moving the connections from the old to the new module, disconnecting the power plugs from the old module and attaching it to the new module to again complete the double ended bus bar circuit. When dealing with arrays the number of plug interconnects equals the rotational stacking positions possible, as shown in exemplary fashion with three possible plug alignments, matching top and bottom, in the six sided asteroidal enclosure drawings minimum of three such plugs are utilized. In standard configuration one plug set acts as the bus bar, the other two are pass throughs, rotation, by example 120° for a hexagon, which dictates which will be active for a particular stack. This is done so that adjacent modules in planar arrays may have hot swap and not be on the same leg, allowing system information and/or process rerouting, should power go down in a particular leg.

The preferred embodiment employs interconnects which enjoy some form of quick-disconnect at either end and are limited in travel to between one and two modules in length to help expedite re-configuration, service modification and replacement, pending component selection. Other systems are more hardwired and are therefore harder to take apart, update, refurbish, replace or repair. (Ref. U.S. Pat. Nos. 4,501,460, 6,469,901).

The invention provides that modules are positioned and moved either manually and/or by automation. Manual motion utilizes cable Grippers™ (or functional equivalent), actuator plate, actuator rod, optional actuator tube and connected actuating handle with optional locking release. This is used for individual modules, stacks and/or in nested co- and multi-planar arrays with integrated variants incorporating track and roller systems and/or (stepping) motor driven cog and track systems to constrain or otherwise control motion. Stack and arrays may be horizontal, vertical or any angle in between, held together by frames, hangers, hooks, etc. All combinations as stated are envisioned with or without nesting. No other patent appears to have this capability. (Ref. U.S. Pat. No. 4,501,460).

The invention allows single and multi-interconnection sidewall facet based interconnection in either co- or multi-planar geometries or through vertical end cap basket and cover sets or interface with or without utilizing intake and exhaust master plenums or any combination thereof as preferred methods of command and control. Command and control is wired internally from any point of the module wired to the sidewall of choice, and then externally with or without internally and/or externally mounted retractor(s) through the external patch panel on the chosen wall to the module of choice either above and below or adjacent to the co- or multi-planar module in question. The external wire guides above and below the patch panels are used to position and constrain wires to their proper motion. Other patents espouse vertical stack based command and control interconnection only based on individual vertical inter-module wiring with a singular modular interconnect.

The invention employs a three, four, six, eight sided astroidal and/or approximated tessellation and/or tiling enclosure with/or without truncated convex or concave apexes and scalloped transitions between individual horizontal curves connecting apices for wire guides, although straight lines may also be used or any combination thereof. Rounded surfaces are preferred to avoid snagging or other binding, although straight lines may also be embraced. However, external enclosure geometries of similar patents are apparently without exception, based on straight lines, some and/or convexly formed curves with no concavely formed features. (Ref. U.S. Pat. Nos. 3,495,134, 4,937,659, 6,469,901).

Although many patents refer to thermal management as part of their embodiment in many instances it is not addressed at all. The gold standard appears to be the placement of louvers in the walls of a shoebox or cubic cavity. The invention utilizes radially symmetrical outlying cooling tube housing assemblies tangentially asymptotic to their respective intersecting sidewalls of the individual apex centers which are truncated and rounded so as to be conformal to said housings, with associated extensible coolant duct hosing, quick disconnects, plenums and plugs for intake and exhaust as well as a central optional cooling duct (FIGS. 22A-22K). Cooling tubes are optionally fitted with a non-rotating (FIG. 25C) or rotating sleeve (FIG. 25F), with a coolant input ports (FIG. 25G) and angled output slats (FIG. 25D), louvers (FIG. 25E), and/or mesh which allows volumetric and directional tuning of coolant output to common multi-module contiguous apex exhaust stacks. A centralized high velocity cooling stack may operate separately or in conjunction with the former (FIGS. 39A-39D). Utilizing this arrangement provides rapid swap out or service of components while minimizing or eliminating the necessity of thermal management disruption in a potentially sealed and therefore explosion proof system with the possibility of above atmospheric operating pressures. Separately, by removing the top and bottom plenums, with their integrated interconnect feed throughs, this exposes end cap wiring basket fan mounts and fan shields for direct main cavity coolant intake and/or exhaust with or without optionally closing off the coolant tube housing assemblies for mechanical aspiration at flow rates comparable to some carburetors, while maintaining main cavity cage retention and peripheral ducting. Cases used or contemplated for use in arrays include a heat barrier on or in all walls so as to direct heat in the designed flow pattern. Flow patterns may be reversed or any other flow pattern combination may be utilized as required. No alternate patented and/or made competitive products appear to exhibit this features. (Ref. U.S. Pat. Nos. 4,501,460, 4,937,659, 4,499,607).

The invention utilizes standard industrial cartridges, including floppy disks, hard disks, CD/DVD/Blue Ray/tape drives and removable cartridges generally available through industry-standard catalogs and other sources. Cartridges may not extend beyond opposing bezel walls, with the exception of handle pulls, which must fold out of the way and must be flush and not external, so as to avoid interfering with the sliding fit of other modules. This embodiment shall be considered open source in regard to cartridges to include memory storage devices such as floppy drives, hard drives, CD-ROMs, DVD drives, tape drives, USB devices, fire wire, PCMCIA devices, and attendant previously patented standardized socketed enclosures utilized in industry. Alternate patented and/or made competitive products utilize non-standard cartridges on which they base much of their patents, in regard to industry standard components. Unlike other patents the module is in this regard open source. (Ref. U.S. Pat. Nos. 4,937,659, 6,469,901).

Standard industry practice utilizes cutouts, flush bezels in case panels and rails for mounting devices in bays. The invention utilizes covered and protected and/or recessed bezels with or without mounting plates and PC boards attached to the chassis, to embrace custom and/or standard industry catalog or special order devices with available published or unpublished mounting patterns to maintain a sliding fit in relation to the form factors referenced herein. (Ref. U.S. Pat. No. 4,937,659).

The invention's chassis when unpopulated or provided mountings do not cross multiple cage side-walls, may be made to layout flat for work, when the top and bottom pins are disconnected in one corner. The chassis is a three, four, five, six, or eight sided wire form assembled from square or rectangular hinged wire frames with configurable break-off tangs limiting inward folding to 120°, 90°, 72°, 60° or 45°, respectively and may act as the system bus-bar ground. Configuration and adaptation of card cages and rails for mounting industry-standard, (including current or future industry requests for comment RFCs to final specifications) or proprietary motherboards and PC boards (including current or future industry requests for comment, "RFCs" to final specifications) shall be considered open source and obvious regarding the mechanical interfaces of same. In this regard, the type 1 enclosure was designed to handle ATX style PC boards, while the type 2 enclosure was designed to handle one or more smaller PC boards, either peripherally, that is radially disposed including by each wall, stacked, and/or any combination thereof. Nor other patent has this arrangement, allowing the potential for easy chassis extraction for work with or without an enclosure, pending final component selection. Other patents, which utilize connector/receptacles as the chassis, under this system, although a connector receptacle may be grounded to the chassis, it is not considered part of the chassis itself. (Ref. U.S. Pat. No. 4,937,659).

The simplest and most central concept of the invention is to provide a scalable modular interconnect system based on internal intra-module nesting and abutting inter-module connectivity utilizing redundant equal length propagation pathways for both data and separately shorter signal look-ahead path ways from 2D and 3D molecular level to the enclosure level based on the interconnection propagation path ways dictated by the vertex and face based symmetry of the approximated tilings/tessellations of hexagonal and 12 sided prisms with stacking in columns, rows and arrays which may be arranged as modules or nested modules with adjusted aggregated technology dependent signaling time delays to include equilateral triangles to bridge multiple modules as pipelines for binomial expansion processing and optionally as enclosures with sliding fit, thermal management, positioning, and other support systems, optionally seated on dollied pallets with ramped slide out industrial shelving.

BRIEF DESCRIPTION OF THE DRAWINGS

FIGS. 1A-1I. Bottom Release Enclosure: Full Assembly
FIG. 1A. Top View, Six Sided Asteroid
FIG. 1B. Symmetrical Handle: Top View
FIG. 1C Side View: Sight top to left of sheet.
FIG. 1D. Optional Triangular Variant less handle with symbolic top view of planar mono- and multi-planar black/populated and white/non-populated (thermal chimney) symmetrical array.
FIG. 1E. Symbolic Build-Out from Single Equilateral Triangle Structure to Hexagon, Square and Fractal Larger Equilateral Triangle with Implicit Nesting and Array.
FIG. 1F. Example Triangle (and other shapes, including a set of hexagons) Used To Complete a Square (with black/populated and white/non-populated {thermal chimney} symmetrical array).
FIG. 1G. Square Approximated Tesselation/Tiling Tile (with symbolic top view of planar mono- and multi-planar black/populated and white/non-populated {thermal chimney) symmetrical array).
FIG. 1H. Symbolic Build-Out Using Square or Octagon Approximations as Representative Tile/Tesselations (with symbolic top view of planar mono- and multi-planar black/populated and white/non-populated {thermal chimney} symmetrical array).
FIG. 1I. Octagonal Module: Top View
FIGS. 2A-2H. Bottom Release Enclosure: Connector Bay Top Cover End Cap
FIG. 2A. Top View
 1. Stress relief feed through, grommet, hermetic seal, etc. for wire/cable/pipe;
 2. Cooling Tube Hose Assembly ¼ Turn Twist Lock or other standard or special order seal pending usage;
 3. Stanchion Guide Hole; and
 4. Stanchion Stress Relief
FIG. 2B. Side View
FIG. 2C. Standard Blank Bezel: Top View;
FIG. 2D. Standard Blank Bezel: Front View;
FIG. 2E. Standard Blank Bezel: Side View;
FIG. 2F. Bezel with knockouts, cut outs and/or plugs; Top View;
FIG. 2G. Bezel with knockouts, cut outs and/or plugs; Front View;
and
FIG. 2H. Bezel with knockouts, cut outs and/or plugs: Side View.
FIG. 5B. Plenum Cooling Tube Orifice Interface from Plenum Side
  30. Stanchion Tab;
  31. Stanchion Seat;
  32. Orifice
  FIG. 5C. Side View
  FIG. 5D. Fan Mount, Side View
  FIG. 5E. Fan Mount Top View
  FIG. 5F. Fan Mount, Alternate Side View
FIGS. 6A-6C. Bottom Release Enclosure: Coolant Intake Plenum with Actuator Plate Installed
  FIG. 6A. Top View;
FIG. 6B. Orifice View;
FIG. 6C. Side View;
FIGS. 7A-7G. Bottom Release Enclosure: Bezel Stanchion Assembly
  FIG. 7A. Stanchion/Tube Bezel Assembly: Top View;
  12. Guide Tube: Top View;
  33. Bezel;
FIG. 7B. Bezel: Top View;
  34. Bezel: Concave Seating Edge;
FIG. 7C. Bezel: Front View, Shown Blank with/without mounting plate backing and with/without chassis ground pending material selection and purpose;
  35. Bezel: Convex Seating Edge;
FIG. 7D. Bezel: Side View;
FIG. 7E. Bezel: Bottom View;
FIG. 7F. Cooling Tube: Top View;
FIG. 7G. Cooling Tube Segment: Side View (less coolant ports)
  30. Stanchion Tab;
  31. Stanchion Seat;
FIGS. 8A-8F. Bottom Release Enclosure: Bezel Assembly With/Without Mounting Plate and Chassis Ground
  FIG. 8A. Top View
  12. Cable Guide Tube, Top and Side Views
  FIG. 8B. Side View
  36. Bezel Array
  FIG. 8C. Bezel Backing Plate, Front View 45. Standoff
  FIG. 8D. Bezel Backing Plate, Side View
  FIG. 8E. PC Board, Front View
  FIG. 8F. PC Board,
  Side View 44.
  Retaining Screw
FIGS. 9A-9K. Bottom Release Enclosure: Cage Assembly
  FIG. 9A. Six Segment Chassis Assembly: Top View
  FIG. 9B. Chassis Cage: Single Side: Top View
  37. Inward Travel Limiting Tang (60 degree shown)
  FIG. 9C. Chassis Cage: Single Side: Front View
  38. Pivot Pin
  39. Pivot Pin Receiver and Washer
  40. Band Strap (tabbed/screwed/bolted)
  FIG. 9D. Cross Brace: Side View
  41. Cross Brace: Side View: Installed
  42. Channel
  43. Bolt/screw hold-down holes
  44. Bolt
  FIG. 9E. Cross Brace: Top View
  FIG. 9F. PC Board Tray/Mounting or Backing Plate 44. Bolt
  45. Standoff/Washer
  FIG. 9G. Side View
  FIG. 9H. Single Segment Cross Enclosure Chassis Cage
  FIG. 9I. Three Segment Triangle Enclosure Chassis Cage
  FIG. 9J. Four Segment Rectangle Enclosure Chassis Cage
  FIG. 9K. Six Segment Rectangle Enclosure Chassis Cage
FIGS. 10A-10F. Bottom Release Enclosure: Exhaust Plenum
  FIG. 10A. Top View
  3. Stanchion Guide Hole;
  29. Fan Mount Screw Holes;
FIG. 10B. Plenum Cooling Tube Orifice Interface from Plenum Side
  30. Stanchion Tab;
  31. Stanchion Seat;
  32. Orifice;
FIG. 10C. Side View: Intake/Exhaust Plenum less Stanchion/Tube
  FIG. 10D. Fan Mount, Side View
  FIG. 10E. Fan Mount Top View
  FIG. 10F. Fan Mount, Alternate Side View
FIGS. 11A-11H. Bottom Release Enclosure: Connector Bay Cover End Cap
  FIG. 11A. Top View:
  1. Stress relief feed through, grommet, hermetic seal, etc. for wire/cable/pipe;
  2. Cooling Tube Hose Assembly ¼ Turn Twist Lock or other standard or special order seal pending usage;
  46. Conformal Bolt-Head Seat;
  47. Recess
  3. Stanchion Guide Hole
  FIG. 11B. Side View
  FIG. 11C. Standard Blank Bezel: Top View;
FIG. 11D. Standard Blank Bezel: Front View
  FIG. 11E. Standard Blank Bezel: Side View;
FIG. 11F. Connector Bay Bezels With/With Out Knock Outs/Plugs: Top View;
FIG. 11G. Connector Bay Bezels With/With Out Knock Outs/Plugs: Front View;
FIG. 11H. Connector Bay Bezels With/With Out Knock Outs/Plugs: Side View
  FIG. 12A. Bottom Release Enclosure: Stanchion Assembly.
FIG. 12A. Assembly
  48. Crimped-On Rod End;
  49. "C" Washer Seat;
  50. Metal Rod;
  51. Crimped-On Threaded Rod End;
  52. Washer;
  53. Nut;
FIGS. 13A-13F. Double Ended Bus Bar Hot Swap Wiring
  FIG. 13A. Single Unit, Single Power Source (PS), Single Path
  FIG. 13B. Twin Unit, Single PS, Dual Path
  FIG. 13C. Triple Unit, Single PS, Triple Path
  FIG. 13D. Single Unit, Single PS, Dual Path
  FIG. 13E. Twin Unit, Dual PS, Dual Path w/Alternating Bypass
  FIG. 13F. Triple Unit, Triple PS, Triple Path with Three Way Bypass
FIGS. 14A-14C. Bottom Release Enclosure: Collapsible Cooling Tube Assembly Components
  FIG. 14A. Collapsible Cooling Tube
  54. Female ¼ Turn Twist Lock Tubular Collar Seal;
  55. Male ¼ Turn Twist Lock Tubular Collar Seal;

56. Threaded Tubular Hose Collar Seal;
57. Spring Loaded Collapsible Hose.
FIG. 14B. Cooling Tube Petcock
FIG. 14C. Cooling Tube Elbow
FIGS. 15A-15C. Top Release Enclosure: Full Assembly, Top View;
FIG. 15A. Symmetrical Handle: Top View; Side View: (Sight top top left of sheet);
FIG. 15B. Handle
FIG. 15C. Full Assembly, Side View
FIGS. 16A-16K. Top Release Enclosure: Connector Bay Top Cover with Single Fan Center Knockouts and Three-Way Armature Central Actuator Support.
FIG. 16A. Top View;
1. Stress relief feed through, grommet, hermetic seal, etc. for wire/cable/pipe;
2. Cooling Tube Hose Assembly ¼ Turn Twist Lock or other standard or special order seal pending usage.
FIG. 16B. Side View;
FIG. 16C. Standard Blank Bezel: Top View;
FIG. 16D. Standard Blank Bezel: Front View;
FIG. 16E. Standard Blank Bezel: Side View;
FIG. 16F. Bezel with knockouts, cut outs and/or plugs; Top View;
FIG. 16G. Bezel with knockouts, cut outs and/or plugs: Front View; Bezel with knockouts, cut outs and/or plugs: Side View;
FIG. 16I. Corner Gusseted Screen Fan Guard With Center Grommet For Single Fan, Side View
FIG. 16J. Top and Bottom View
FIG. 16K. Screen Fan Guard-Fan-Screen Fan Guard Sandwich
FIGS. 17A-17F. Top Release Enclosure: Coolant Intake Plenum
FIG. 17A. Top View;
3. Stanchion Guide Hole;
29. Fan Mount Screw Holes;
FIG. 17B. Plenum Cooling Tube Orifice Interface from Plenum Side;
31. Stanchion Landing;
30. Stanchion Tab;
32. Orifice
FIG. 17C. Side View.
FIG. 17D. Fan Mount, Side View
FIG. 17E. Fan Mount Top View
FIG. 17F. Fan Mount, Alternate Side View
FIGS. 18A-18F. Top Release Enclosure: Non-Bezeled, Molded Main Cavity
FIG. 18A. Top View;
12. Guide Tube: Top View and Side View;
FIG. 18B. Side View
FIG. 18C. Bezel Backing Plate,
45. Front View. Standoff
FIG. 18D. Bezel Backing Plate, Side View
FIG. 18E. PC Board, Front View
FIG. 18F. PC Board,
44. Side View
Retaining Screw
FIGS. 19A-19K. Top Release Enclosure: Cage Assembly
FIG. 19A. Six Segment Chassis Assembly: Top View
FIG. 19B. Chassis Cage: Single Side: Top View.
37. Inward Travel Limiting Tang (60 degree shown)
FIG. 19C. Chassis Cage: Single Side: Front View
38. Pivot Pin
39. Pivot Pin Receiver and Washer
40. Band Strap (tabbed/screwed/bolted)
FIG. 19D. Cross Brace: Side View
41. Cross Brace: Side View: Installed
42. Channel
43. Bolt/screw hold-down holes
44. Bolt
FIG. 19E. Cross Brace: Top View
FIG. 19F. PC Board Tray/Mounting or Backing Plate
44. Bolt
45. Standoff/Washer
FIG. 19G. Side View
FIG. 19H. Single Segment Cross Enclosure Chassis Cage
FIG. 19I. Three Segment Triangle Enclosure Chassis Cage
FIG. 19J. Four Segment Rectangle Enclosure Chassis Cage
FIG. 19K. Six Segment Rectangle Enclosure Chassis
FIGS. 20A-20F. Cage. Top Release Enclosure: Exhaust Plenum
FIG. 20A. Top View
3. Stanchion Guide Hole;
29. Fan Mount Screw Holes;
FIG. 20B. Plenum Cooling Tube Orifice Interface from Plenum Side
31. Stanchion Seat;
32. Orifice;
30. Stanchion Tab;
9. Cable Gripper™ (or functional equivalent).
FIG. 20C. Side View:
FIG. 20D. Fan Mount, Side View
FIG. 20E. Fan Mount Top View
FIG. 20F. Fan Mount, Alternate Side View
FIG. 21A. Top Release Enclosure: Cable Assembly
FIG. 21A. Assembly
5. Clevis Pin Assembly or equivalent functioning hardware, example: strap eye end;
6. Cable;
11. Bottom Plenum Wall
12. Guide Tube
13. Top Plenum Wall
8. Neoprene or equivalent vibration absorbing washer 17. Actuator Plate Cable Gripper™ (or functional equivalent) Guide
9. Cable Gripper™ (or functional equivalent)
10. Neoprene or equivalent vibration absorbing washer
61. Top End Cap Wall
14. Eye
FIGS. 22A-22K. Top Release Enclosure: Connector Bay End Cap Single Fan Center Knockouts and Three-Way Armature Central Actuator Support.
FIG. 22A. Top View:
1. Stress relief feed through, grommet, hermetic seal, etc. for wire/cable/pipe;
2. Cooling Tube Hose Assembly ¼ Turn Twist Lock or other standard or special order seal pending usage;
FIG. 22B. Side View
FIG. 22C. Standard Blank Bezel: Top View;
FIG. 22D. Standard Blank Bezel: Front View
FIG. 22E. Standard Blank Bezel: Side View;
FIG. 22F. Connector Bay Bezels With/With Out Knock Outs/Plugs: Top View;
FIG. 22G. Connector Bay Bezels With/With Out Knock Outs/Plugs: Front View;
FIG. 22H. Connector Bay Bezels With/With Out Knock Outs/Plugs: Side View;
FIG. 22I. Corner Gusseted Screen Fan Guard With Center Grommet For Single Fan, Side View
FIG. 22J. Top and Bottom View FIG. 22K. Screen Fan Guard-Fan-Screen Fan Guard Sandwich Top Release Enclosure:
  FIGS. 23A-23C. Actuator Assembly
  FIG. 23A. Actuator Plate: Top View
  FIG. 23B. Actuator Plate: Side View
  FIG. 23C. Actuator Assembly: Side View
  56. Short Actuator
  Rod 19. Cotter Pin
  23. Actuator Plate
  24. Nut
  57. Short Actuator Tube
  24. Nut
  61. Top End Cap Wall
  24. Nut
  27.
  Handle
  FIG. 24A. Bottom Release Enclosure: Stanchion Assembly.
  FIG. 24A. Assembly
  48. Crimped-On Rod End;
  49. "C" Washer Seat;
  50. Metal Rod;
  51. Crimped-On Threaded Rod End;
  52. Washer;
  53. Nut;
  FIGS. 25A-25G. Top And Bottom Release Enclosure: Cooling Tube Sleeves;
  FIG. 25A. Module Top View with Cooling Tube Assembly;
  FIG. 25B. Cooling Tube Orifice; Side View;
  FIG. 25C. Slit Solid Cooling Tube Sleeve Outlet/Inlet;
  FIG. 25D. Optional Cooling Tube Downward Facing Intake Louver Grid;
  FIG. 25E. Optional Cooling Tube Upward Facing Exhaust Louver Grid;
  FIG. 25F. Louvered Cooling Tube Sleeve Outlet/Inlet;
  FIG. 25G. Cooling Tube Sleeve Orifice Interface
  FIGS. 26A-26C. Top Release Enclosure: Collapsible Cooling Tube and Standoff.
  FIG. 26A. Collapsible Cooling Tube
  54. Female ¼ Turn Twist Lock Tubular Collar Seal;
  55. Male ¼ Turn Twist Lock Tubular Collar Seal;
  56. Threaded Tubular Hose Collar Seal;
  57. Spring Loaded Collapsible Hose.
  FIG. 26B. Cooling Tube Petcock
  FIG. 26C. Cooling Tube Elbow
  FIG. 27A. Top or Bottom End Cap Cable Hanger Assembly: For Top or Bottom Release Enclosures;
  FIG. 27A. Hanger Assembly: Perspective View
  58. Outer Collar
  59. Pin
  60. Clevis
  61. Tubular Bearing Surface
  62. Cotter Pin
  63. Optional Load Bearing Gusset
  64. Plenum Intake/Exhaust Hull
  65. Inner Collar
  66. Hexagon Socket Set Screw With Flat Point
  67. Cable
  68. Cable Termination Hook
  FIGS. 28A-28K. Scalable Single Base: For Top or Bottom Release Enclosure
  FIG. 28A. Base: Connector Bay and Wiring/Coolant Master Plenum Sub-Assembly: Top View
  69. End Cap Cable Hanger Assembly
  FIG. 28B. Base: Connector Bay: Side View: Internal Perspective View
  FIG. 28C. Base: Connector Bay: Internal Perspective View
  FIG. 28D. Base: Wiring/Coolant Master Plenum Feed Through,
  29. Tabs Up
  31. Orifice
  30. Seats Down
  FIG. 28E. Base: Wiring/Coolant Master Plenum Feed Through, 30. Tabs Down,
  31. Orifice
  29. Seats
  Up
  FIG. 28F. Base: Connector Bay and Wiring/Coolant Master Plenum Sub-Assembly: Side View
  FIG. 28G. Base: Connector Bay and Wiring/Coolant Master Plenum Sleeve: Side View
  FIG. 28H. Base: Connector Bay and Wiring/Coolant Master Plenum Twist-Lock Assembly and Landings: Side View
  FIG. 28I. Base: Connector Bay and Wiring/Coolant
    Master Plenum Bulk Head With Feed Thrus: Side View
  FIG. 28J. Base: Connector Bay and Wiring/Coolant Master Plenum Sub-Assembly: Side View
  FIG. 28K. Full Assembly: Side View
  FIGS. 29A-29B. Exhaust Plenum Canisters for Cable Gripper™ (or functional equivalent)
  FIG. 29A. Threaded Petcock Design.
  70. Wrench Sealing Purchase
  71. Cable Feed Through;
  72. Twist Lock Collar;
  FIG. 29B. Internally Threaded Cap Design
  70. Wrench Sealing Purchase
  71. Cable Feed Through;
  72. Twist Lock Collar;
  FIGS. 30A-30E. Exhaust Plenum Actuator Assembly.
  FIG. 30A. Actuator Plate and Handle: Top View
  73. Exhaust Plenum Actuator Plate;
  74. Cable Gripper™ (or functional equivalent) Canister Twist Lock Receiver;
  FIG. 30B. Actuator Plate: Side View.
  73. Exhaust Plenum Actuator Plate;
  FIG. 30C. Exhaust Plenum Cable Gripper™ (or functional equivalent) Canister with Petcock;
  9. Cable Gripper™ (or functional equivalent).
  72. Twist Lock Collar
  FIG. 30D. Exhaust Plenum Cable Gripper™ (or functional equivalent) Canister with Cap;
  9. Cable gripper (or functional equivalent)
  72. Twist Lock Collar
  FIG. 30E. Assembly
  75. Actuator Rod.
  19. Cotter Pin.
  22. Large Spring Collar.
  21. Spring.
  20. Small Spring Collar.
  76. End Cap Wall Handle Lock Seating Divot.
  77. Handle Lock Male Divot.
  28. Handle.
  FIGS. 31A-31J. Scalable Single Exhaust Plenum Cap, Wiring/Cable/Plumbing (Coolant, Gravity Feed, pumped, etc.) Connector Bay and Cable Hanger Assembly: For Top or Bottom Release Enclosure
  FIG. 31A. Cap: Wiring/Coolant Master Plenum Sub-Assembly: Top View
  FIG. 31B. Cap: Wiring/Coolant Master Plenum Bulk Head With Feed Throughs Installed: Internal Perspective Side View FIG. 31C. Cap: Connector Bay with Cable Gripper™ (or functional equivalent) and Actuator Installed: Side View FIG. 31D. Cap: Wiring/Coolant Master Plenum Feed Through, Tabs Up, Seats Down FIG. 31E. Cap: Wiring/Coolant Master Plenum Feed Through,
29. Tabs Down,
31. Orifice
30. Seats Up FIG. 31F. Cap: Connector Bay: Top View FIG. 31G. Cap: Connector Bay Floor Wall With Wiring/Cooling Feed Throughs, Internal Perspective Side View;

FIG. 31H. Cap: Connector Bay and Wiring/Coolant Master Plenum Twist-Lock Assembly and Landings: Internal Perspective Side View FIG. 31I. Cap: Connector Bay and Wiring/Coolant Master Plenum Twist-Lock Assembly and Landings: Side View FIG. 31J. Cap: Full Connector Bay and Wiring/Coolant Master Plenum Assembly: Side View FIGS. 32A-32C. Module Hanger.
FIGS. 33A-33H. Double Ended Hook
FIG. 33A. Single Side Protrusions, Front View.
79. Protrusion.
FIG. 33B. Single Side Protrusions, Side View.
FIG. 33C. Alternating Side Protrusions, Front View.
FIG. 33D. Alternating Side Protrusions, Side View.
FIG. 33E. 90 Degree Twist, Front View.
FIG. 33F. 90 Degree Twist, Side View.
FIG. 33G. Double Hook with Swivel, Front View
FIG. 33H. Double Hook with Swivel, Side View
FIGS. 34A-34B. Track Systems
FIG. 34A. Track and Roller
FIG. 34B. Rack and Internally Wound Cog Motor
FIGS. 35A-35D. Module with Installed Module Hanger Hanging from Roller On Sliding Track.
FIG. 35A. Sliding Track and Roller
FIG. 35B. Module Hanger
FIG. 35C. Module
FIG. 35D. Assembly
FIGS. 36A-36B. Single Module Framed Track Suspension System
FIG. 36A. Track and Roller
80. Fastener Hole(s)
FIG. 36B. Module Suspended in Frame by Hanger and Track and Roller System
81. Single Module Frame
82. Fastener, blind (rivet/bolt etc.)
FIG. 37A. Six (6) Modules Symmetrically Interconnected by Module Hangers Suspended In A Frame By Individual Module Hangers with a Central Module Insert.
FIGS. 46A-46D. Five Module Cat Walk Bridge/Wall
FIG. 46A. Top View
FIG. 46B. End View
FIG. 46C. Side View
FIG. 46D. Unit Installed in an 18 Module Chamber/Corridor.
FIGS. 47A-47L. General Inter-module Array Geometries Symbolically Represented
FIG. 47A. General Hexagonal Array FIG. 47B. Vertical Array With/Without Hollow Inner Channel.

FIG. 47C. Horizontal Array With/Without Hollow Inner Channel.

FIG. 47D. Ferris Wheel Carousel Whereby Modules Lie Horizontally.

FIG. 47E. Hanging Vertical Carousel whereby Modules Are Suspended Vertically From Central Support, Top View
99. Central Support FIG. 47F. Torus Array As May Be Used In Space Craft Or Other Facilities.

FIG. 47G. Top View: Vertical Work Area Enclosure
100. Floor
101. Vertical Access Hatch FIG. 47H. Side View: Vertical Work Area Enclosure FIG. 47I. Single Module Population Option for F/G and J/K FIG. 47J. Multi-Module Population Option for F/G and J/K FIG. 47K. Top View: Horizontal Work Area Enclosure
102. Floor
103. Vertical Access Hatch FIG. 47L. Side View: Vertical Work Area FIGS. 48A-48D. Table of Cooling Options.
FIG. 48A. Air
FIG. 48B. Gas
FIG. 48C. Fluid/Air Heat Exchange.
FIG. 48D. Fluid/Gas heat Exchange.

FIGS. 49A-49I illustrates the bottom release enclosure full assembly, optional support structure geometries and plan layouts.

FIG. 49A is an illustration of the top view of the six sided hexagonal asteroid enclosure.

FIG. 49B is an illustration of the symmetric handle, top view.

FIG. 49C is an illustration of the enclosure side view, sight top to left of sheet.

FIG. 49D is an illustration of the optional triangle variant less handle, top view.

FIG. 49E is an illustration of the symbolic build-out from a single equilateral triangle structure to hexagon, square and fractal larger equilateral triangle with implicit nesting and array, top view.

FIG. 49F is an illustration of the example triangle used to complete a square peripherally or otherwise, top view.

FIG. 49G is an illustration of the square approximating tesselation/tiling tile, top view.

FIG. 49H is an illustration of the symbolic build out using square or orthogonal approximations as representative tiling/tesselations approximated with a symbolic array representation, top view.

FIG. 49I is an illustration of the octagonal variation of FIG. 49H, top view.

FIGS. 50A-50C illustrate the palletization top release enclosure.

FIG. 50A is an illustration of the full assembly, top view.

FIG. 50B is an illustration of the symmetrical handle, top view.

FIG. 50C is an illustration of the front view, sight top is left of sheet.

FIGS. 51A-51B illustrate the palletization enclosure base and exhaust plenum matrix array subset layout pattern.

FIG. 51A is an illustration of the top view of palletization enclosure base and exhaust plenum matrix array subset layout pattern.

FIG. 51B is an illustration of the top view of inter-modular surface finish and sculpting.

FIGS. 52A-52I illustrate the palletization scalable single male base/intake plenum for all top or bottom release enclosures.

FIG. 52A is an illustration of the base connector bay, top view.

FIG. 52B is an illustration of the base connector bay, internal perspective view.

FIG. 52C is an illustration of the base connector bay, side view.

FIG. 52D is an illustration of the base wiring/coolant master plenum subassembly:—top view.

FIG. 52E is an illustration of the base: wiring/coolant connector bay master assembly wiring basket, side view.

FIG. 52F is an illustration of the base: wiring/coolant master plenum hose assembly quarter turn locking mechanism and seats panel sub-assembly internal perspective.

FIG. 52G is an illustration of the base: wiring/coolant master plenum feed through sub-assembly internal perspective view.

FIG. 52H is an illustration of the base: connector bay and wiring/coolant master plenum sub-assembly, side view.

FIG. 52I is an illustration of the base: full assembly, side view.

FIGS. 53A-53H illustrate the palletization scalable single exhaust plenum cap, wiring/cable/plumbing (coolant, gravity Feed, pumped, etc.) connector bay and cable hanger assembly; for top or bottom release enclosure (symmetrical @ 120 degrees).

FIG. 53A is an illustration of the cap: wiring/coolant master plenum subassembly top view.

FIG. 53B is an illustration of the cap: wiring/coolant master plenum subassembly internal perspective side view.

FIG. 53C is an illustration of the cap: wiring/coolant master plenum subassembly side view.

FIG. 53D is an illustration of the cap: connector bay cover bottom view.

FIG. 53E is an illustration of the cap: connector bay cover wiring basket feed through panel, internal perspective view.

FIG. 53F is an illustration of the Cap: cap: connector bay cover hose assembly quarter turn locks and seat, side view.

FIG. 53G is an illustration of the cap: connector bay cover sub-assembly, side view.

FIG. 53H is an illustration of the cap: connector bay cover and wiring/coolant master plenum full assembly, side view.

FIG. 54A is an illustration of the hanger assembly.

FIG. 55A is an illustration of the stacking sequence, base plus modules.

FIG. 55B is an illustration of the single stack.

FIG. 55C is an illustration of the stack array.

FIGS. 56A-56D illustrate the palletized single plane radial and symmetrical inter-modular matrices, symbolic representation.

FIG. 56A is an illustration of the module centric single plane inter-module array, symbolic representation.

FIG. 56B is an illustration of the single plane symmetrical inter-module matrix, symbolic representation.

FIG. 56C is an illustration of the asterisk shape (0) overlaid on a 3×3 module array, symbolic representation.

FIG. 56D is an illustration of the single leg variable length spark resistant ball and slotted socket electrical connector.

FIGS. 57A-57E illustrate the palletization master air intake plenum.

FIG. 57A is an illustration of the block diagram top view.

FIG. 57B is an illustration of the block diagram bottom view

FIG. 57C is an illustration of the side view.

FIG. 57D is an illustration of the top view.

FIG. 57E is an illustration of the master air intake plenum with parting lines, side view.

FIGS. 58A-58E illustrate the palletization master pallet air exhaust plenum.

FIG. 58A is an illustration of the top view.

FIG. 58B is an illustration of the bottom view.

FIG. 58C is an illustration of the side view.

FIG. 58D is an illustration of the front view.

FIG. 58E is an illustration of the master air intake plenum with parting lines.

FIGS. 59A-59C illustrates the palletized stackable warehouse pallet with master intake and exhaust plenums installed FIG. 59A is an illustration of the blank pallet with pallet rack corner mount shown, side mount obvious, perspective view.

FIG. 59B is an illustration of (bottom) master intake and (top) master exhaust plenums, perspective view.

FIG. 59C is an illustration of the palletized master plenums installed, perspective view.

FIG. 61A is an illustration of the module base stacked order, front view.

FIG. 61B is an illustration of the single stack assembly, front view.

FIG. 61C is an illustration of the stack array, front view.

FIG. 61D is an illustration of the palletized and dollied master cooling assembly being populated with module, perspective view.

FIGS. 62A-62F illustrate the palletized dolly shelf bed and supports, slotted cable guide and conduit whip.

FIG. 62A is an illustration of the shelf bed.

FIG. 62B is an illustration of the castellated cross brace with cable guide, top view.

FIG. 62C is an illustration of the slotted support beams.

FIG. 62D is an illustration of the central longitudinally slotted cable guide, shelf base assembly, top view.

FIG. 62E is an illustration of the block diagram of the 180 degree arc cable conduit whip.

FIG. 62F is an illustration of the block diagram of the industrial warehouse mezzanine shelving, block diagram, front view.

FIGS. 63A-63C illustrate the Palletized scalable computer/router farm utilizing standard-industrial warehouse shelving with mezzanine option above single floor installations for pre-existent warehouse space build out and new construction steel building with integrated industrial walls and roofing.

FIG. 63A is an illustration of the modular stack (top and bottom arrows represent data connections, (cables/wires/ethernet/fiber optic/etc.), front view.

FIG. 63B is an illustration of the dollied stack racked pallet(s) with installed intake (bottom)/exhaust (top) coolant/wiring/stack suspension master plenums, perspective view.

FIG. 63C is an illustration of the symbolic standard industrial warehouse shelving for population by dollied and palletized modules, block diagram, front view.

FIGS. 64A-64E illustrate the palletized shelf level drawbridge assembly.

FIG. 64A is an illustration of the drawbridge.

FIG. 64B is an illustration of the drawbridge hinge.

FIG. 64C is an illustration of the drawbridge symmetrical pivot rod (side and end views).

FIG. 64D is an illustration of the shelving top view (symbolic)

FIG. 64E is an illustration of the shelving front view (symbolic).

FIGS. 65A-65D are Table 1: Symbolic Block Diagram Cooling Systems (Air/Gas/Fluid).

DETAILED DESCRIPTION OF THE INVENTION

Figure 3A:
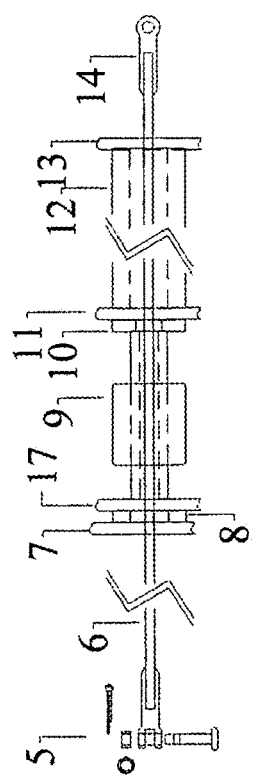
FIG. 3A. Bottom Release Enclosure: Cable Gripper™ (or functional equivalent) Assembly
 FIG. 3A. Assembly
 5. Clevis Pin Assembly or equivalent functioning hardware, example: strap eye end
 6. Cable
 7. Bottom End Cap Wall
 8. Vibration Absorbing Washer, Neoprene or equivalent
  17. Actuator Plate Cable Gripper™ (or functional equivalent) Guide
 9. Cable Gripper™ (or functional equivalent)
 10. Neoprene or equivalent vibration absorbing washer
 11. Bottom Plenum Wall
 12. Guide Tube
 13. Top Plenum Wall
 14. Eye
FIGS. 4A-4B. Bottom Release Enclosure: Bottom Cable Gripper Actuator Assembly Actuator Plate
 FIG. 4A. Actuator Plate
  16. Actuator Plate Cable Gripper™ (or functional equivalent) Landing
  17. Actuator Plate Cable Gripper™ (or functional equivalent) Guide
 FIG. 4B. Bottom Actuator Assembly
  18. Actuator Rod
  19. Cotter Pin
  20. Small Spring Collar
  21. Spring
  22. Large Spring Collar
  23. Actuator Plate
  24. Nut
  25. Lock Washer
  26. Washer
  7. Bottom Plenum Wall 27. Actuator Tube
11. Top Plenum-Bottom Wall Handle
FIGS. 5A-5F. Bottom Release Enclosure: Coolant Intake Plenum
  FIG. 5A. Top View
  3. Stanchion Guide Hole;
  29. Fan Mount Screw Holes.
Figure 21A:
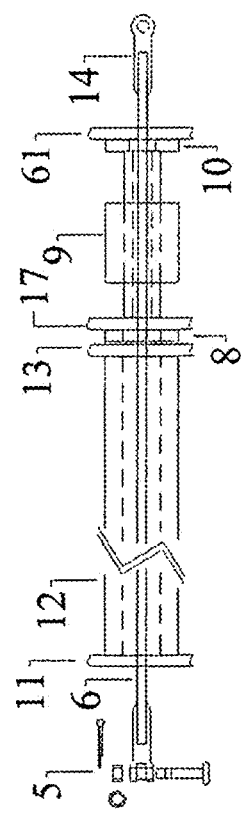
Figure 32C:
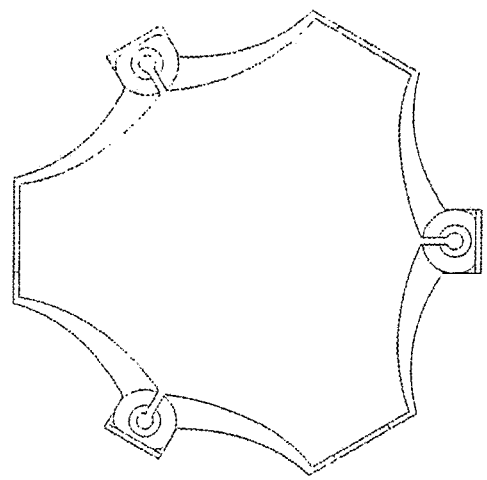
FIG. 32C. Front View with All Tabs Broken.
Figure 32B:
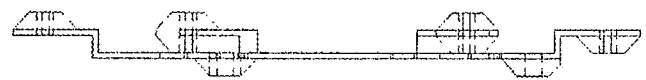
FIG. 32B. Side View.
Figure 32A:
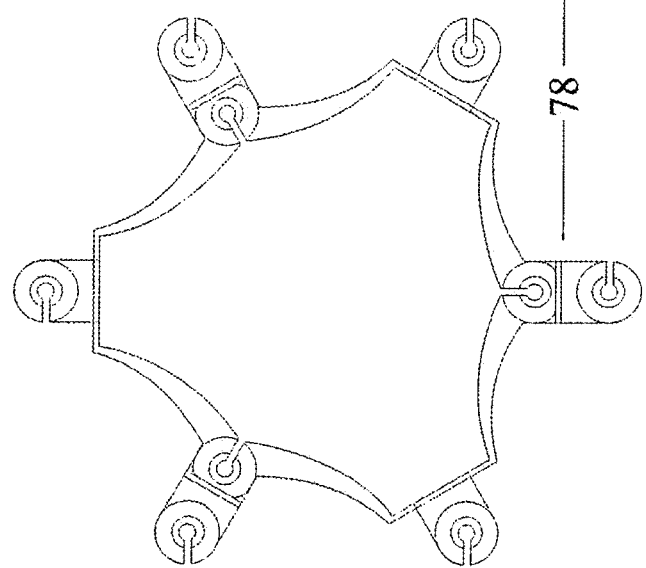
FIG. 32A. Front View.
78. Tab Break Points.
Figure 34B:
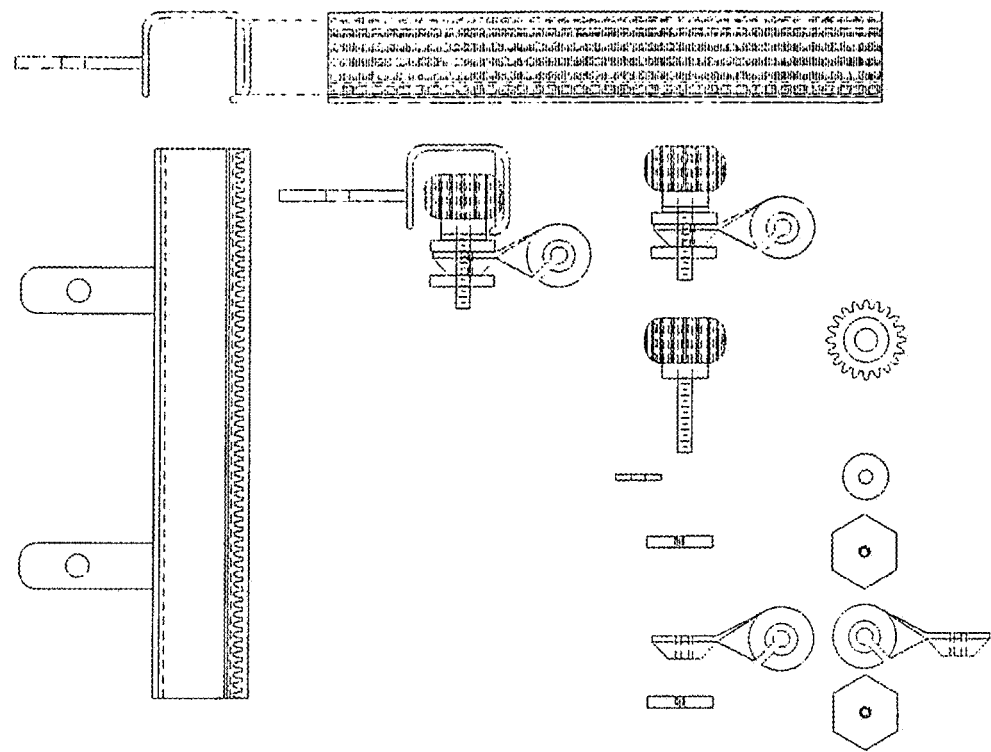
Figure 34A:
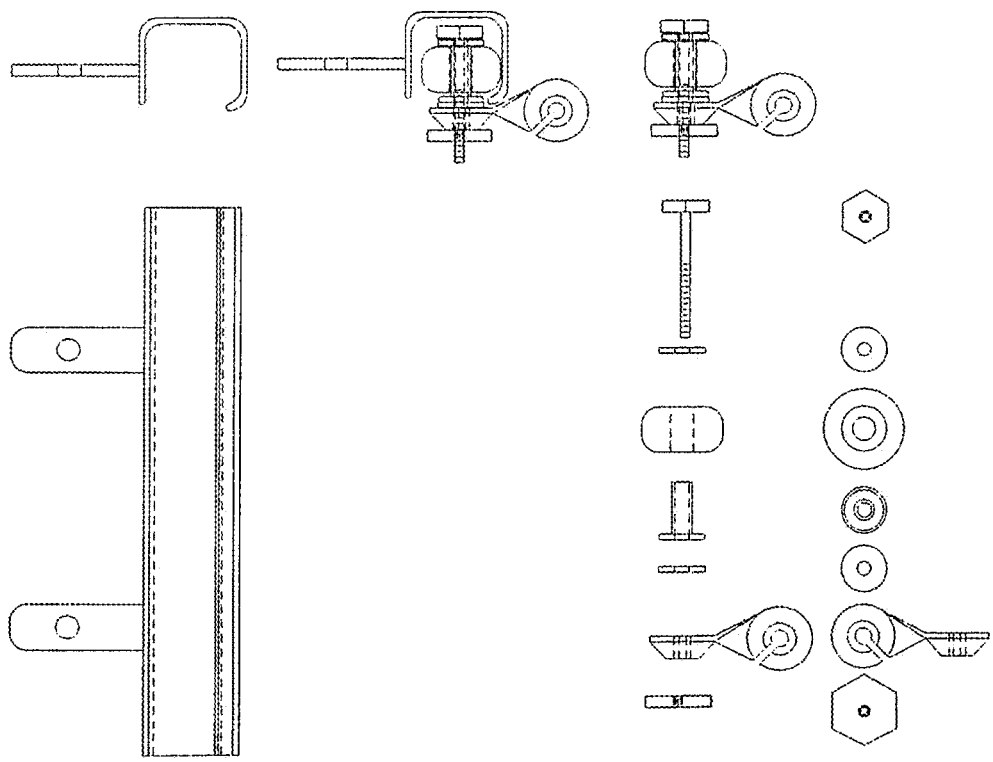
Figure 37A:
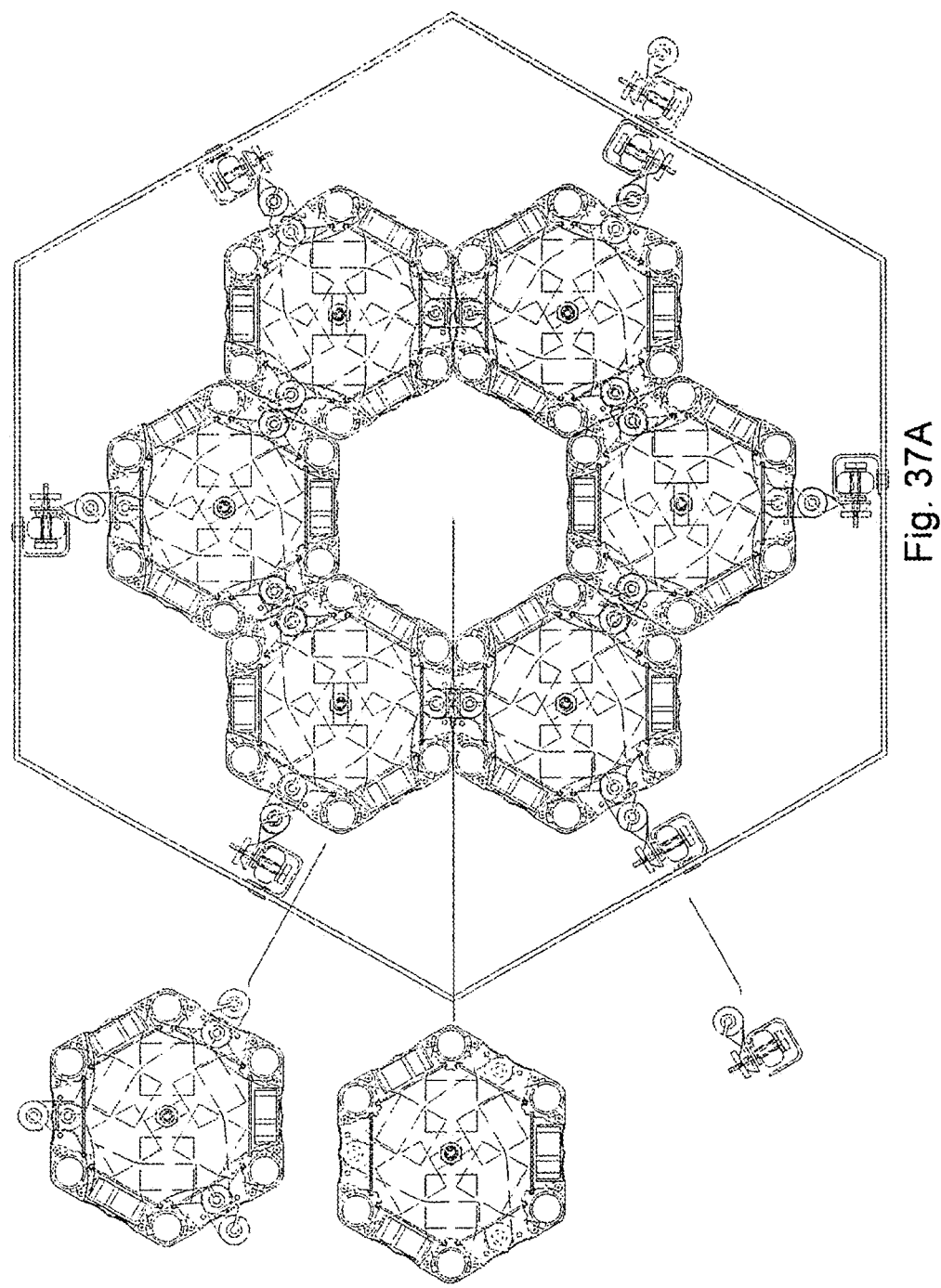
FIG. 37A. Assembly
FIGS. 38A-38F. Nesting Modules
FIG. 38A. Module with Module Hanger
FIG. 38B. Six Modules Interconnected by Module Hangers
FIG. 38C. Module without Module Hanger
FIG. 38D. Six Modules in A Symmetrical Array Without Hangers
FIG. 38E. 12 Modules in A Symmetrical Array With Hangers
FIG. 38F. 18 Modules in A Symmetrical Array With Hangers
FIGS. 39A-39D. Interlocking Sextet Module Arrays
FIG. 39A. Module Hanger with Track and Roller
FIG. 39B. Module
FIG. 39C. Six Modules in A Symmetrical Array With Hangers
FIG. 39D. "Snow Flake" Array with Hangers
FIGS. 40A-40C. Single/Multi-Module Horizontal or Vertical Hydraulic Lift System
FIG. 40A. Hydraulic Lift System
83. Guide Rails
84. Floor Mount and Support Collar
85. Hydraulic Lift Cylinder
86. Master Plenum(s) Support Pedestal
87. Plunger
88. Controller
89. Hydraulic Fluid Tank, Pump and Valves
90. Multi-Module Frame
91. Rack with Gear Driven Stepping Motor
92. Fastener
FIG. 40B. Single Module Cog Rail System
FIG. 40C. Multiple Module Cog Rail System
FIGS. 41A-41F. Top End Cap Cover
FIG. 41A. Top End Cap Cover, Top View
FIG. 41B. Top End Cap Cover, Side View
FIG. 41C. Top End Cap Cover Sleeve, Bottom View
FIG. 41D. Top End Cap Cover Sleeve, Side View
FIG. 41E. Top End Cap Cover Assembly
FIG. 41F. Top End Cap Which Sleeve Slips Inside
FIGS. 42A-42F. Top End Cap Cover Upholstery
FIG. 42A. Top End Cap Cover, Top View
FIG. 42B. Top End Cap Cover, Side View
FIG. 42C. Top End Cap Cover Sleeve, Top View
93. Recessed Upholstery Retaining Screw Hole
94. Screw
FIG. 42D. Top End Cap Cover Sleeve, Side View
FIG. 42E. Top End Cap Cover, Side View
FIG. 42F. Upholstery
95. Elasticized Material
96. Grommet
97. Material Mounting Tab
98. Padding
FIGS. 43A-43C. Module Protective Side Cover with Integral Clip
FIG. 43A. Top View
FIG. 43B. End View
FIG. 43C. Side View
FIGS. 44A-44E. Module Protective Side Cover with Integral Clip Install Positioning
FIG. 44A. End View
FIG. 44B. Top View
FIG. 44C. Side View
FIG. 44D. Module End View
FIG. 44E. Module Side View
FIGS. 45A-45D. Three Module Cat Walk Bridge/Wall
FIG. 45A. End-View
FIG. 45B. Side View
FIG. 45C. Front View
FIG. 45D. Unit Installed in a 12 Module Chamber/Corridor.
Figures 39A, 39B, 39C, 39D:
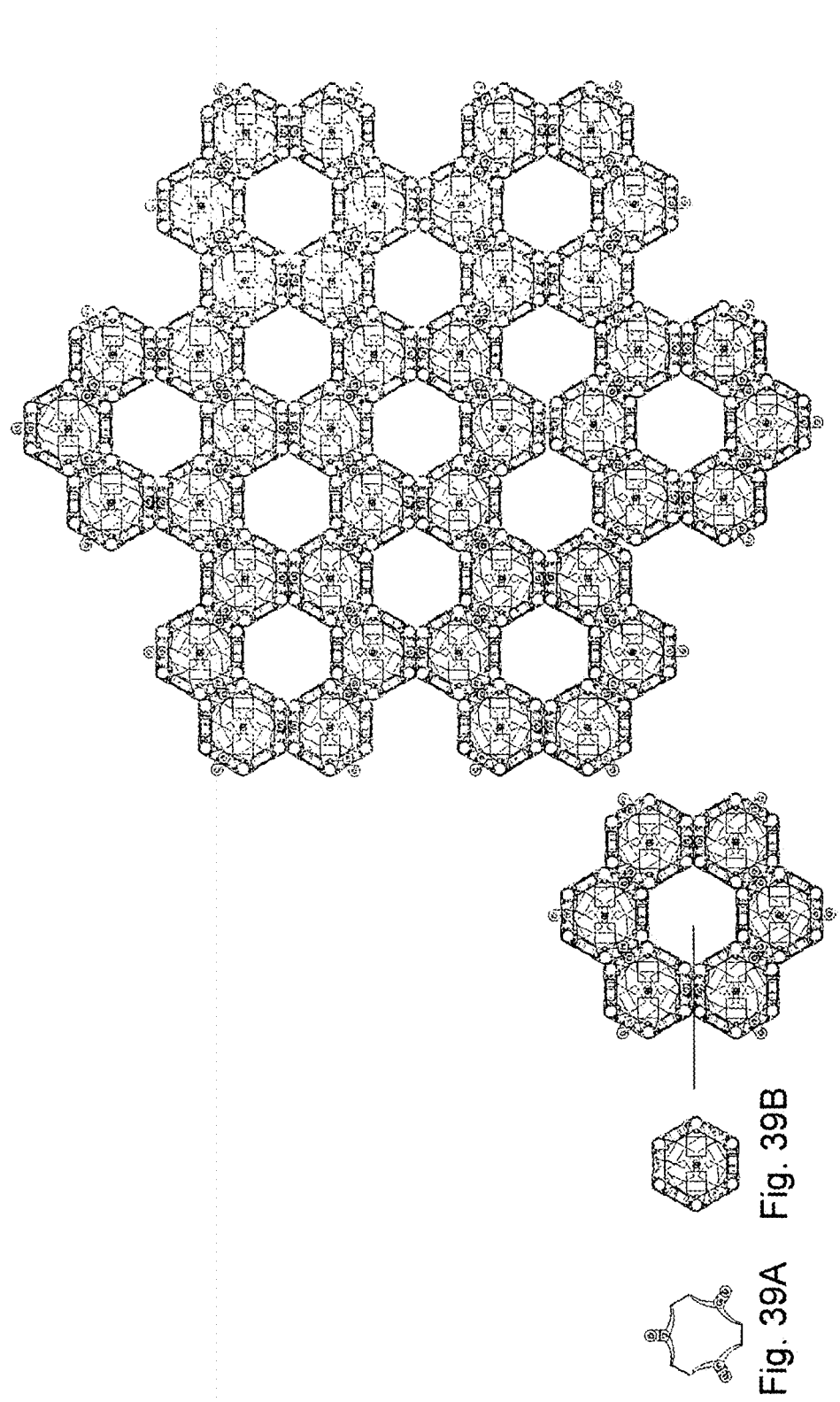

The invention employs a unique geometry, utilizing four standard configurations (Type 1: FIGS. 1A-1I, Type 2: FIGS. 15A-15C Type 3: Same as Type 2 with actuator from FIGS. 30A-30E as installed in FIG. 31B and will otherwise be considered as minor variant of Type 2 hereinafter) with attendant support accessories. A nominal fourth type supplies variants for each of types 1 through 3 by utilizing a large central orifice, as shown in FIGS. 16A-16K, in the top and bottom end caps with appropriately sized fan mountings and optional fans for axial cooling, thus obviating the conventional plenums used in the standard type 1 through 3 modules. All enclosure types include provisions for optional cable assemblies and cable Gripper™ (or functional equivalent(s)) (Type 1: FIG. 3A, Type 2: FIG. 21A) for vertical/horizontal positioning in their respective multi-module stacks. All types employ a handle connected to a plunger mounted in a plunger guide tube with associated bulkhead mounting hardware (Type 1: FIGS. 4A-4B, Type 2: FIGS. 23A-23C). On the business end of the plunger is a cable Gripper™ (or functional equivalent) actuator plate with sloped self-centering seats for the cable Gripper™ (or functional equivalent) (Type 1: FIG. 4A, Type 2: FIG. 23A). Return/centering springs for the plunger as necessary and plate retention nuts and/or a cotter pin keep the plate on the plunger. The two configurations are referred to hereinafter as types as follows:

Type 1 (FIGS. 1A-1I), Top handle, bottom of enclosure actuated cable Gripper™ (or functional equivalent) assembly, with a central actuator rod through the main enclosure assembly and cable Gripper™ or functional equivalent seated peripherally, centered tangentially between every other asteroidal curve in the lower plenum, and threaded with cables terminated at either end with devises and matching clevis pins or other equivalent catalog quick disconnect hardware (FIGS. 4A-4B). Cable guide tubes (FIGS. 8A-8F, part 12) run the length FIG. 8B width of part 36. of the bezeled (Type 1: FIG. 8A part 12) and/or non-bezeled enclosure, FIG. 18B width of part 36, main cavity outer hull (FIG. 18A part 12) nesting between the normally bottom intake plenum (FIGS. 5A-5F) and normally top exhaust plenum (Type 1: FIGS. 10A-10F). The guide tubes accommodate the width of this quick disconnect hardware their full length, without snagging. Cable Gripper™ (or functional equivalent) in this type are placed in the bottom plenum. The Type 1 design is for PC boards and other assemblies smaller than the ATX form factor, although scaling is possible.

Type 2 (FIGS. 15A-15C), Top handle, top of enclosure actuated (FIG. 15C) cable Gripper™ (or functional equivalent) assembly (FIG. 21A) with central actuator assembly (FIG. 23C) seated in the top end cap, extending into the main chamber where the plunger actuator plate resides. Material choices include reinforced wire, fiberglass, carbon composite, etc. for strength and wide screen mesh as necessary for airflow. The cable Gripper™ (or functional equivalent) are seated peripherally, in the exhaust plenum to the right of each duct at 120 degrees (example of hexagonal, one configuration) one to the other, centered almost tangentially to the nearest outer wall between the cooling tube housings seated behind each chamfered asteroidal apex of the outer hull in the upper plenum (FIGS. 20A-20F) and threaded with cables terminated at either end with clevises and matching clevis pins or equivalent quick disconnect hardware (FIG. 21A). Three cable guide tubes (FIGS. 25A-25G) (hexagonal example) run the length of the non-bezeled enclosure central cavity (FIG. 18A part 12 for the width of FIG. 18B) between the bottom intake plenum (FIGS. 17A-17F) and top exhaust plenum (FIGS. 20A-20F) up to the actuator plate on the bottom side and down to the top cable Gripper™ (or functional equivalent) seats. These tubes accommodate the width of this quick disconnect hardware for their full length without snagging. This design is for ATX PC boards or larger assemblies, requiring a larger open cavity, however, again the design is scalable. All types, top, bottom and main cavity cable gripper assemblies include an actuator plate, plunger, and handle assembly with optional twist handle lock and release, tensioning springs, cable guide tubes.

The invention is an apparatus and method designed non-exclusively for usage from single enclosure/module to molecular scale and scalable to massively parallel router, server, super computer/server/router/process control and/or machine farms for optimizing: efficient positioning, connection, repair, replacement, space utilization, thermal management, propagation path length and timing for signaling and data transfer. In the following description numerous details are put forth to more thoroughly describe the invention. It is apparent, however to one skilled in the art, that the invention may be practiced without these specific details. In other instances, well known features have not been described in detail so as to not obscure the invention.

FIGS. 49A-49I Illustrate the bottom release enclosure full assembly, optional support structure geometries and plan layouts.

The invention provides near universal standardized form factors for macroscopic packaging by employing approximated tessellations/filings. Module scale, layout and nesting are dictated by components including optional retractable interconnects with or without quick disconnects, bezels, patch panels, backing and mounting plates and pc boards with external side wall wire and cable guides and end cap interconnection baskets and covers. These features, conjunct (sub) module hull to (sub-) module hull sliding fit and combined with suspension cabling, cable grippers and support hardware and guides make the system.

The invention provides integration/migration from a single module to massively parallel router, server, supercomputer or other technology based machine/process and super-computing/server/router farms. This is accomplished by enhancing command, data, and/or process and/or sensor communication by minimizing and standardizing path lengths for these functions within and without (sub-) module to (sub-) module vertex to vertex, flat to flat and end cap to end cap overall lengths and inter-module sliding-fit interconnect lengths. Examples in this environment include module and nested module active and passive hydraulic, fluidic, electrical, optical, nanotech and quantum components and their associated mechanical, electrical, optical, wave or particle propagation lengths, impedances and capacitances with associated circuitry, which dictate absolute circuit speeds. Fiber optics has similar limits, which may be boiled down to media propagation speed.

Separately, hoses and other materials process-supply mechanisms will be similarly limited by speeds, feed rates and flow rates. The same is true for all analog or digital data transfer, and their DAC, ADC, transducers and their support circuitry.

For human touch and FCC compliance, the module hull, end basket cover, and handle are internally and/or externally coated or infused with EM and/or RF conductive and/or insulative material or shielding, with or without reinforcing frequency dependent mesh(-es) as necessary or for Tempest and anti-EMP applications. This is also done where waveguides are formed by sliding-fit inter-module hull interfaces. Frequency appropriate absorptive and/or anti-reflective coatings are used beyond the delineated edges of open wave-guide and/or optical light guides with coatings for the operative radiation being used as part of the external hull.

FIG. 49A is an illustration of the top view of the six sided hexagonal/asteroid enclosure.

FIG. 49B is an illustration of the symmetric handle, top view.

FIG. 49C is an illustration of the type 2 enclosure/module side view, sight top to left of sheet.

FIG. 49D is an illustration of the optional triangle variant less handle, top view.

FIG. 49E is an illustration of the symbolic build-out from a single equilateral triangle structure to hexagon, square and fractal larger equilateral triangle with implicit nesting and array, top view.

FIG. 49F is an illustration of the example triangle used to complete a square peripherally or otherwise, top view.

FIG. 49G is an illustration of the square approximating tesselation/tiling tile, top view.

FIG. 49H is an illustration of the symbolic build out using square or orthogonal approximations as representative tiling/tessellations approximated with a symbolic array representation, top view.

FIG. 49I is an illustration of the octagonal variation of FIG. 49H, top view.

FIGS. 50A-50C illustrate the palletization top release enclosure.

FIGS. 51A-51B illustrate the palletization enclosure base and exhaust plenum matrix array subset layout pattern.

FIG. 51A is an illustration of the top view of palletization enclosure base and exhaust plenum matrix array subset layout pattern where two conjoining multiple modules (part 610), with an unpopulated intake plenum (part 620) and un-populated exhaust plenum (part 630).

FIG. 51B part 660 shows inter-modular interface surface finish and sculpting. Two such surfaces in inter-modular contact as shown, make wire guides as listed in the drawings' figure descriptions.

FIG. 51B parts 640 and 650 show single/multi-cavity inter-modular surfaces making up a guide, with a central cavity, when matched to an abutting module with landings and sliding EMI/RFI 0-gasketry while end caps complete such cavities with appropriate access mounts and gasketry, pending technology employed, as shown symbolically in parts 680, 690 and 700 on each horizontal face or mix and match is possible.

Inter-module interface sides must be recessed the width of the full cavity enclosures plus the tolerance for a sliding fit. This recess with or without keys and keyways must have landings and stops for guide 21 retention. Bottom stops must have matching top/stops on abutting modules.

Combo Units are allowed and are shown symbolically as parts 710[-], 720 and 730 with outward faces 640, 650, 660 and 670. Parts 640, 650, 660, 670, 680, 690, 700, 710, 720 and 730 are made out of solid metal and/or plastics and/or composites or combinations thereof with/without absorptive/coating, reflective coating overlay and/or gasketry. Gasketry includes Mu-metal, EMI field conductive material (copper, iron, carbon, silver, gold, nickel, beryllium copper, impregnated geVsilicone, o-rings, mesh, or other materials, etc. Outlying or abutting areas and/or the remainder of adjoining internal or external areas are coated with applicable radiation/energy absorbing materials as necessary, obviating the necessity of a full seal in some instances, while allowing looser tolerances in a sliding fit without cross-talk or other interference from nearby or neighboring guides. Actual geometry may vary pending frequency, energy, collimation, polarization and/or propagation mode(s) and includes standard and/or special-order catalog and/or by design items. Cables used in such embodiments must not be conductive or have unacceptable parasitic resonance characteristics for the energy spectrum and/or radiation characteristics to be used.

FIGS. 52A-52I illustrate the palletization scalable single male baseAntake plenum for all top or bottom release enclosures upon which a module/enclosure may be seated. The area between the outside of the three (3) individual intake ducts, where the ducts' curve as they slope down toward the fan intakes is the area for pass through wiring, cabling, plumbing, and other standard and common non-thermal management connections, etc. Seals may be upgraded to be hermetic, explosion-proof and/or degassed pending usage.

FIG. 52A is an illustration of the base connector bay, top view.

FIG. 52B is an illustration of the base connector bay, internal perspective view.

FIG. 52C is an illustration of the base connector bay, side view.

FIG. 52D is an illustration of the base wiring/coolant master plenum subassembly, top view.

FIG. 52E is an illustration of the base: wiring/coolant connector bay master assembly wiring basket, side view.

FIG. 52F is an illustration of the base: wiring/coolant master plenum hose assembly quarter turn locking mechanism and seats panel sub-assembly internal perspective.

FIG. 52G is an illustration of the base: wiring/coolant master plenum feed through sub-assembly internal perspective view.

FIG. 52H is an illustration of the base: connector bay and wiring/coolant master plenum sub-assembly, side view.

FIG. 52I is an illustration of the base: full assembly, side view.

FIGS. 53A-53H illustrate the palletization scalable single exhaust plenum cap/wiring basket cover for wiring/cable/plumbing (coolant, gravity Feed, pumped, etc.) connector bay and cable hanger assembly; for top or bottom release enclosure (symmetrical @ 120 degrees).
The area abutting the outside of the plenum's three (3) individual intake ducts, where the ducts' curve as they slope down toward the fan intakes is the area for pass-through wiring, cabling, plumbing, and other non-thermal management connections, etc.

Seals may be upgraded to be hermetic, explosion-proof and/or degassed pending usage.

Figure 54A:
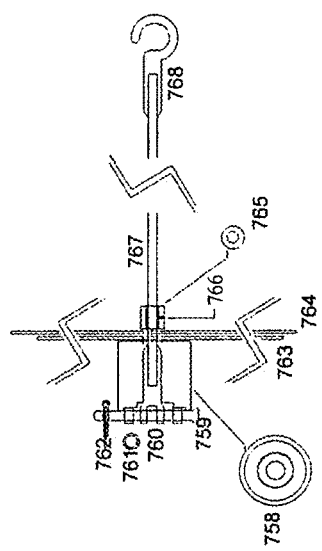
FIG. 54A illustrates the palletization base and cap cable hanger assembly scalable single base for top or bottom release enclosure, connector bay.

FIG. 54A is an illustration of the module hanger assembly, incorporated by reference as used in top and bottom master exhaust and intake plenums with cable assemblies for stack alignment in palletized module arrays.

The assembly parts in order are:
758. Outer collar;
759. Pin;
761. Clevis;
760. Tubular bearing surface; 762 Cotter Pin;
763. Optional heavy load gusset;
764. Plenum intake/exhaust hull;
765. Inner collar;
766. Hexagon socket set screw with flat point;
767. Cable; and
768. Cable termination hook.

Figure 55C:
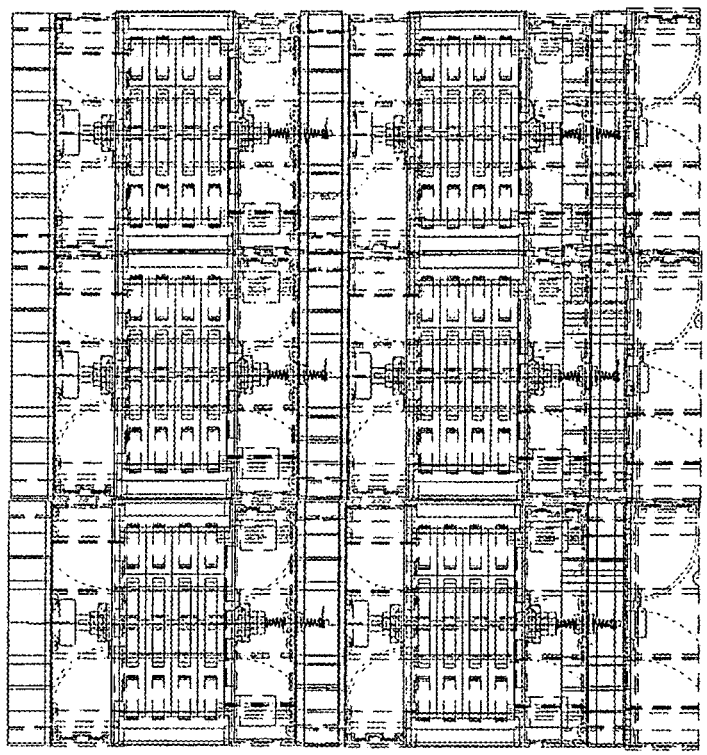
FIGS. 55A-55C illustrate the palletization enclosure base unit 2D matrix array stacking.
Figure 55B:
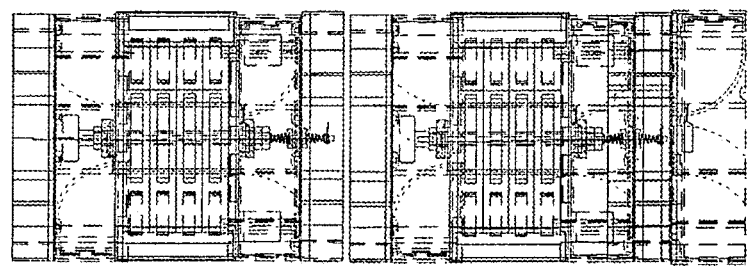
Figure 55A:
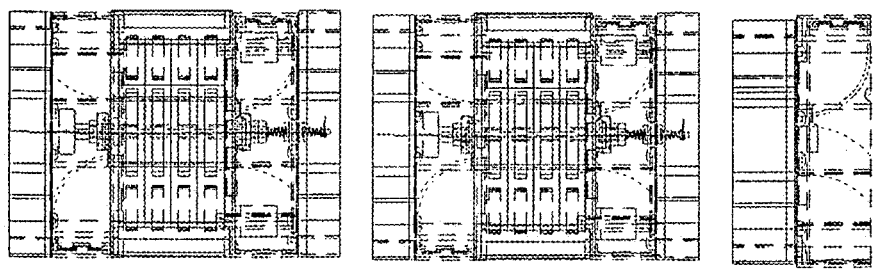

FIG. 55A-55C illustrates the palletization enclosure base unit 2D matrix array stacking.

FIG. 55A shows the alignment of a base unit, and two modules. FIG. 55B shows two modules stacked on a base.

FIG. 55C shows single stack assemblies further aggregated into a row array.

FIGS. 56A-56D illustrate the palletized single plane radial and symmetrical inter-modular matrices, symbolic representation. The approximated hexagon shape is assumed herein as follows by way of example. Processors may pipeline, stream and/or be cluster-centric or combinations thereof regarding communication channels as represented at the pallet level and/or any other multi-module "center of mass".

Accordingly, single modules (for non-polling systems) and three module sets (for polling systems) on center lines corresponding to the six (6) directions of the x-y-z planes and their corresponding diagonals and/or the hexagonal functional equivalent, six (6) directions per horizontal plane (truncated) apex (6) and/or side centered diagonals (6) derive said "center of mass" for a possible total of 12. Separately each vertical cross-section, again by apex (6) or flat side wall (6) allows for eight (8) directions and the associated wiring, cabling, etc. interconnects, axially (top-bottom), side to side (left right), diagonally (top left, bottom right) and last diagonally (bottom left, top right). The concept is also incorporated by reference to the other submitted patent for those shapes delineated elsewhere which include the standard regular or irregular tessellation/tilings as approximated with or without the dumbbell modifications. An irregular tessellation/tiling is defined herein as an asymmetrical tessellation/tiling as when the wiring at the edges of a column, row or array or attendant patch panels or other external or internal intra-module level interstitial support structure is not symmetrical by connection or by geometry.

Both FIGS. 56A and 56B utilize the following legend:
Heavy line: Used for router/computer or other connection.
Light line: Used for router/computer or other connection.
Dashed line: Used for router/computer or other connection.
Fill: Not used or used for cooling machinery or other support equipment. Lines exist to show inter- and intra-module directions of unilateral and bidirectional signal flow(s) in general terms.

FIG. 56A shows the symbolic visual interrelations of a single module-centric view in a single plane to other modules in an inter-module array with possible triangular slip-fit internal module nesting. This may be utilized for centralized array master-slave command and control.

FIG. 56B shows the symbolic visual inter-module relations without the central module command and control view, however with possible nesting. However, the interconnectivity embodied herein is extended to multiple planes.

FIG. 56C is an illustration of the asterisk shape overlaid on a 3×3 module array, symbolic representation.

FIG. 56C Six pointed Star Overlaid on a 3×3 Array. Symbolically demonstrates module vertical cut cross-section data, process, control and/or other information transport or combination thereof either vertically, horizontally or diagonally across each symmetrical module, set of modules or other geometric shape or shapes with or without single or multiple central unit bypass for rerouting, multi- or parallel processing or, failover. This symbolic side view when read in relation to a top center view as shown in FIG. 56A shows symbolically, without recounting sides allows six sides each for horizontal and vertical planes, not including the central unit Symbolically these views also represent cross-sections of multi-layer substrates when so extended as symbolic representations of duplex, multi-duplex parallel (bypass) and single directional busses, regular and irregular triangular, square, hexagonal, octagonal shapes with or without the dumbbell variant as claimed. This is further extended to the atomic basis as put forth here by using lead wire or other conductive material three or more atoms thick with amperage rating to 10 amps. Wring as put forth herein extends to the interconnection of conductive paths between layers of substrate and attendant masked material deposits or subtractions in chips and/or boards envisioning the fundamental wiring layout of the modules as put forth in drawings 56A-C for layout between layers of said constructs. This includes Futitsuis use of composite carbon nanotube-graphene conductive molecularly bonded arrays. All wiring as put forth herein and in patents incorporated by reference shall be inclusive and include chip socketing as a symbolically represented in all drawings on a molecular and nanoscale and chip level. Further, wiring as put forth in FIGS. 56A-56D is extended to the atomic level by utilizing FIGS. 56A-56C symbolically in conjuct with constructs of wires utilizing lead or other high conductivity atoms three or more or more atoms thick. In all cases, the bypass feature, as posited in FIGS. 56A-56C allows for mono-planar and multi-planar re-configurable variable length push pull bus shortest path with optical and other direct memory link processing between the processors in single and multi-planar arrays. The key is moving between the linearly displaced first and third modules, chips or atomic circuits as delineated above. FIG. 56D is an illustration of the single leg variable length spark resistant ball and slotted socket electrical connector. The parts of this assembly are:

800 Slotted ball socket cover, 803 Self tapping screw seat
805 Ball socket cover,
810 Ball socket seat;
813 Self tapping screw seat;
815 Ball socket seat; 817 Self tapping screw;
820 Ball;
822 Allen head socket;
824 Ball neck;
826 Threaded cap (spark resistant bronze, etc.); 830 Cartridge (spark resistant: bronze, etc.);
832 Cotter pin;
834 Shoulder washer (spark resistant: bronze, etc.);
836 Open end cartridge thread;
840 Plunger (spark resistant: bronze, etc.); 842 Spring retention hole;
844 Carbon impregnated material or coating; 846 Cable receiver;
850 Cable optional: spark resistant;
impregnated carbon or other similar material; 860 Contracting spring.

FIG. 56D is a single cable self-adjusting variable length connector with anti-spark explosion proof option. These units are mounted on the external side wall recesses between vertically abutting (intra-planar) and diagonally adjacent inter-planar adjacent modules to allow motion and communication. Multiple units are required to complete circuit, +, − and ground. All other forms of interconnect are allowed as illustrated elsewhere in this document. The author holds that parts 800-846 as listed above are self-explanatory in function, however for simplicity, parts 800826 describe a ball and socket mechanism. Part 830 acts as a cartridge based retention system for the contracting spring part 860 and plunger parts 840-846. Two such units are connected by a cable part 850. The total assembly creates a variable length conductive path. The path is made spark resistant by the strategic use of bronze and carbon impregnated components or equivalent for spark resistance.

FIGS. 57A-57E illustrate the palletization master air intake plenum. FIGS. 57A-57E show a Master Intake Palletized Plenum Array designed to work with various heat transfer mechanisms as indicated and utilized with but not limited to, FIGS. 65A-65D: Table 1, to feed coolant through such bases, which comprise its assembly, or through direct connection to module central cavities as required. Seals are provided for said plenums and vertical suspension alignment hooks, three per module, are utilized for alignment tethers for inter-module cable assemblies. This allows for module, replacement with possible hot-swap pending internal and external component selection and external rewiring, FIG. 57A is an illustration of the, block diagram top view.

FIG. 57B is an illustration of the, block diagram bottom view. The part shown is a 910 Suspension alignment hook.

FIG. 57C is an illustration of the side view. Parts shown include 900 Air intake hole knock outs and 910 Suspension alignment hook.

FIG. 57D is an illustration of the top. Part shown is a 900. Air Intake Hole Knock Outs. FIG. 57E is an illustration of the master air intake plenum with parting lines, side view. Part shown is a 920. 0-ring material seal.

FIGS. 58A-58E shows the master air exhaust plenum, upper termination hooks, three per module, in alignment with one-to-one correspondence with the suspension alignment hooks of the master air intake plenum with the same sealing system of FIGS. 57A-57E.

FIG. 58A is an illustration of the top view. FIG. 58B is an illustration of the bottom view. The parts shown are a 910 Suspension alignment hook, and 930 Corner mount pallet rack.

FIG. 58C is an illustration of the side view. Parts shown include 900 Air intake hole knock outs and 910 Suspension alignment hook.

FIG. 58D is an illustration of the front view. Part shown is a 900 Air intake hole knock outs.

FIG. 58E is an illustration of the master air intake plenum with parting lines. Part shown is a 920 0-ring material seal.

FIGS. 59A-59C illustrate the palletized stackable warehouse pallet with master intake and exhaust plenums installed. FIGS. 59A-59C show a blank pallet with corner-mount pallet rack installed, side mount, although not shown, should be blatantly obvious to those versed in the art. (Bottom) master intake, and (top) master exhaust plenums are next shown installed.

FIG. 59A is an illustration of the blank pallet with pallet rack corner mount shown, side mount obvious, perspective view.

FIG. 59B is an illustration of (bottom) master intake and (top) master exhaust plenums, perspective view.

FIG. 59C is an illustration of the palletized master plenums installed, perspective view.

Figure 60:
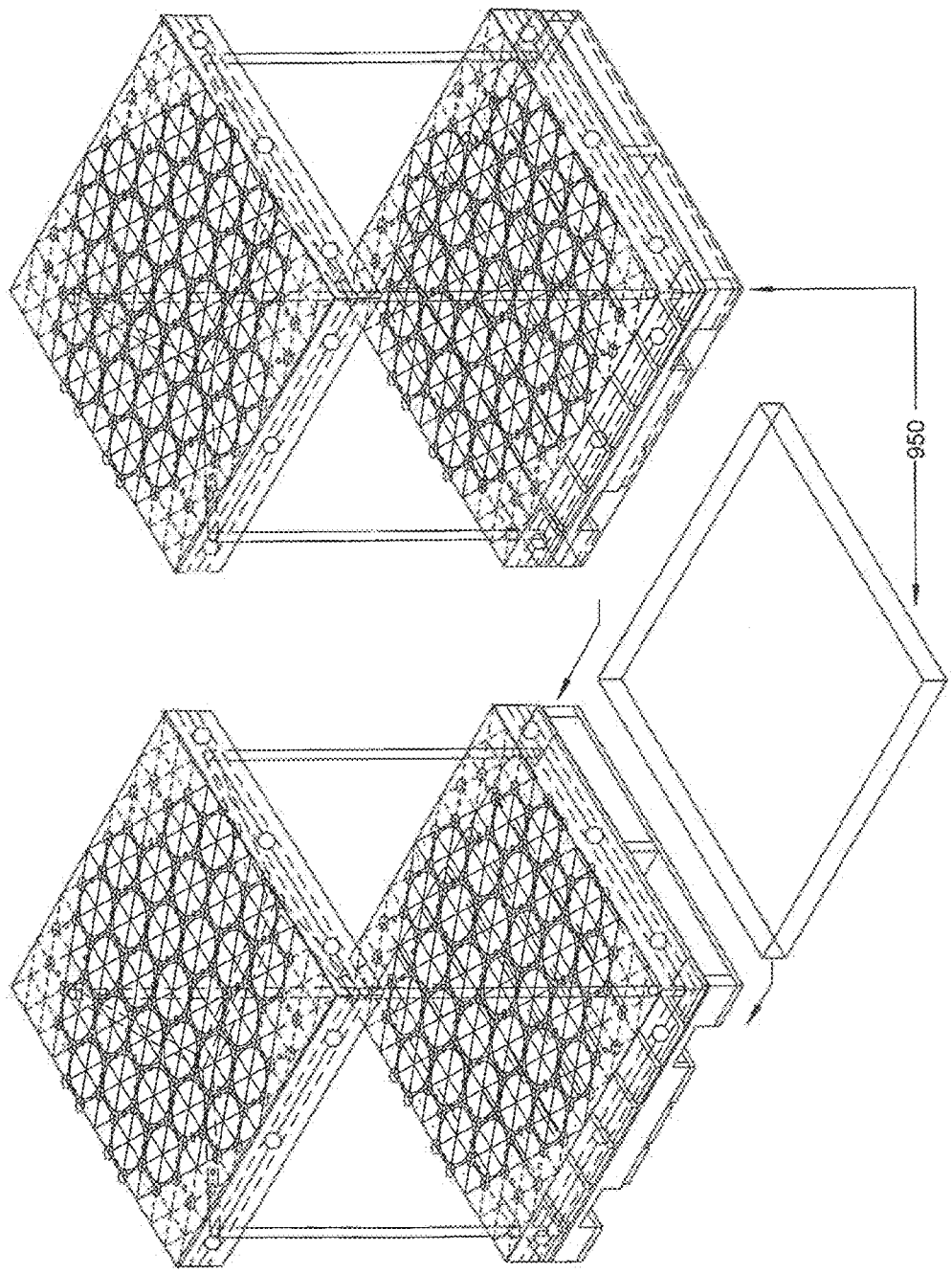
FIG. 60 illustrates the palletized and dollied "sliding drawer" master cooling array assembly.

FIG. 60 illustrates the palletized and dollied "sliding drawer" master cooling array assembly.

FIG. 60 shows a palletized "sliding drawer" assembly constituted by addition of a pallet dolly with wheels or rollers set offside of the center cable gutter pending size, weight load and economic requirements. Part 950 Pallet dolly is shown.

FIGS. 61A-61D illustrate the palletization master cooling/wiring assembly population. FIGS. 61A-61D show the palletization master intake/wiring basket and exhaust plenum/wiring covers between which seat the module/enclosure cooling wiring assembly population with top and bottom either in stacks or on palleted arrays.

Service access to individual modules in stacks and arrays are aided by groupings based on pallets equipped with pallet dollies to give access (for repair, replacement and connection maintenance) to and from warehouse and mezzanine style industrial shelving or equivalent with flooring inserts inside said shelving, level with mezzanine and separately, by level, ground level flooring, thereby creating functional, "drawer" assemblies for said pallet-racked and dollied palletized module arrays, with drawbridge access by tier and cat walks, stairwells, elevators, etc. as necessary. External peripheral nonstandard palletized or otherwise arrayed shapes are used for support machinery such as cooling, etc. or as otherwise required for any miscellaneous purpose. Further, the approximated tessellation/tilings conjunct individual palletized arrays and stacks conjunct industrial shelving, give an industrial standard readily recognizable and easily duplicated and understood as a spatial commodity and form factor in industry, replete with pre-existing off the shelf robotic automation ready to be tasked to this new purpose. Of course standard modules may be pressed into any such service at required.

Service access for rewiring of inter-module communications is accomplished by:

(1) Arranging modules in vertical linear stacks.

(2) Utilizing cable grippers, embedded in modules, threaded on cables, and terminated with clevis pins and devises or equivalently functioning hardware. Each module has three or four such cable assemblies, FIGS. 49D-49I as submitted and hereby incorporated by reference. Said cable assemblies interconnect to those modules above and below, finally terminating in the master air intake and exhaust plenums for each pallet, below and above respectively. The cable grippers, actuated by a handle actuator assembly on top, allow movement up and down the accumulated cable assemblies between terminations, by which access is gained to the sides of the modules for external inter-module rewiring.

(3) Individual modules have a sliding fit with adjacent modules, and feature either a horizontal scalloped edge between keyed or un-keyed "flats" framing apex centered cooling tube assemblies for cables and wires, fiber optics, coaxial cable, and/or a wave guide cavity for RF and/or light guides for "open" optics and optical data transmission.

Service access for module removal is accomplished by:

1. Slide units above and to the sides of the offending defective unit, up their cable guides.

2. Seat units below on their respective stack bases, master plenum bases or modules stacked thereon.

3. Disconnect clevis pins and clevises or functionally equivalent hardware.

4. Connect power to new module, utilizing retraction power chords on top of new module to power source above.

5. Mirror wiring or other connectivity placement on old module to new replacement module as necessary, pending preexistent means of connectivity.

6. Disconnect power from lower module, base or master plenum base.

7. Slide out bad unit.

8. Reconnect clevis pins and devises or equivalent hardware to new module.

Figure 61A:
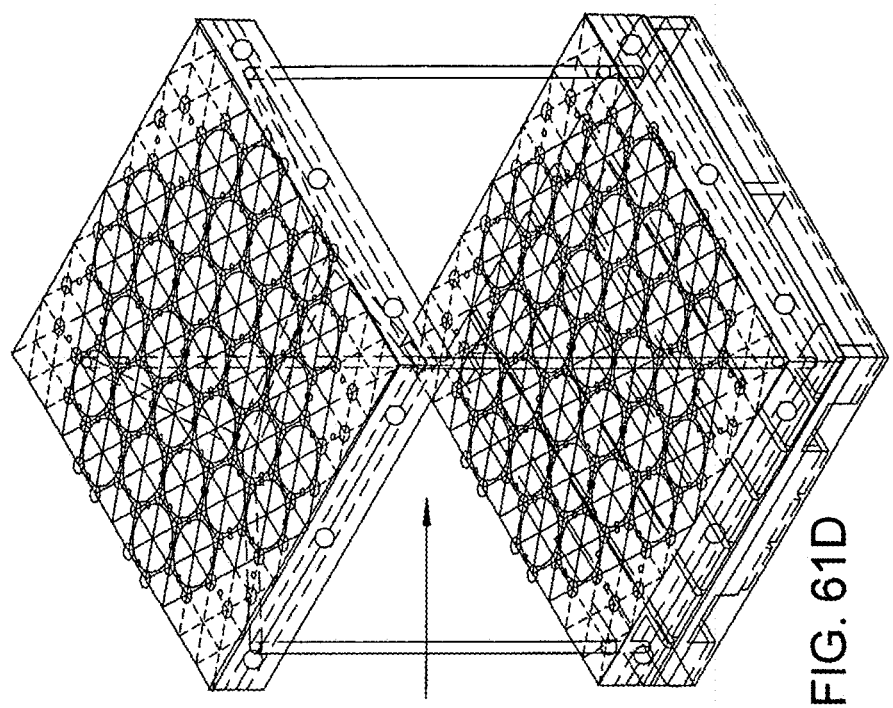
FIGS. 61A-61D illustrate the palletization master cooling assembly population.

FIG. 61A is an illustration of the module base stacked order, front view and shows the stacking alignment of modules on a base.

Figure 61B:
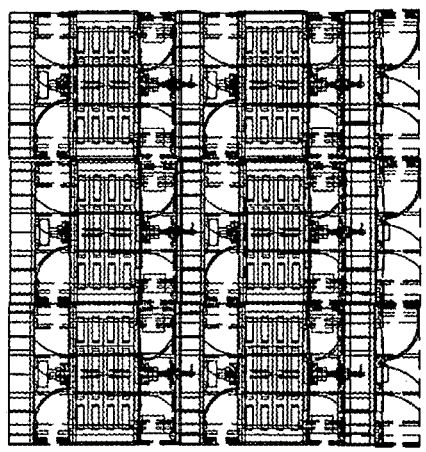

FIG. 61B is an illustration of the single stack assembly, front view and shows the assembly of said modules into a single stack.

Figure 61C:
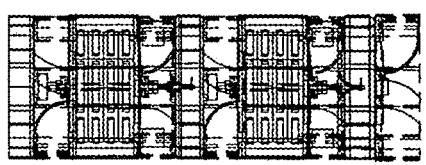

FIG. 61C is an illustration of the stack array, front view and shows the assembly of single stacks and stacks arrays.

Figure 61D:
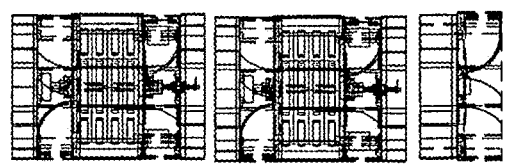

FIG. 61D is an illustration of the palletized and dollied master cooling assembly being populated with module, perspective view and shows the stack arrays being populated into the palletized and dollied master cooling/wiring/stack suspension assemblies.

FIGS. 62A-62F illustrate the palletized dolly shelf bed and supports, slotted cable guide and conduit whip.

FIGS. 62A-62F show the shelf support structure for stored, dollied and palletized module arrays with an external wire guide armature to prevent entanglement of pallet wiring connections when rolling out the palletized dolly from its shelf bay for work.

FIG. 62A is an illustration of the shelf bed. Part 1000. Pallet Dolly Load Bearing Surface is shown.

FIG. 62B is an illustration of the castellated cross brace with cable guide, top view. This assembly with part $1017^0$ prevents jamming of cables, when dollied palette is in motion. Parts shown are 1000 Stud Eye Mounts, 1015 Castellated Cross Brace, and 1017 Top Center Cable Guide.

FIG. 62C is an illustration of the slotted support beams. 1000 Pallet Dolly Load Bearing Surface is shown.

FIG. 62D is an illustration of the central longitudinally slotted cable guide, shelf base assembly, top view.

FIG. 62E is an illustration of the block diagram of the 180 degree arc cable conduit whip. The FIG. 62E Assembly may be left or right mounted on part [5]1015 of FIG. 62B. This assembly with part 1017 prevents jamming of cables, when a dollied palette is in motion. Shown parts are: 1008. Internally Threaded Flange, 1010. Stud Eye Mounts, and 1020. 90 Degree Bend Electrical Conduit.

FIG. 62F is an illustration of the block diagram of the industrial warehouse mezzanine shelving, block diagram, front view.

FIGS. 63A-63C illustrates the Palletized scalable computer/router farm utilizing standard-industrial warehouse shelving with mezzanine option above single floor installations for pre-existent warehouse space build out and new construction steel building with integrated industrial walls and roofing.

FIG. 63A is an illustration of the modular stack (top and bottom arrows represent data connections, (cables/wires/ethernet/fiber optic/etc.), front view.

FIG. 63B is an illustration of the dollied stack racked pallet(s) with installed intake (bottom)/exhaust (top) coolant/wiring/stack suspension master plenums, perspective view.

FIG. 63C is an illustration of the symbolic standard industrial warehouse shelving for population by dollied and palletized modules, block diagram, front view.

FIGS. 64A-64E illustrate the palletized shelf level drawbridge assembly. FIGS. 64A-64E show a drawbridge arrangement for bin height dollied and palletized module array extraction from second-tier and above multi-tier industrial shelving bins onto the fold-down flat work area provided for by said "draw bridge" for service, replacement, etc. The minimalist embodiment comprises two base shelving units with appropriate sized dollied, palletized and pallet-racked modules with master plenums separated by an appropriate number of drawbridges sized for the selected pallet shelf combination shared by the pallets of each base shelf, allowing full-motion and access to all dollied pallets and modules.

FIG. 64A is an illustration of the drawbridge. Part 1040. Drawbridge deck" is shown.

FIG. 64B is an illustration of the drawbridge hinge. "Shown parts are: 1017. Wire Guide and 1030. Pivot Rod.

FIG. 64C is an illustration of the drawbridge symmetrical pivot rod (side and end views). Shown parts are: 1010. Stud Eye Mount and 1030. Pivot Rod.

FIG. 64D is an illustration of the shelving top view (symbolic) Shown parts are: 1030. Hinge with pivot rod only, 1035. Industrial shelving: two second tier single bays facing each other separated by a walk way, 1040. Full drawbridge assembly installed FIG. 64E is an illustration of the shelving front view (symbolic). Shown parts are: 1030. Hinge with pivot rod only and 1035. Full drawbridge assembly installed.

For optional conventional construction at the enclosure level the invention optionally uses standard heavy duty industrial warehouse style shelving with a multilevel mezzanine option above the first floor. This allows for the build out of pre-existing industrial warehouse and other space to realize scalable integration/migration from a single unit to a router, server and supercomputer machine farms incorporating high-density multilevel facilities interconnected as required by catwalks and corridors. This utilizes cheaper industrial warehouse space for machine farms. In this embodiment, due to the portable nature of the shelving with or without multilevel mezzanine enhancements, pending implementation details, the build out itself may be portable, and therefore allows the possibility of site movement, pending more favorable lease, rent or other financial opportunities, including lower tax rates, as given under various governmental programs and negotiations, including between states.

The invention expands this technique to include standard building practices by adding standard external wall and roofing systems available for said mezzanine style shelving systems for new construction of buildings to purpose, utilizing palletization techniques and approximated tesselation/tiled enclosures described and incorporated by reference by the other provisional patent most closely submitted in time. In this way, new building construction is optimized as the shelving supports do double duty as ceiling and wall supports.

FIGS. 65A-65D are Table 1: Symbolic Block Diagram Cooling Systems (Air/Gas/Fluid). Thermal management includes options for internal and external cooling/refrigeration including liquid, air/gas and other solutions for installations from single units to palletized modular arrays utilizing individual coolant intake and exhaust plenums incorporated in the modules. The invention employs standard industry stack-rack or pallet-rack caging of either corner or side fastening design, for palletization with pallet bolt on plywood or other pallet floor/bed for fastening master cooling plenum overlay with embedded matching terminations for module suspension cables, creating a bolt-on support bed for individual arrays. Modules are fitted together in three-dimensional arrays over this master coolant intake plenum on the pallets face. A master exhaust plenum is suspended from a pallet rack above, with an attendant end cap wiring basket cover for the top of each individual stack and provides exhaust handling for same. This includes utilization of standard large scale HVAC, air supply and shop vacuum systems on machine farms through master plenums, on both top and bottom of rollout pallet dollied and racked palletized modules, stacks and arrays in single and multi-tier industrial shelf based storage at drawers. (Reference FIGS. 65A-65D: Table 1 for further thermal management options. The module hull includes a thermally insulative impregnation or a layer internally and/or externally, hereinafter "thermal layer" for simplicity. The module hull thermal layer directs heat from the central cavity to be carried off by internal plenums, fans, cooling tubes and associated ductwork, end cap fans, master intake and exhaust plenums and arrays of the same, and/or other thermal management. The hull is also thermally insulated with a view to human touch. To this end, the end cap wiring basket, cover and handle are also thermally insulated.

That which is claimed is:

1. A computer chip/module comprising a plurality of components and interconnecting propagation pathways arranged according to an approximately tessellated 3D geometric shape: triangle, hexagon, octagon or 12-sided polygon wherein said geometric shapes' nest and scale.

2. The computer chip/module of claim 1, comprise inner interconnections connecting at the axially centered central unit radiating out to inter-chip/module interconnection points at the outer surface including outer end points: axial centered symmetrical diagonals by apices and top and bottom edge midpoints, side-face horizontally and vertically centered sidewall faces horizontal, both end face centered and apex centered diagonals across opposing apices and edges on either end.

3. The computer chip/module of claim 2, wherein said central unit is suitable for one or more of said connecting inter-chip/interconnection points to have direct memory access.

4. The computer chip/module of claim 2, wherein one or more of said interconnecting propagation pathways or one or more of said plurality of components are comprised of composite carbon nanotubes and graphene.

5. The computer chip/module of claim 2, wherein said propagation pathways comprise all combinations of longer and/or shorter and/or equal length propagation pathways and one or more of said connected plurality of components.

6. The computer chip/module of claim 2 wherein one or more of a plurality of said propagation pathways are suitable to be longer, shorter or equal in length by tunable signal delay.

7. The computer chip/module of claim 2 wherein said inter-module interconnection points comprise unidirectional bi-directional, duplex, parallel, push-pull, look-ahead, by-pass, data, process, polling, non-polling, control or other informational transport, operational, signal and procedural buses and signal lines or combinations thereof.

8. The computer chip/module of claim 2 wherein some or all of said inter-module interconnection points' propagation pathways comprise said look-aheads and one or more of said bypass interconnections that connect a first chip/module with a second non-adjacent chip/module.

9. The computer chip/module of claim 2 wherein said chips/modules may be connected by said inter-module interconnection points to a mono-planar or multi-planar array of said chips/modules.

10. The computer chip/module of claim 2 wherein one or more of said chip/modules may be board mounted directly or with a chip socket/carrier.

11. The computer chip/module of claim 7 wherein said chip/modules are processors.

12. The computer chip/module of claim 2 wherein said chip/modules are arranged in columns and/or rows.

13. The computer chip/module of claim 2 wherein said chips/modules may be arranged in said columns and/or said rows or mono-planar arrays, all in 2-D.

14. The computer chips/modules of claim 2 wherein said chips/modules may be arranged in multi-planar arrays.

15. The computer chips/modules of claim 2 wherein said chips/modules are arrayed in said mono-planar array triangle comprising look-ahead, by-pass, the inter-chip/module interconnection points and a bidirectional push-pull data bus suitable for binomial expansion processing.

16. The computer chips/modules as specified in claim 15 as isolated for binomial expansion processing In one or more of said larger 3D geometric shape.

17. The computer chips/modules of claim 15 arrayed in said multi-planar array triangle comprising said polling look-ahead, said by-pass, said inter-chip/module interconnection points forming an equilateral triangle and a bidirectional push-pull data bus suitable for said binomial expansion processing.

18. The computer chips/modules of claim 2 arrayed in a said multi-planar array triangle comprising said polling or non-polling look-ahead, said by-pass, said inter-chip/module interconnection points forming an equilateral triangle and a bidirectional push-pull data bus suitable for said binomial expansion processing.

19. The computer chip of claim 2, wherein some of said components are interconnected in a two-dimensional and three dimensional pattern.

* * * * *